US008309971B2

(12) United States Patent
Seo et al.

(10) Patent No.: US 8,309,971 B2
(45) Date of Patent: Nov. 13, 2012

(54) LIGHT EMITTING DIODE HAVING ELECTRODE PADS

(75) Inventors: Won Cheol Seo, Ansan-si (KR); Dae Sung Kal, Ansan-si (KR); Kyung Hee Ye, Ansan-si (KR); Kyoung Wan Kim, Ansan-si (KR); Yeo Jin Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 104 days.

(21) Appl. No.: 12/974,917

(22) Filed: Dec. 21, 2010

(65) Prior Publication Data

US 2011/0163346 A1    Jul. 7, 2011

(30) Foreign Application Priority Data

| Jan. 7, 2010 | (KR) | 10-2010-0001089 |
| Jan. 7, 2010 | (KR) | 10-2010-0001090 |
| Jan. 7, 2010 | (KR) | 10-2010-0001204 |
| Jan. 7, 2010 | (KR) | 10-2010-0001205 |
| Jan. 7, 2010 | (KR) | 10-2010-0001408 |
| Jan. 8, 2010 | (KR) | 10-2010-0001813 |
| Jan. 14, 2010 | (KR) | 10-2010-0003396 |
| Jan. 15, 2010 | (KR) | 10-2010-0003964 |
| Jan. 15, 2010 | (KR) | 10-2010-0003965 |

(51) Int. Cl.
*H01L 27/15* (2006.01)
*H01L 29/26* (2006.01)
*H01L 31/12* (2006.01)
*H01L 33/00* (2010.01)

(52) U.S. Cl. ............ 257/79; 257/98; 257/99

(58) Field of Classification Search ........... 257/79, 257/98, 99
See application file for complete search history.

(56) References Cited

U.S. PATENT DOCUMENTS

| 6,650,018 B1 | 11/2003 | Zhao et al. |
| 6,777,805 B2 | 8/2004 | Uemura et al. |
| 7,531,841 B2 | 5/2009 | Ko et al. |
| 2009/0179215 A1 | 7/2009 | Matsui et al. |
| 2010/0127397 A1* | 5/2010 | Chen et al. ............ 257/773 |
| 2011/0140160 A1* | 6/2011 | Kim et al. ............ 257/99 |

FOREIGN PATENT DOCUMENTS

| CN | 1176497 | 3/1998 |
| JP | 2004-172189 | 6/2004 |

* cited by examiner

*Primary Examiner* — Jarrett Stark
*Assistant Examiner* — John M Parker
(74) *Attorney, Agent, or Firm* — H.C. Park & Associates, PLC

(57) ABSTRACT

Exemplary embodiments of the present invention relate to a including a substrate, a first conductive type semiconductor layer arranged on the substrate, a second conductive type semiconductor layer arranged on the first conductive type semiconductor layer, an active layer disposed between the first conductive type semiconductor layer and the second conductive type semiconductor layer, a first electrode pad electrically connected to the first conductive type semiconductor layer, a second electrode pad arranged on the second conductive type semiconductor layer, an insulation layer disposed between the second conductive type semiconductor layer and the second electrode pad, and at least one upper extension electrically connected to the second electrode pad, the at least one upper extension being electrically connected to the second conductive type semiconductor layer.

17 Claims, 56 Drawing Sheets

LIGHT EMITTING DIODE HAVING ELECTRODE PADS

CROSS-REFERENCE TO RELATED APPLICATIONS

This application claims priority from and the benefit of Korean Patent Application No. 10-2010-0001089, filed on Jan. 7, 2010, Korean Patent Application No. 10-2010-0001090, filed on Jan. 7, 2010, Korean Patent Application No. 10-2010-0001204, filed on Jan. 7, 2010, Korean Patent Application No. 10-2010-0001205, filed on Jan. 7, 2010, Korean Patent Application No. 10-2010-0001408, filed on Jan. 7, 2010, Korean Patent Application No. 10-2010-0001813, filed on Jan. 8, 2010, Korean Patent Application No. 10-2010-0003396, filed on Jan. 14, 2010, Korean Patent Application No. 10-2010-0003964, filed on Jan. 15, 2010, and Korean Patent Application No. 10-2010-0003965, filed on Jan. 15, 2010, which are hereby incorporated by reference for all purposes as if fully set forth herein.

BACKGROUND OF THE INVENTION

1. Field of the Invention

Exemplary embodiments of the invention relate to light emitting diodes and, more particularly, to light emitting diodes having electrode pads.

2. Description of the Background

Gallium nitride (GaN) based light emitting diodes (LEDs) have been used in a wide range of applications including full color LED displays, LED traffic signals, white light LEDs, etc.

A GaN-based light emitting diode may generally be formed by growing epitaxial layers on a substrate, for example, a sapphire substrate, and include an N-type semiconductor layer, a P-type semiconductor layer, and an active layer interposed between the N-type semiconductor layer and the P-type semiconductor layer. Further, an N electrode pad is formed on the N-type semiconductor layer and a P electrode pad is formed on the P-type semiconductor layer. The light emitting diode is electrically connected to and operated by an external power source through these electrode pads. Here, electric current is directed from the P-electrode pad to the N-electrode pad through the semiconductor layers.

Generally, since the P-type semiconductor layer may have a high resistivity, electric current may not be evenly distributed in the P-type semiconductor layer, but may be concentrated on a portion of the P-type semiconductor layer where the P-electrode pad is formed, and electric current may be concentrated on and flow through edges of the semiconductor layers. This may be referred to as current crowding, and may lead to a reduction in light emitting area, thereby deteriorating luminous efficacy of the light emitting source. To solve such problems, a transparent electrode layer having a low resistivity may be formed on the P-type semiconductor layer so as to enhance current spreading. In this structure, when supplied from the P-electrode pad, the electric current may be dispersed by the transparent electrode layer before entering the P-type semiconductor layer, thereby increasing a light emitting area of the LED.

However, since the transparent electrode layer tends to absorb light, the thickness of the transparent electrode layer may be limited, thereby providing limited current spreading. In particular, in a large LED having an area of about 1 mm$^2$ or more for high output, there may be a limit in achieving efficient current spreading through the transparent electrode layer.

To facilitate current spreading within the light emitting diode, extensions extending from the electrode pads may be used. For example, U.S. Pat. No. 6,650,018, issued to Zhao, et al., discloses an LED which includes a plurality of extensions extending from electrode contact portions, that is, electrode pads, in opposite directions to enhance current spreading.

Although the use of such extensions may enhance current spreading over a wide region of the LED, current crowding may still occur at portions of the LEDs where the electrode pads are formed.

Moreover, as the size of the LED increases, the likelihood of a defect being present in the LED may increase. Defects such as threading dislocations, pin-holes, etc. provide a path through which electric current may flow, thereby disturbing current spreading in the LED.

SUMMARY OF THE INVENTION

Exemplary embodiments of the present invention provide a light emitting diode which prevents current crowding near an electrode pad.

Exemplary embodiments of the present invention also provide a large light emitting diode which permits uniform current spreading over a wide area.

Exemplary embodiments of the present invention also provide a light emitting diode which includes an electrode pad spaced apart from a semiconductor layer.

Exemplary embodiments of the present invention also provide a light emitting diode with a semiconductor stack structure that may be divided into a plurality of regions.

Exemplary embodiments of the present invention also provide light emitting diodes having various structures of electrode pads and extensions capable of enhancing current spreading.

Additional features of the invention will be set forth in the description which follows, and in part will be apparent from the description, or may be learned by practice of the invention.

An exemplary embodiment of the present invention discloses a light emitting diode including a substrate, a first conductive type semiconductor layer arranged on the substrate, a second conductive type semiconductor layer arranged on the first conductive type semiconductor layer, an active layer disposed between the first conductive type semiconductor layer and the second conductive type semiconductor layer, a first electrode pad electrically connected to the first conductive type semiconductor layer, a second electrode pad arranged on the second conductive type semiconductor layer, an insulation layer disposed between the second conductive type semiconductor layer and the second electrode pad; and at least one upper extension electrically connected to the second electrode pad, the at least one upper extension being electrically connected to the second conductive type semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE INVENTION

Figure 1:
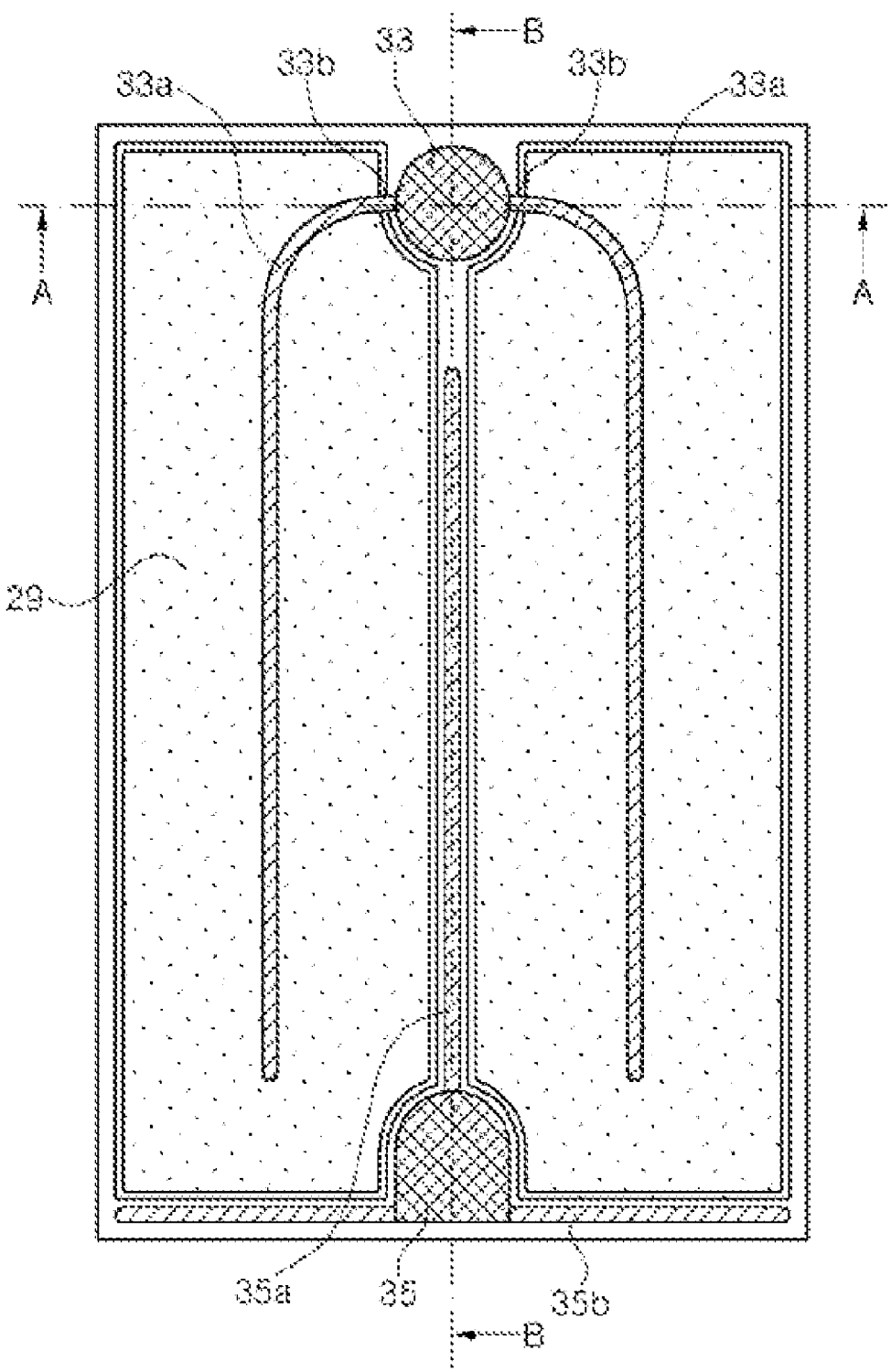
FIG. 1 is a plan view of a light emitting diode according to a first exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2A:
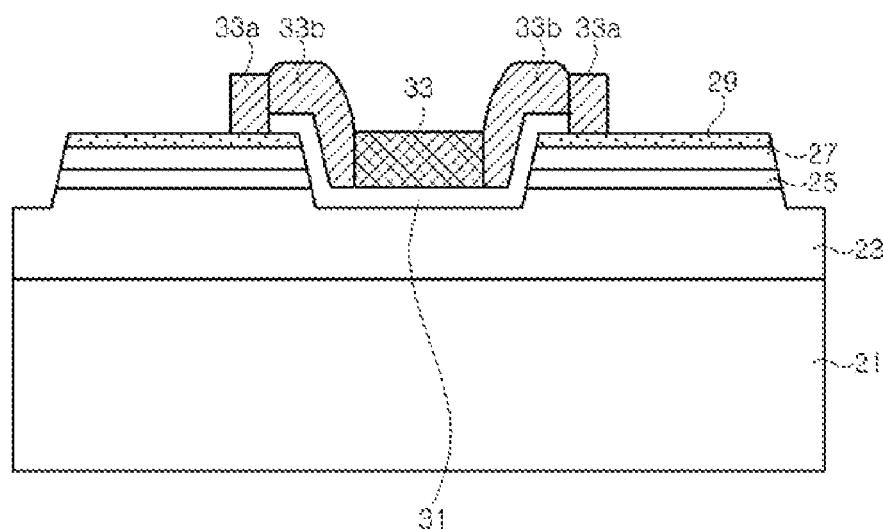
FIG. 2a is a cross-sectional view taken along line A-A of FIG. 1.
Figure 2B:
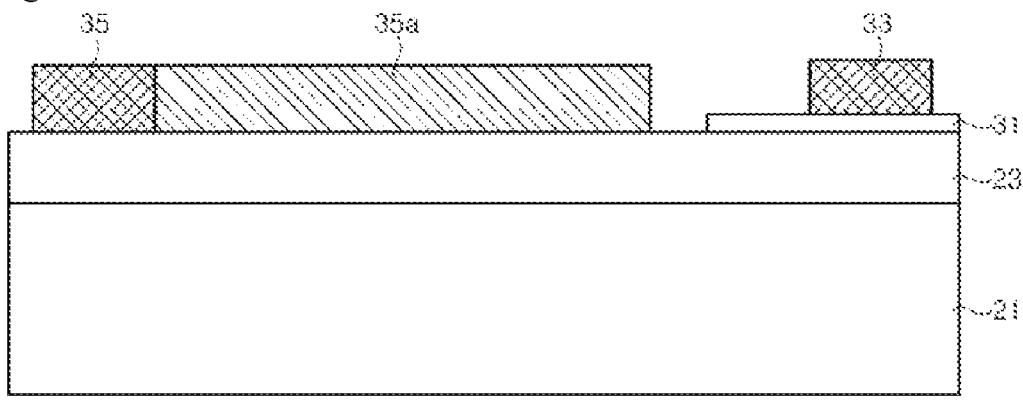
FIG. 2b is a cross-sectional view taken along line B-B of FIG. 1.

FIG. 1 is a plan view of a light emitting diode according to an exemplary embodiment of the present invention, FIG. 2a is a cross-sectional view taken along line A-A of FIG. 1, and FIG. 2b is a cross-sectional view taken along line B-B of FIG. 1.

Referring to FIGS. 1, 2a and 2b, the light emitting diode includes a substrate 21, a first conductive type semiconductor layer 23, an active layer 25, a second conductive type semiconductor layer 27, an insulation layer 31, first and second electrode pads 35, 33, and upper extensions 33a. The light emitting diode may further include connectors 33b, a transparent electrode layer 29, a first lower extension 35a, and a second lower extension 35b. The substrate 21 may be a sapphire substrate, but is not limited thereto. The substrate 21 has a substantially quadrangular shape to have corners in diagonal directions.

The first conductive type semiconductor layer 23 is located on the substrate 21 and the second conductive type semiconductor layer 27 is located on the first conductive type semiconductor layer 23 with the active layer 25 interposed between the first conductive type semiconductor layer 23 and the second conductive type semiconductor layer 27. The first conductive type semiconductor layer 23, active layer 25 and second conductive type semiconductor layer 27 may be formed of, but are not limited to, a GaN-based compound semiconductor material such as (Al, In, Ga)N. The active layer 25 is composed of elements emitting light at desired wavelengths, for example, ultraviolet (UV) or blue light.

The first conductive type semiconductor layer 23 may be an n-type nitride semiconductor layer and the second conductive type semiconductor layer 27 may be a p-type nitride semiconductor layer, or vice versa.

As shown in the figures, the first conductive type semiconductor layer 23 and/or the second conductive type semiconductor layer 27 may have a single layer structure or a multi-layer structure. Further, the active layer 25 may have a single quantum well structure or a multi-quantum well structure. The light emitting diode may further include a buffer layer (not shown) between the substrate 21 and the first conductive type semiconductor layer 23. The first conductive type semiconductor layer 23, active layer 25, and second conductive type semiconductor layer 27 may be formed by metal organic chemical vapor deposition (MOCVD) or molecular beam epitaxy (MBE) technique.

A transparent electrode layer 29 may be formed on the second conductive type semiconductor layer 27. The transparent electrode layer 29 may be formed of indium tin oxide (ITO) or Ni/Au and forms an ohmic contact with the second conductive type semiconductor layer 27.

The second conductive type semiconductor layer 27 and the active layer 25 may be subjected to a patterning process to expose a region(s) of the first conductive type semiconductor layer 23 via photolithography and etching. Such a process is generally known as mesa-etching. Mesa-etching may provide divided light emitting regions as shown in FIGS. 1 and 2. Although, in the present exemplary embodiment, the light emitting diode has two light emitting regions that are isolated from each other, the light emitting diode may have more than two separate light emitting regions. Further, the mesa-etching may be performed to form inclined side surfaces which have a degree of inclination in the range of 30-70 degrees relative to a substrate plane relative to a plane of the substrate 21.

The first and second electrode pads 35, 33 are located on the region(s) of the first conductive type semiconductor layer 23, which is exposed through the mesa-etching. The first electrode pad 35 is electrically connected to the first conductive type semiconductor layer 23. The second electrode pad 33 is insulated from the first conductive type semiconductor layer 23 by the insulation layer 31. The first and second electrode pads 35, 33 are bonding pads for wire bonding and may have an area sufficiently wide for wire bonding. The first and second electrode pads 35, 33 may be formed on the exposed region(s) of the first conductive type semiconductor layer 23, but are not limited thereto.

The insulation layer 31 is disposed between the second electrode pad 33 and the first conductive type semiconductor layer 23 to insulate the second electrode pad 33 from the first conductive type semiconductor layer 23. Further, the insulation layer 31 may cover the side surfaces of the second conductive type semiconductor layer 27 and the active layer 25 exposed through the mesa-etching to. The insulation layer 31 may extend to an upper surface of the second conductive type semiconductor layer 27 such that an edge of the insulation layer 31 overlaps the second conductive type semiconductor layer 27. Alternatively, the insulation layer 31 may extend to cover the second conductive type semiconductor layer 27, and in this case, the insulation layer 31 may have a via-hole formed at an upper portion of the second conductive type semiconductor layer 27 or the transparent electrode layer 29.

The upper extensions 33a are located on the second conductive type semiconductor layer 27 (or the transparent electrode layer 29). The upper extensions 33a may be connected to the second electrode pad 33 via connectors 33b, respectively, and may be electrically connected to the second conductive type semiconductor layer 27. When the insulation layer 31 covers the second conductive type semiconductor layer 27, the upper extensions 33a are connected to the second conductive type semiconductor layer 27 (or the transparent electrode layer 29) through a via-hole in the insulation layer 31. The upper extensions 33a are disposed to allow uniform current spreading in the second conductive type semiconductor layer 27. The connectors 33b are separated from the side surfaces of the transparent electrode layer 29, the second conductive type semiconductor layer 27, and the active layer 25 by the insulation layer 31. The insulation layer 31 is disposed between the transparent electrode layer 29, the second conductive type semiconductor layer 27, and the active layer 25 and the second electrode pad 33 such that the second electrode pad 33 does not physically contact those layers. The insulation layer 31 may prevent current from being conducted directly from the second electrode pad 33 into the transparent electrode layer 29, the second conductive type semiconductor layer 27, or the active layer 25.

The first lower extension 35a may extend from the first electrode pad 35. The first lower extension 35a is located on the first conductive type semiconductor layer 23 and electrically connected thereto. As shown in the figures, the first lower extension 35a may be located between the divided light emitting regions and extend towards the second electrode pad 33. Alternatively, the second lower extension 35b may extend from the first electrode pad 35. The second lower extension 35b is located on the first conductive type semiconductor layer 23 and electrically connected to the first conductive type semiconductor layer 23, and extend along an edge of the substrate 21 to be located outside the light emitting regions.

As shown in the present exemplary embodiment as well as the following exemplary embodiments, the lower extension 35a and the upper extension 33a may be arranged in specific patterns to help improve current spreading. For example, in the present exemplary embodiment, having two upper extensions 33a extend from the second electrode pad 33 along each of the divided light emitting regions may improve current spreading while not requiring multiple electrode pads on the light emitting diode to connect to the upper extensions 33a. In the various exemplary embodiments, the lower extension and upper extension arrangement may likewise improve current spreading in divided light emitting regions while avoiding a requirement for multiple electrode pads on the single substrate.

The electrode pads 33, 35, the upper extensions 33a, the connectors 33b, and the lower extension 35a may be formed of, but are not limited to, the same material, for example Cr/Au, by the same process. Alternatively, the upper extensions 33a and the second electrode pad 33 may be formed of different materials by different processes.

In the present exemplary embodiment, the divided light emitting regions have a symmetrical structure relative to a line, for example, a cut line B-B, which is located between the first electrode pad 35 and the second electrode pad 33. The upper extensions 33a are also symmetrically disposed, so that the light emitting regions may exhibit the same luminescence characteristics. Accordingly, when a light emitting region is divided into two light emitting regions in a single light emitting diode, a process of packaging the light emitting diode may be further simplified compared to using two light emitting diodes connected in parallel to each other. Furthermore, the divided light emitting regions may relieve current crowding caused by defects and may improve light extraction efficiency through formation of the inclined side surfaces by mesa-etching.

Figure 3:
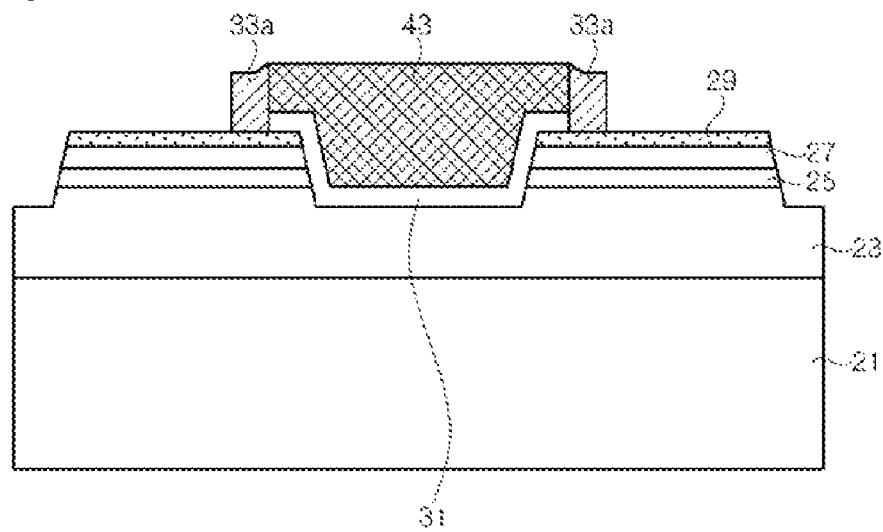
FIG. 3 is a cross-sectional view of a light emitting diode according to a second exemplary embodiment of the present invention.

FIG. 3 is a cross-sectional view of a light emitting diode according to a second exemplary embodiment of the present invention.

Referring to FIG. 3, the light emitting diode of the present exemplary embodiment is generally similar to the light emitting diode described with reference to FIGS. 1 and 2. In the light emitting diode of the present exemplary embodiment, however, a portion of a second electrode pad 43 is located above a second conductive type semiconductor layer 27.

Specifically, the second electrode pad 43 is located on an exposed region of a first conductive type semiconductor layer 23 subjected to mesa-etching process such that a portion of the second electrode pad 43 is located above the second conductive type semiconductor layer 27. The second electrode pad 43 is insulated not only from the first conductive type semiconductor layer 27 but also from the transparent electrode layer 29, the second conductive type semiconductor layer 27, and the active layer by an insulation layer 31. Thus, the second electrode pad 43 does not physically contact those layers. Extensions 33a may be directly extended from the second electrode pad 43 or may be extended therefrom with a connector disposed therebetween.

In the present exemplary embodiment, the second electrode pad 43 is insulated from the semiconductor layers by the insulation layer 31, which may thereby prevent current crowding around the second electrode pad 43. Furthermore, in the present exemplary embodiment, an area subjected to mesa-etching may be decreased compared to the previous exemplary embodiment, thereby increasing the light emitting region.

Figure 4:
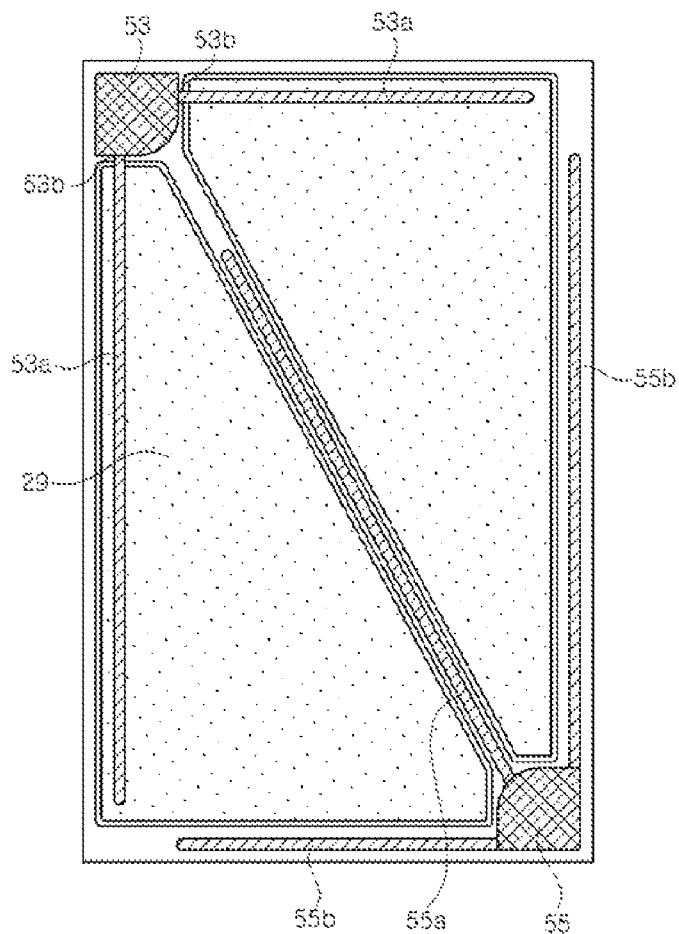
FIG. 4 is a plan view of a light emitting diode according to a third exemplary embodiment of the present invention.

FIG. 4 is a plan view of a light emitting diode according to a third exemplary embodiment of the present invention.

Referring to FIG. 4, the light emitting diode of the present exemplary embodiment is similar to the light emitting diode described with reference to FIGS. 1 and 2. In the light emitting diode of the present exemplary embodiment, however, a first electrode pad 55 and a second electrode pad 53 are arranged in a different manner than in the above exemplary embodiments.

In the above exemplary embodiment shown in FIGS. 1 and 2, the first and second electrode pads 35, 33 are disposed at the centers of edges of the substrate 21 to face each other. In the light emitting diode according to the present exemplary embodiment, first and second electrode pads 55, 53 are diagonally disposed near corners of the substrate 21 to face each other.

As the first electrode pad 55 and the second electrode pad 53 are respectively disposed near the corners of the substrate 21, it is possible to form the first and second electrode pads 55, 53 a relatively large distance from each other.

In the present exemplary embodiment, upper extensions 53a may extend along an edge of the substrate 21 from the second electrode pad 53. The upper extensions 53a are connected to the second conductive type semiconductor layer 27 or the transparent electrode layer 29 and are also connected to the second electrode pad 53 through connectors 53b. The connectors 53b are insulated from the second conductive type semiconductor layer 27 by an insulation layer 31. In addition, the insulation layer 31 covers side surfaces of the second conductive type semiconductor layer 27 and active layer 25.

A first lower extension 55a extends from the first electrode pad 55 towards the second electrode pad 53 and is electrically connected to the first conductive type semiconductor layer 23. The first lower extension 55a may be diagonally located on the substrate 21, and the second conductive type semiconductor layer 27 and active layer 25 may be divided into two light emitting regions isolated from each other relative to the first lower extension 55a. Accordingly, the first lower extension 55a is located between the light emitting regions. In addition, a second lower extension 55b may extend along an edge of the substrate 21 from the first electrode pad 55.

As described with reference to FIGS. 1 and 2, the second electrode pad 53 is located on the first conductive type semiconductor layer 23 with the insulation layer 31 disposed between the second electrode pad 53 and the first conductive type semiconductor layer 23. As such, since the second electrode pad 53 is separated from the second conductive type semiconductor layer 27, it is possible to prevent current crowding around the second electrode pad 53.

Furthermore, as described with reference to FIG. 3, a portion of the second electrode pad 53 may be located on the second conductive type semiconductor layer 27.

Figure 5:
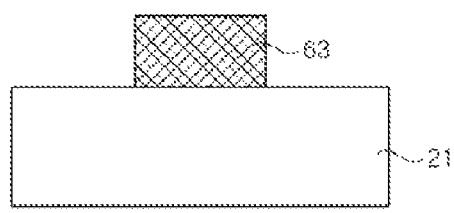
FIG. 5 is a partial cross-sectional view of a light emitting diode according to a fourth exemplary embodiment of the present invention.
Figure 6:
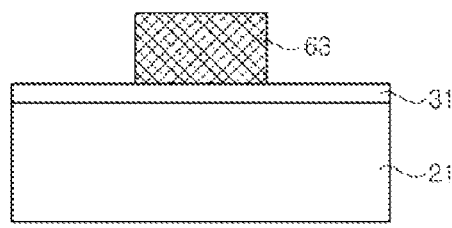
FIG. 6 is a partial cross-sectional view of a light emitting diode according to a fifth exemplary embodiment of the present invention.

FIGS. 5 and 6 are partial cross-sectional views of a light emitting diode according to fourth and fifth exemplary embodiments of the present invention.

In the above exemplary embodiments, the second electrode pad 33 or 53 is located on the first conductive type semiconductor layer 23 with the insulation layer 31 disposed between the second electrode pad 33 or 53 and the first conductive type semiconductor layer 23. In the fourth exemplary embodiment, however, a second electrode pad 63 may be located directly on a substrate 21 (see FIG. 5). Further, in the fifth exemplary embodiment, an insulation layer 31 may be disposed between the substrate 21 and the second electrode pad 63 (see FIG. 6). That is, with the insulation layer 31 located directly on the substrate 21, the second electrode pad 63 may be located directly on the insulation layer 31 to be in contact with the insulation layer 31. The second electrode pad 63 is formed on a region from which the first conductive type semiconductor layer 23, active layer 25 and second conductive type semiconductor layer 27 formed on the substrate 21 have been partially removed. When the second electrode pad 63 is formed directly on the substrate 21 to be in contact with the substrate 21, the substrate 21 may be a dielectric substrate.

In the above exemplary embodiments, the second electrode pad 33, 53 or 63 is horizontally separated from the second conductive type semiconductor layer 27. Consequently, it is possible to prevent current crowding around the second electrode pad. In addition, the second electrode pad 33, 53 or 63 is electrically connected to the upper extension 33a or 53a through the connector 33b or 53b, which is insulated from the light emitting regions by the insulation layer 31. Since the connector 33b, 53b is also insulated from the second conductive type semiconductor layer 27 by the insulation layer 31, it is possible to prevent current crowding around the second electrode pad 33, 53, or 63.

Figure 7:
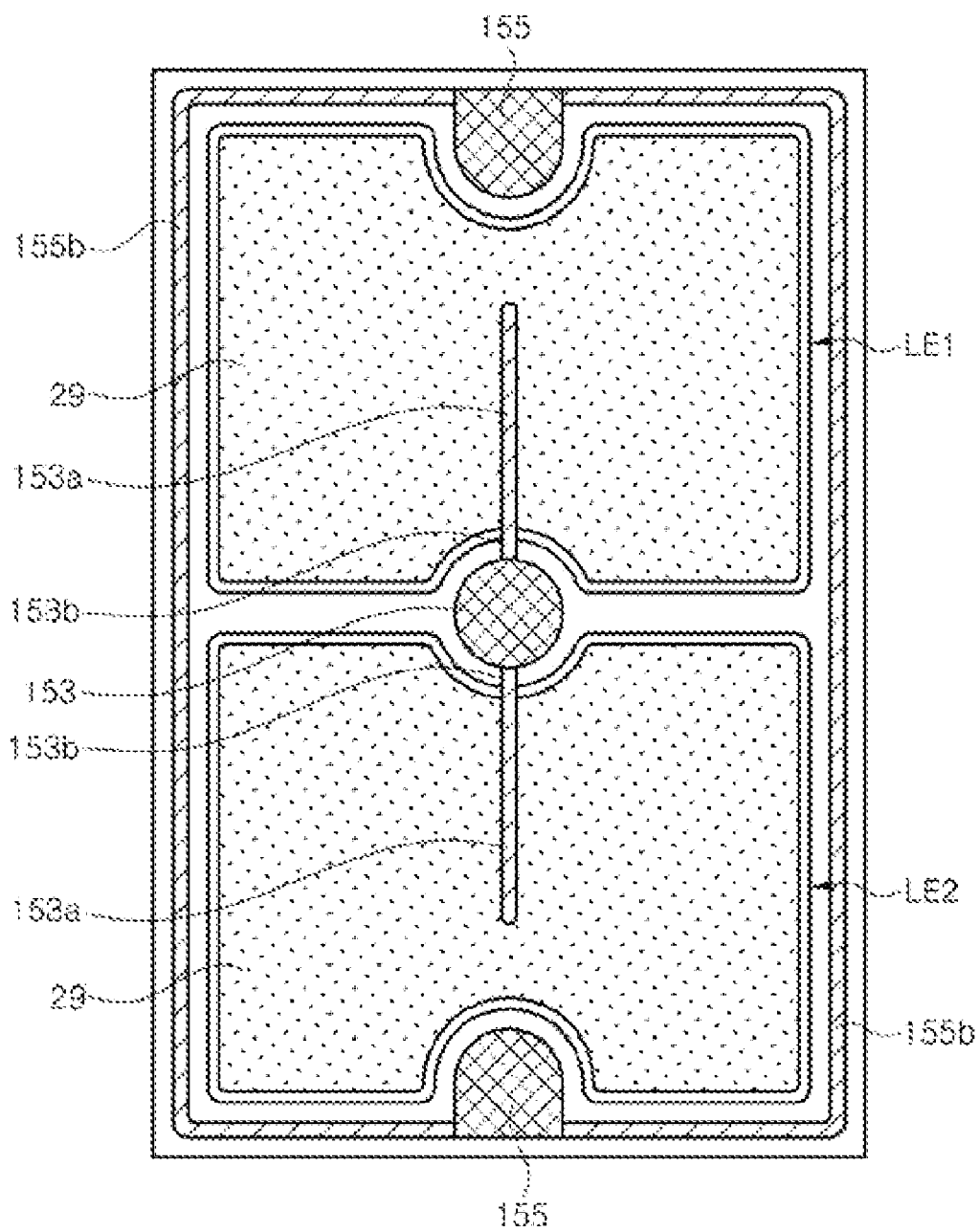
FIG. 7 is a plan view of a light emitting diode according to a sixth exemplary embodiment of the present invention.

FIG. 7 is a plan view of a light emitting diode according to a sixth exemplary embodiment of the present invention.

Referring to FIG. 7, the light emitting diode of the present exemplary embodiment is similar to the light emitting diode described with reference to FIGS. 1 and 2. In the light emitting diode of the present exemplary embodiment, however, a first pad 55 and a second electrode pad 53 are arranged in a different manner than in the above exemplary embodiment.

In the above exemplary embodiment shown in FIGS. 1 and 2, the first and second electrode pads 35, 33 are disposed near the edges of the quadrangular substrate 21 to face each other. In the light emitting diode according to the present exemplary embodiment, a second electrode pad 153 is disposed at the center of the substrate 21. In addition, a first electrode pad 155 may be disposed at an edge of the substrate. Furthermore, as shown in FIG. 7, a plurality of first electrode pads 155 may be disposed on edges of the substrate to face each other.

As in the above exemplary embodiments, a second conductive type semiconductor layer 27 and an active layer 25 may be divided into plural light emitting regions. Herein, the second conductive type semiconductor layer 27 and active layer 25 are divided into two light emitting regions LE1 and LE2. An upper extension 153a is located on the light emitting regions LE1, LE2, and connected to the second conductive type semiconductor layer 27 by the insulation layer 31 (see FIGS. 2a and 2b). The insulation layer 31 may cover side surfaces of the second conductive type semiconductor layer 27 and active layer 25 exposed through mesa-etching to insulate the connector 153b or the second electrode pad 153 from the side surfaces of the second conductive type semiconductor layer 27 and active layer 25.

A lower extension 155b may extend from the first electrode pad 155 along an edge of the substrate 21. As shown in FIG. 7, the lower extension 155b may extend along the edge of the substrate 21 to surround the light emitting regions LE1, LE2. The lower extension 155b is electrically connected to the first conductive type semiconductor layer 23. An additional lower extension (not shown) may extend from the lower extension 155b to a region between the light emitting regions LE1, LE2.

Further, as described with reference to FIGS. 1 and 2, the second electrode pad 153 is located on the first conductive type semiconductor layer 23 with the insulation layer 31 disposed between the second electrode pad 153 and the first conductive type semiconductor layer 23. As such, since the second electrode pad 153 is separated from the second conductive type semiconductor layer 27, it is possible to prevent current crowding around the second electrode pad 153. Furthermore, as described with reference to FIG. 3, a portion of the second electrode pad 153 may be located on the second conductive type semiconductor layer 27.

According to the present exemplary embodiment, since the second electrode pad 153 is disposed at the center of the substrate 21, that is, the light emitting diode, it is possible to achieve uniform current spreading from the second electrode pad to the light emitting regions LE1, LE2.

Figure 8:
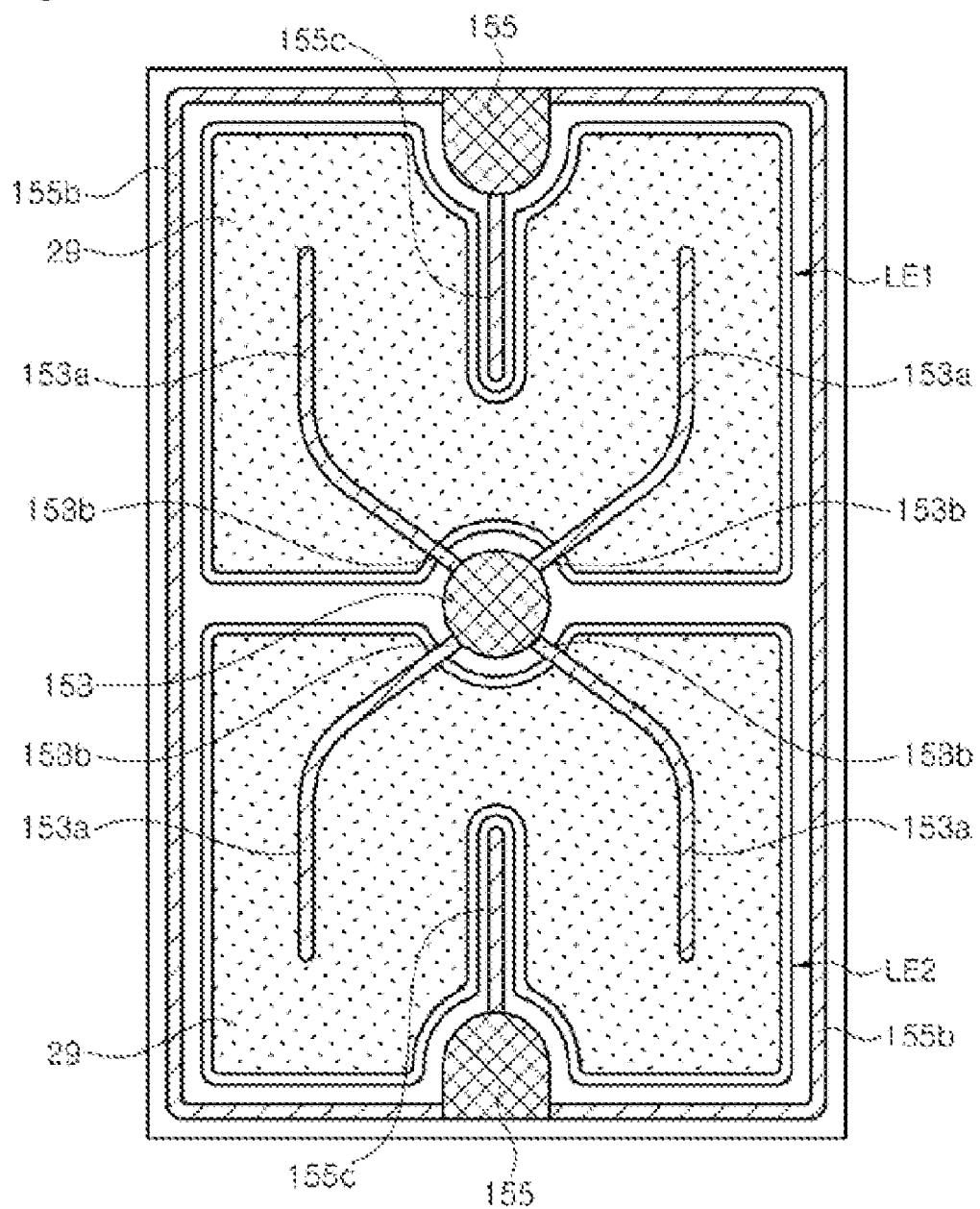
FIG. 8 is a plan view of a light emitting diode according to a seventh exemplary embodiment of the present invention.

FIG. 8 is a plan view of a light emitting diode according to a seventh exemplary embodiment of the present invention.

Referring to FIG. 8, the light emitting diode of the present exemplary embodiment is similar to the light emitting diode described with reference to FIG. 7. In the light emitting diode of the present exemplary embodiment, however, two upper extensions 153a are located on each of light emitting regions LE1, LE2, and a lower extension 155c extends from each first electrode pad 155 towards a second electrode pad 153.

Specifically, at least two upper extensions 153a are located on each of the light emitting regions LE1, LE2. The upper extensions 153a may be disposed in a symmetrical structure relative to a line crossing the first electrode pad 155 and the second electrode pad 153. The upper extensions 153a are connected to the second electrode pad 153 through the connectors 153b, respectively.

The lower extension 155c extends from the first electrode pad 155 towards a region between the upper extensions 153a, and is electrically connected to the first conductive type semiconductor layer 23. The lower extension 155c is terminated near the first electrode pad 155.

In the present exemplary embodiment, the light emitting regions LE1, LE2 may be symmetrically disposed, thereby exhibiting the same luminescence characteristics.

According to the present exemplary embodiment, at least two upper extensions 153a are disposed in each of the light emitting regions LE1, LE2, and the lower extension 155c is located in the region between the upper extensions 153a, thereby enhancing current spreading in the light emitting regions, for example when the light emitting regions have a wide area.

Figure 9:
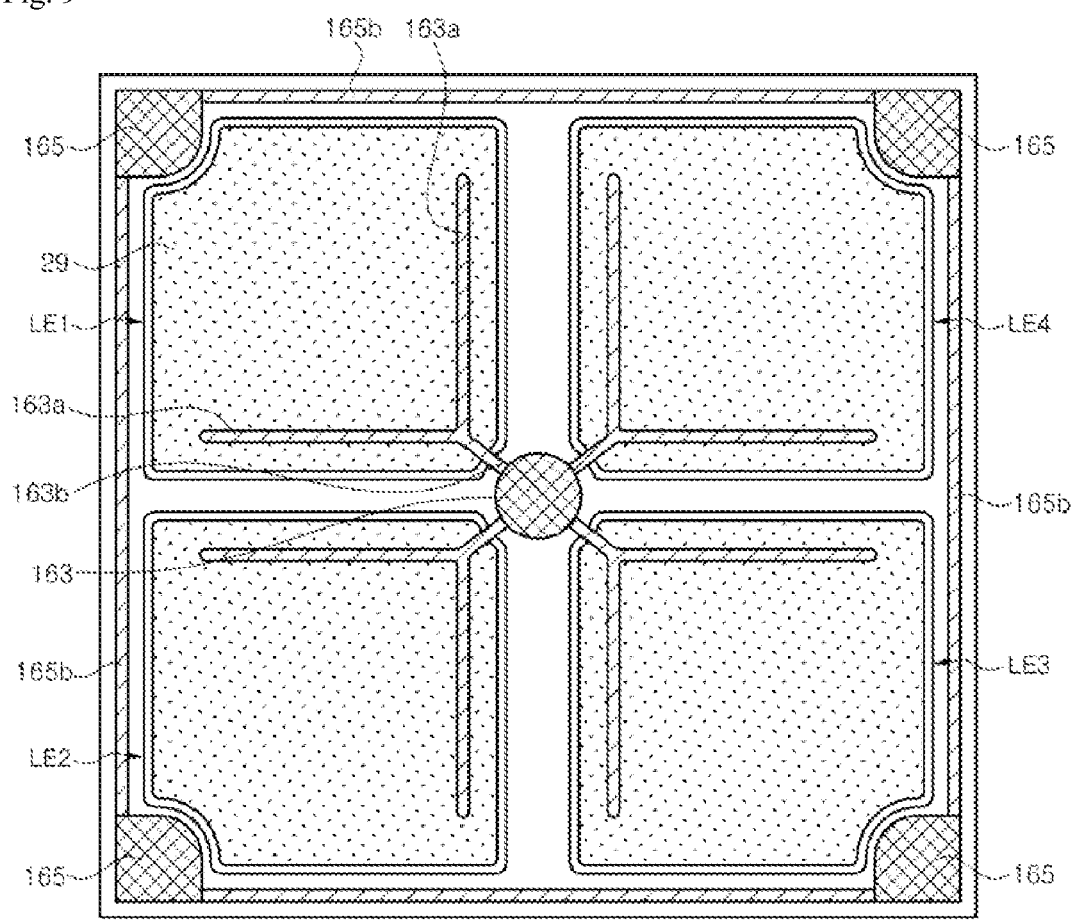
FIG. 9 is a plan view of a light emitting diode according to an eighth exemplary embodiment of the present invention.

FIG. 9 is a plan view of a light emitting diode according to an eighth exemplary embodiment of the present invention.

Referring to FIG. 9, the second conductive type semiconductor layer 27 and active layer 25 are divided into four light emitting regions LE1, LE2, LE3, LE4. Further, four first electrode pads 165 are disposed near corners of the light emitting diode, and a lower extension 165b surrounds the light emitting regions LE1, LE2, LE3, LE4.

As in the sixth and seventh embodiments, a second electrode pad 163 is disposed at the center of the substrate 21. The second electrode pad 163 may be located on a first conductive type semiconductor layer 23 with an insulation layer 31 interposed therebetween.

Upper extensions 163a are located on each of the light emitting regions LE1, LE2, LE3, LE4. The upper extensions 163a may extend along edges of each of the light emitting regions LE1, LE2, LE3, LE4 and be connected to a second conductive type semiconductor layer 27 or a transparent electrode layer 29. The upper extensions 163a are connected to the second electrode pad 163 through connectors 163b, which are insulated from the light emitting regions LE1, LE2, LE3, LE4 by the insulation layer 31.

According to the present exemplary embodiment, with the second electrode pad 163 located at the center of the substrate 21, a light emitting region is divided into the plural light emitting regions LE1, LE2, LE3, LE4, so that the light emitting diode may achieve uniform current spreading over a wide area.

In the present exemplary embodiment, the light emitting diode has the four first electrode pads 165 disposed at four corners of the substrate 21. Alternatively, the light emitting diode may have a single first electrode pad 165, from which the lower extension 165b extends to surround the light emitting regions LE1, LE2, LE3, LE4.

Figure 10:
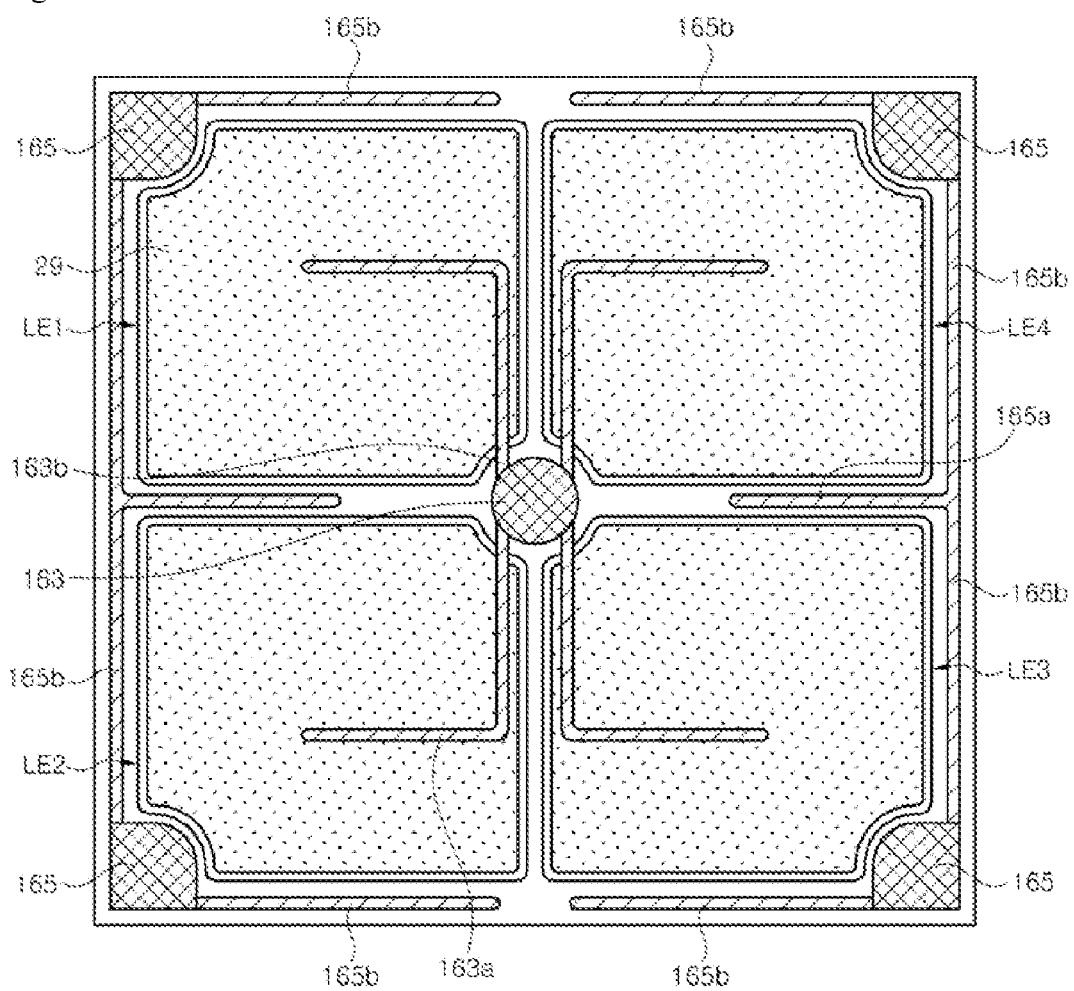
FIG. 10 is a plan view of a light emitting diode according to a ninth exemplary embodiment of the present invention.

FIG. 10 is a plan view of a light emitting diode according to a ninth exemplary embodiment of the present invention.

Referring to FIG. 10, the light emitting diode of the present exemplary embodiment is similar to the light emitting diode described with reference to FIG. 9. In the light emitting diode of the present exemplary embodiment, however, lower extensions 165a, 165b and upper extensions 163a are arranged in a different manner than in the above exemplary embodiment.

Specifically, the lower extensions 165b extend from first electrode pads 165 along an edge of the substrate 21 to surround associated light emitting regions LE1, LE2, LE3, LE4, and are separated from each other in some regions. Further, lower extensions 165a extend into a region between the light emitting regions LE1, LE2 and a region between the light emitting regions LE3, LE4, respectively. The lower extensions 165a may extend from the lower extensions 165b.

Each of the upper extensions 163a is connected to the second electrode pad 163 through a connector 163b. The upper extension 163a extends along one edge of each of the light emitting regions LE1, LE2, LE3, LE4, and then extends towards an opposite edge of each of the light emitting regions in a region between the lower extensions 165a, 165b.

According to the present exemplary embodiment, the light emitting diode may achieve optimized current spreading in the light emitting regions LE1, LE2, LE3, LE4 by adjusting the distances between the lower extensions 165a, 165b and upper extensions 163a through adjustment of shapes and arrangement thereof.

In the sixth to eighth exemplary embodiments, the second electrode pad 153 or 163 is located on the first conductive type semiconductor layer 23, and the insulation layer 31 is disposed between the second electrode pad 153 or 163 and the first conductive type semiconductor layer 23. However, as described above with reference to FIGS. 5 and 6, the second electrode 153 or 163 may be located directly on the substrate 21 (see FIG. 5). Alternatively, the insulation layer 31 may be disposed between the substrate 21 and the second electrode 153 or 163 (see FIG. 6). That is, with the insulation layer 31 directly located on the substrate 21, the second electrode pad 153 or 163 may be directly located on the insulation layer 31 to be in contact with the insulation layer 31. The second electrode pad 153 or 163 is formed on a region from which the first conductive type semiconductor layer 23, active layer 25 and second conductive type semiconductor layer 27 formed on the substrate 21 have been partially removed. When the second electrode pad 153 or 163 is directly formed on the substrate 21 to be in contact with the substrate 21, the substrate 21 may be a dielectric substrate.

Figure 11:
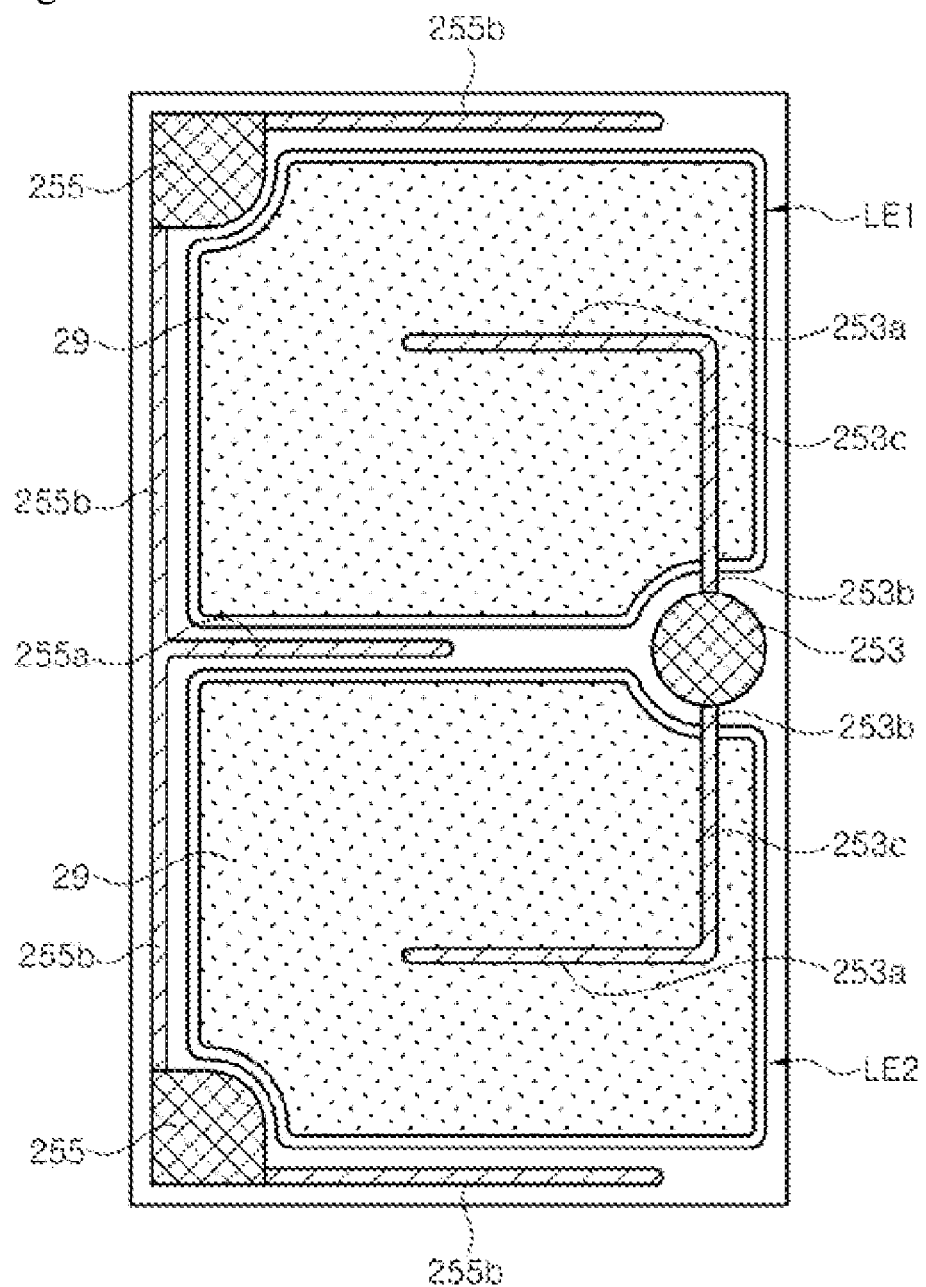
FIG. 11 is a plan view of a light emitting diode according to a tenth exemplary embodiment of the present invention.

FIG. 11 is a plan view of a light emitting diode according to a tenth exemplary embodiment of the present invention.

Referring to FIG. 11, the light emitting diode of the present exemplary embodiment is similar to the light emitting diode described with reference to FIGS. 1 and 2. In the light emitting diode of the present exemplary embodiment, however, first and second electrode pads 255, 253 are arranged in a different manner than in the above exemplary embodiment.

Specifically, in FIGS. 1 and 2, the first and second electrode pads 35, 33 are disposed in a major axis direction of the substrate 21 to face each other. In the present exemplary embodiment, however, the second electrode pad 253 is disposed near the center of one edge of the substrate 21 and two first electrode pads 255 are disposed near the opposite edge of the substrate 21. The one edge of the substrate 21 may be longer than other edges of the substrate 21, but is not limited thereto. In addition, the first electrode pads 255 are not located to face the second electrode pad 253, but are disposed near ends of the opposite edge of the substrate 21, that is, corners of the quadrangular substrate 21.

As in the above exemplary embodiments, the second conductive type semiconductor layer 27 and active layer 25 may be divided into light emitting regions LE1, LE2. Herein, the second conductive type semiconductor layer 27 and active layer 25 are divided into two light emitting regions. The light emitting regions LE1, LE2 may be disposed in a symmetrical structure relative to a line extending from the second electrode pad 253 in a minor axis direction of the substrate 21. In other words, the light emitting regions LE1, LE2 may be disposed in a symmetrical structure relative to a line crossing the second electrode pad 253 to be perpendicular to the one edge of the substrate 21.

An upper extension 253a or 253c is located on each of the light emitting regions LE1, LE2. The upper extensions 253c may be connected to the second electrode pad 253 through a connector 253b and extend along one edge of the light emitting region LE1. The upper extensions 253a may extend linearly from the upper extensions 253c. That is, the upper extensions 253a may linearly extend from one edge of the substrate 21 towards the other edge thereof.

The connector 253b is insulated from the second conductive type semiconductor layer by the insulation layer 31 (see FIGS. 2a and 2b). The insulation layer 31 may cover side surfaces of the second conductive type semiconductor layer 27 and active layer 25 exposed by mesa-etching to insulate the connector 253b or the second electrode pad 253 from the side surfaces of the second conductive type semiconductor layer 27 and active layer 25.

A lower extension 255b may extend from the first electrode pads 255 along edges of the substrate 21. As shown in FIG. 11, the lower extension 255b includes a lower extension extending along the other edge of the substrate 21 and a lower extension extending along an edge that connects the one edge to the other edge of the substrate. Accordingly, the lower extension 255b may extend along two edges of the light emitting region LE1 or LE2. In addition, another lower extension 255a may extend from the lower extension 255b to a region between the light emitting regions LE1, LE2. The lower extension 255a may extend towards the second electrode pad 253. The lower extensions 255a, 255b are electrically connected to the first conductive type semiconductor layer 23 to assist current spreading in the light emitting diode.

Further, as described with reference to FIGS. 1 and 2, the second electrode pad 253 is located on the first conductive type semiconductor layer 23 with the insulation layer 31 disposed between the second electrode pad 253 and the first conductive type semiconductor layer 23. As such, since the second electrode pad 253 is separated from the second conductive type semiconductor layer 27, it is possible to prevent current crowding around the second electrode pad 253. Furthermore, as described with reference to FIG. 3, a portion of the second electrode pad 253 may be located on the second conductive type semiconductor layer 27.

According to the present exemplary embodiment, the light emitting regions LE1, LE2 share a single second electrode pad 253 and are provided with the associated first electrode pads 255, respectively. Further, since the first electrode pads 255 are separated from the center of the edge of the substrate 21 such that the first electrode pads 255 and the second electrode pad 253 do not face each other, it is possible to achieve more efficient current spreading in the respective light emitting regions LE1, LE2.

In the present exemplary embodiment, the second conductive type semiconductor layer 27 and active layer 25 are divided to define the two light emitting regions LE1, LE2. However, it is not necessary to divide the second conductive type semiconductor layer 27 and active layer 25. That is, the second conductive type semiconductor layer 27 and active layer 25 of the light emitting regions LE1, LE2 may be connected to each other.

Figure 12:
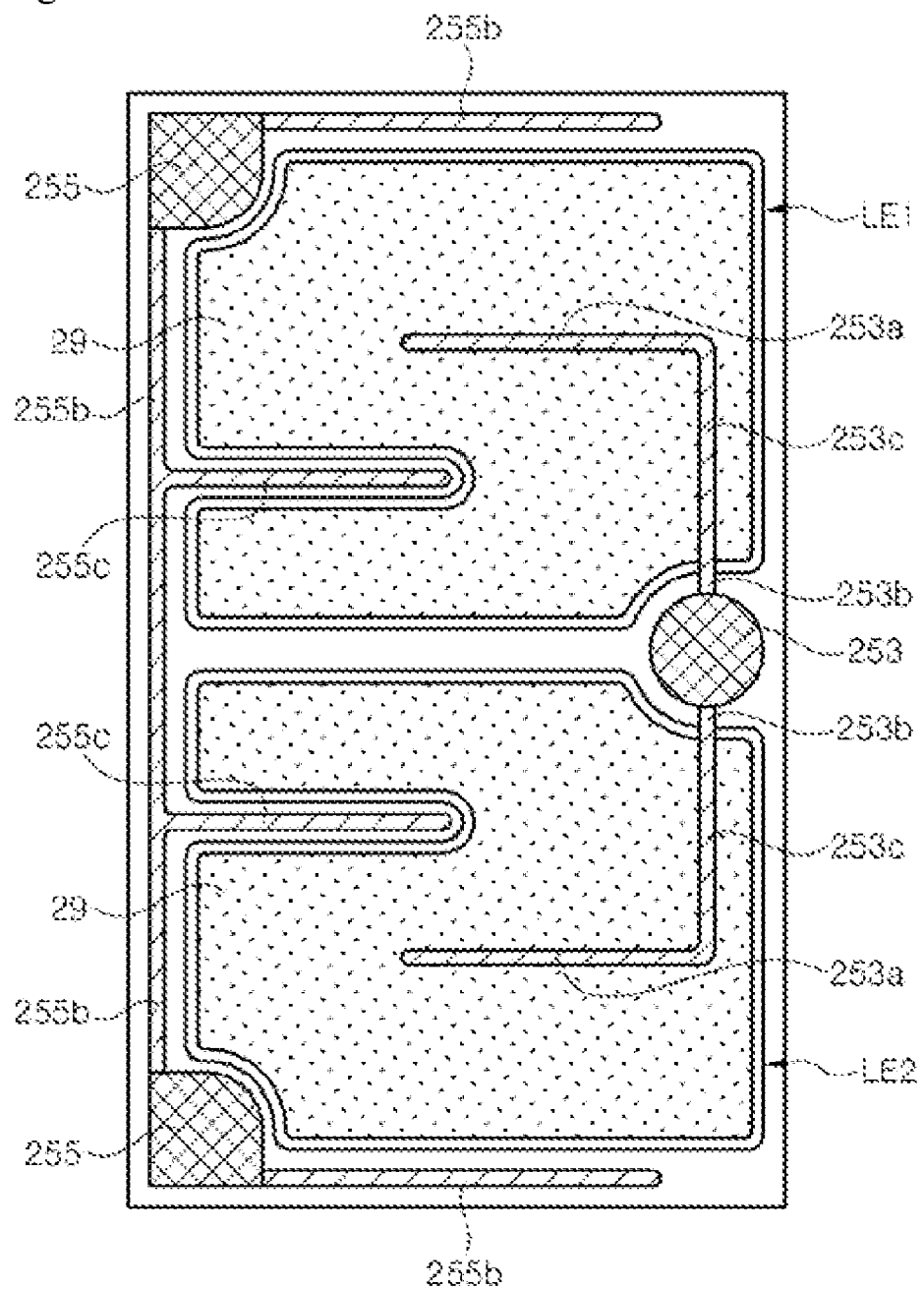
FIG. 12 is a plan view of a light emitting diode according to an eleventh exemplary embodiment of the present invention.

FIG. 12 is a plan view of a light emitting diode according to an eleventh exemplary embodiment of the present invention.

Referring to FIG. 12, the light emitting diode of the present exemplary embodiment is similar to the light emitting diode described with reference to FIG. 11. However, the light emitting diode of the present exemplary embodiment further includes a lower extension 255c entering each of the light emitting regions LE1, LE2. In the present exemplary embodiment, the lower extension 255a of FIG. 11 may be omitted.

Each of the lower extensions 255c is located on a region of the first conductive type semiconductor layer 23 exposed through mesa-etching and is electrically connected to the first conductive type semiconductor layer 23. The lower extension 255c may extend from the extensions 255b towards one edge of the substrate 21. On the other hand, each of the upper extensions 253a extends to a region between the lower extensions 255b, 255c.

According to the present exemplary embodiment, the light emitting diode includes the lower extensions 255c each entering the light emitting region LE1 or LE2, thereby achieving uniform current spreading over broader light emitting regions.

In the present exemplary embodiment, the light emitting regions LE1, LE2 may be disposed in a symmetrical structure relative to a line crossing the second electrode pad 253 to be perpendicular to the one edge of the substrate 21. As a result, the lower extensions 255c may be symmetrically disposed.

Figure 13:
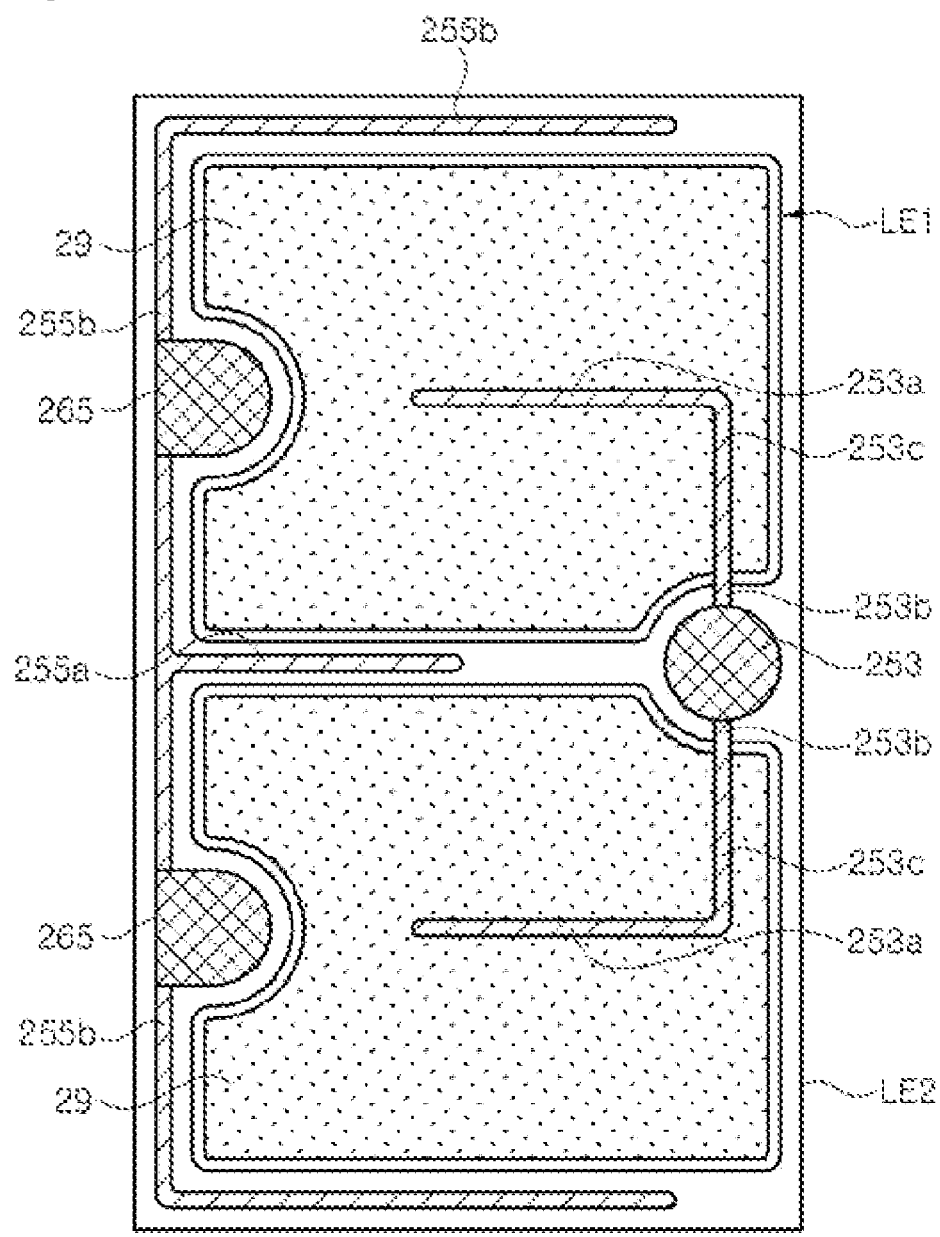
FIG. 13 is a plan view of a light emitting diode according to a twelfth exemplary embodiment of the present invention.

FIG. 13 is a plan view of a light emitting diode according to a twelfth exemplary embodiment of the present invention.

Referring to FIG. 13, the light emitting diode of the present exemplary embodiment is similar to the light emitting diode described with reference to FIG. 11. In the light emitting diode of the present exemplary embodiment, however, positions of first electrode pads 265 are different from those of the above exemplary embodiment.

Specifically, the first electrode pads 265 are located in regions between the center and one end on the other edge of the substrate 21. Each of the first electrode pads 265 may be located at a central region of an edge of a light emitting region LE1 or LE2. Further, each of the first electrode pads 265 may be located along an imaginary line formed by extension of each upper extension 253a. Thus, each of the upper extensions 253a may be located at the middle between the lower extension 255b and the lower extension 255a, thereby allowing uniform current spreading at both regions of the upper extension 253a.

In the tenth and eleventh exemplary embodiments, a second electrode pad 253 is located on a first conductive type semiconductor layer 23, and an insulation layer 31 is disposed between the second electrode pad 253 and the first conductive type semiconductor layer 23. However, as described above with reference to FIGS. 5 and 6, the second electrode pad 253 may be directly located on the substrate 21 to be in contact with the substrate 21. Alternatively, the insulation layer 31 may be disposed between the substrate 21 and the second electrode pad 253. That is, with the insulation layer 31 directly located on the substrate 21, the second electrode pad 253 may be directly located on the insulation layer 31 to be in contact with the insulation layer 31. The second electrode pad 253 is formed on a region from which the first conductive type semiconductor layer 23, active layer 25 and second conductive type semiconductor layer 27 formed on the substrate 21 have been partially removed. When the second electrode pad 253 is directly formed on the substrate 21 to be in contact with the substrate 21, the substrate 21 may be a dielectric substrate.

In the above exemplary embodiments, the second electrode pad 253 is horizontally separated from the second conductive type semiconductor layer 27. Consequently, it is possible to prevent current crowding around the second electrode pad 253. In addition, the second electrode pad 253 is electrically connected to the upper extension 253a, 253c through the connector 253b, which is insulated from the light emitting regions by the insulation layer 31. This is similar to the exemplary embodiment shown in FIGS. 1 and 2. Since the connector 253b is also insulated from the second conductive type semiconductor layer 27 by the insulation layer 31, it is possible to prevent current crowding around the second electrode pad 253.

Figure 14:
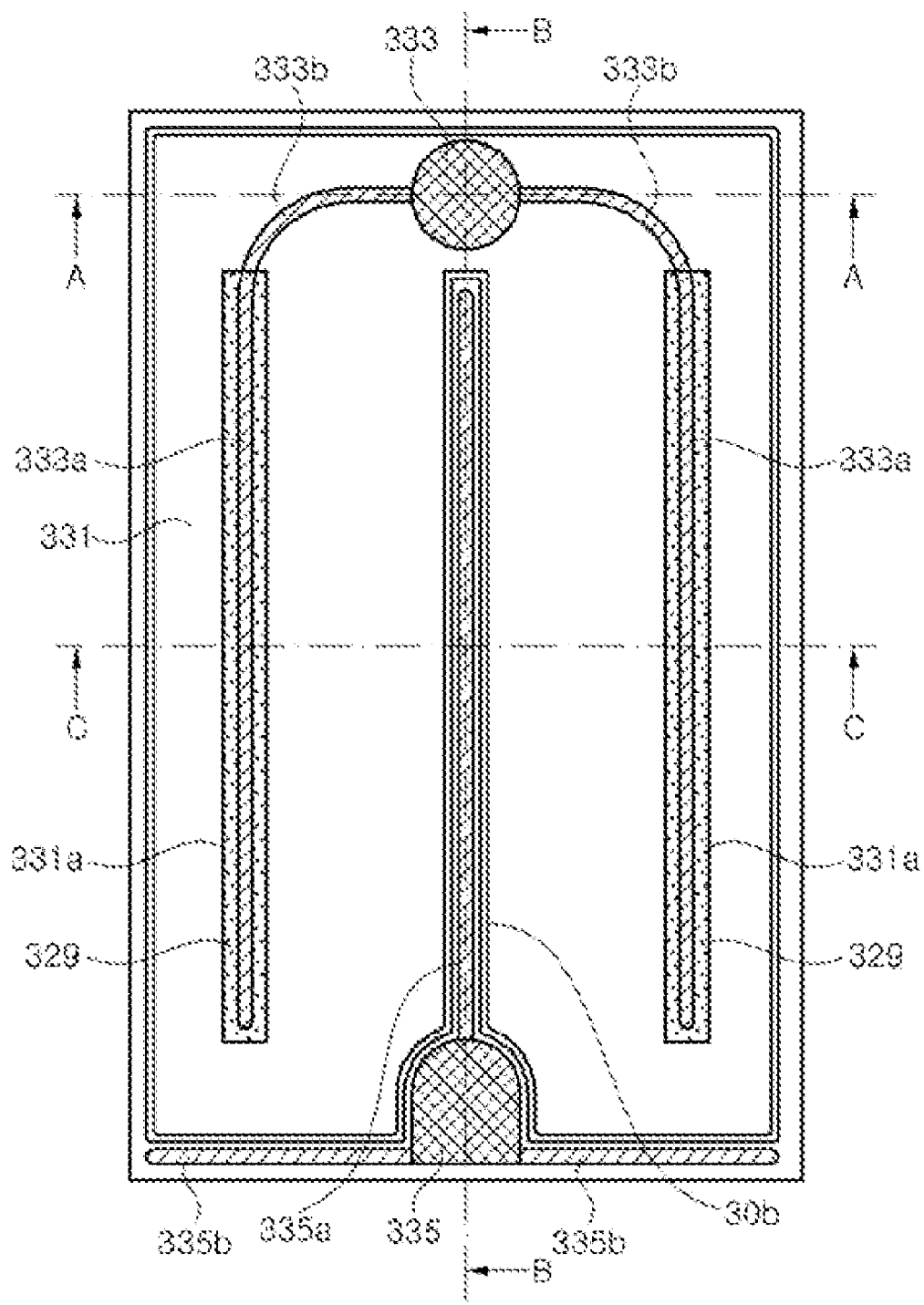
FIG. 14 is a plan view of a light emitting diode according to a thirteenth exemplary embodiment of the present invention.
Figure 15A:
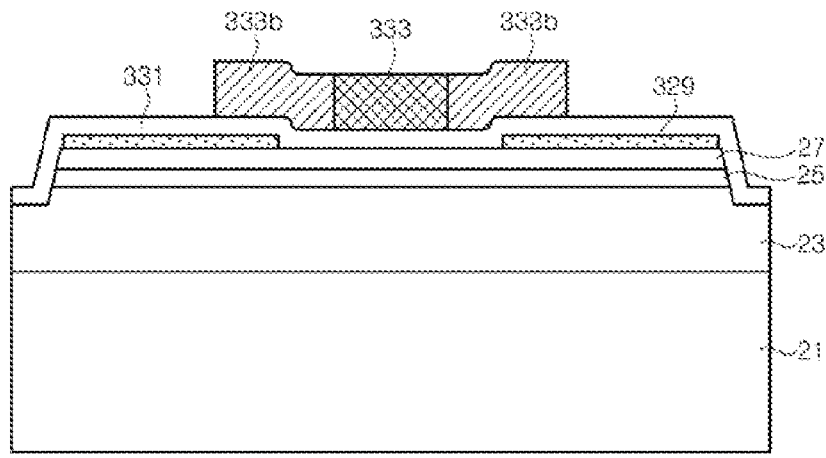
FIGS. 15a, 15b and 15c are cross-sectional views taken along lines A-A, B-B and C-C of FIG. 14, respectively.
Figure 15B:
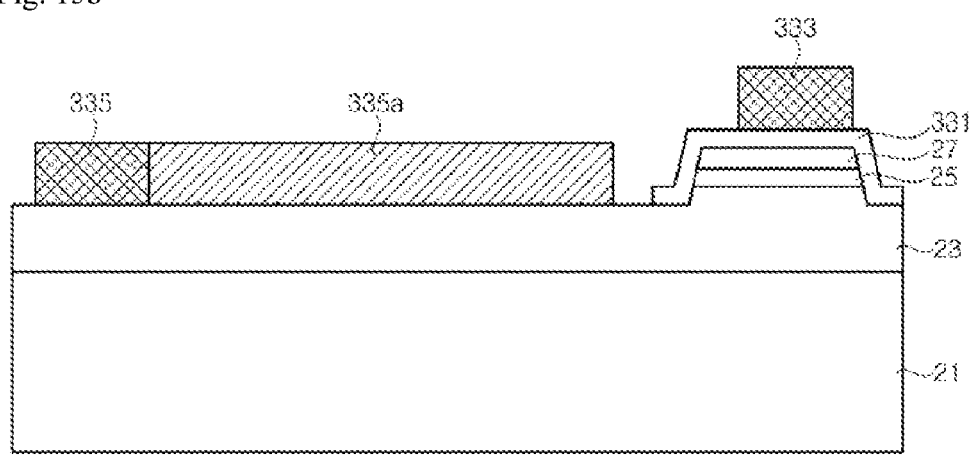
Figure 15C:
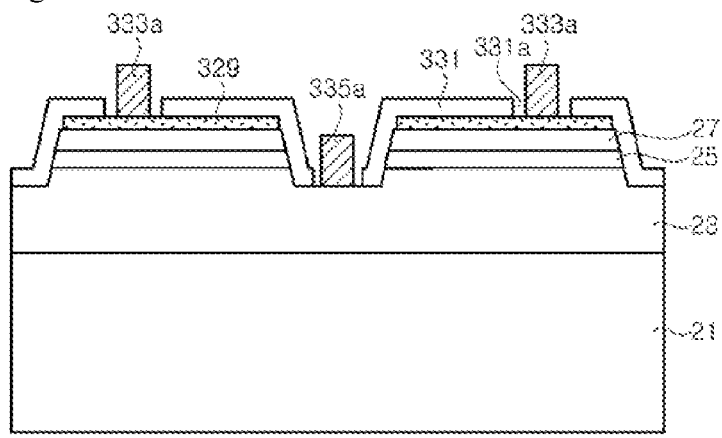

FIG. 14 is a plan view of a light emitting diode according to a thirteenth exemplary embodiment of the present invention, and FIGS. 15a, 15b and 15c are cross-sectional views taken along lines A-A, B-B and C-C of FIG. 14, respectively.

Referring to FIGS. 14, 15a, 15b and 15c, the light emitting diode includes a substrate 21, a first conductive type semiconductor layer 23, an active layer 25, a second conductive type semiconductor layer 27, an insulation layer 331, first and second electrode pads 335, 333, and upper extensions 333a. The light emitting diode may further include connectors 333b, a transparent electrode layer 29, a first lower extension 335a, and a second lower extension 335b.

The substrate 21, first conductive type semiconductor layer 23, active layer 25, and second conductive type semiconductor layer 27 are the same as those shown in FIGS. 1 and 2, and a detailed description thereof will be omitted herein.

The second conductive type semiconductor layer 27 and the active layer 25 may be subjected to mesa-etching to expose a region(s) of the first conductive type semiconductor layer 23, that is, an n-type semiconductor layer, where the first electrode pad 335, first lower extension 335a and second extension 335b will be formed. Mesa-etching may form an indented portion 30b, so that the second conductive type semiconductor layer 27 and the active layer 25 are substantially divided into two light emitting regions. Further, the mesa-etching may be performed to form inclined side surfaces which have a degree of inclination in the range of 30-70 degrees relative to a plane of the substrate 21.

A transparent electrode layer 329 may be formed on the second conductive type semiconductor layer 27. The transparent electrode layer 329 may be formed of ITO or Ni/Au and forms an ohmic contact with the second conductive type semiconductor layer 27. For example, as shown in FIG. 17b, the transparent electrode layer 329 may be divided into two regions. Here, the transparent electrode layer 329 may be divided into the two regions to expose the second conductive type semiconductor layer 27 on which the second electrode pad 333 will be formed, and these two regions may be symmetrically disposed.

The insulation layer 331 covers the second conductive type semiconductor layer 27. When the transparent electrode layer 329 is located on the second conductive type semiconductor layer 27, the insulation layer 331 also covers the transparent electrode layer 329. The insulation layer 331 also covers side surfaces of the second conductive type semiconductor layer 27 and active layer 25, which are exposed by mesa-etching. In addition, the insulation layer 331 may have openings 331a formed on the second conductive type semiconductor layer 27. The openings 331a expose the second conductive type semiconductor layer 27 (or the transparent electrode layer 329). The insulation layer 331 may be formed of any transparent material, for example $SiO_2$, through which light can be transmitted.

The second electrode pad 333 is located on the second conductive type semiconductor layer 27. The second electrode pad 333 is located on a region of the second conductive type semiconductor layer 27 which is exposed by dividing the transparent electrode layer 329, and is insulated from the second conductive type semiconductor layer 27 by the insulation layer 331.

The upper extensions 333a are located on the second conductive type semiconductor layer 27 (or the transparent electrode layer 329). The upper extensions 333a may be connected to the second conductive type semiconductor layer 27

(or the transparent electrode layer 329) via the openings 331a of the insulation layer 331. The upper extensions 333a are disposed to allow uniform current spreading in the second conductive type semiconductor layer 27. For example, the upper extensions 333a may extend parallel to each other. The upper extensions 333a may be connected to the second electrode pad 333 via the connectors 333b, respectively. The connectors 333b are separated from the second conductive type semiconductor layer 27 by the insulation layer 331.

The first electrode pad 335 is located on the region of the first conductive type semiconductor layer 23 exposed by mesa-etching. The first electrode pad 335 is electrically connected to the first conductive type semiconductor layer 23. The first and second electrode pads 335, 333 are bonding pads for wire bonding and have a relatively wide area for wire bonding. The first lower extension 335a may extend from the first electrode pad 335 towards the second electrode pad 333. The first lower extension 335a is located on the first conductive type semiconductor layer 23 and is electrically connected thereto. As shown in the figures, the first lower extension 335a may be located in a region between the divided regions of the transparent electrode layer 329 and parallel to the upper extensions 333a. In addition, the second lower extensions 335b may extend from the first electrode pad 335 along an edge of the substrate 21.

The electrode pads 333, 335, upper extensions 333a, connectors 333b, and lower extension 335a may be formed of, but are not limited to, the same material, for example Cr/Au, by the same process. Alternatively, the upper extensions 333a and the second electrode pad 333 may be formed of different materials by different processes.

In the present exemplary embodiment, the light emitting diode has a symmetrical structure relative to a line crossing the first electrode pad 335 and the second electrode pad 333, for example line B-B of FIG. 14. The divided regions of the transparent electrode layer 329 and the upper extensions 333a are symmetrically disposed. The lower extensions 335b may also be symmetrically disposed. Accordingly, in the light emitting diode according to the present exemplary embodiment, the divided regions of the transparent electrode layer 329 may provide the same luminescence characteristics at both divided regions thereof. As a result, the light emitting structure of the light emitting diode is substantially divided into two light emitting regions, so that the light emitting diode can prevent excessive current crowding around a defect such as pin holes or thread dislocations, thereby achieving uniform current spreading.

In the present exemplary embodiment, the first electrode pad 335 is located on the first conductive type semiconductor layer 23. However, if the substrate 21 is conductive, the first electrode pad 335 may be located on the top or bottom surface of the substrate 21.

Figure 16:
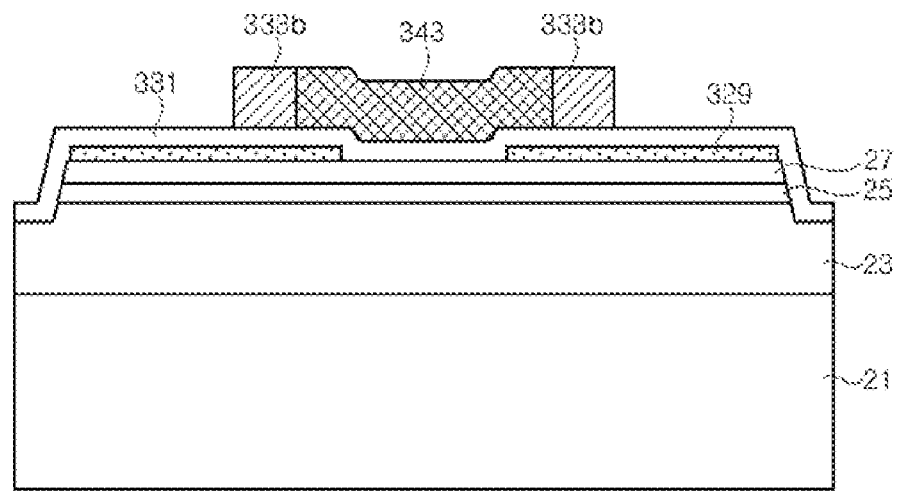
FIG. 16 is a cross-sectional view of a light emitting diode according to a fourteenth exemplary embodiment of the present invention.

FIG. 16 is a cross-sectional view of a light emitting diode according to a fourteenth exemplary embodiment of the present invention.

Referring to FIG. 16, the light emitting diode of the present exemplary embodiment is similar to the light emitting diode described with reference to FIGS. 14 and 15. In the light emitting diode of the present exemplary embodiment, however, an additional portion of a second electrode pad 343 is located above a transparent electrode layer 329.

Specifically, the second electrode pad 343 is located above an exposed region of the second conductive type semiconductor layer 27 between the divided regions of the transparent electrode layer 329 such that that portion of the second electrode pad 343 is located above the transparent electrode layer 329. The second electrode pad 343 is insulated from the transparent electrode layers 329 by an insulation layer 31.

In the present exemplary embodiment, an area of the region, which divides the transparent electrode region 329, may be relatively decreased. Further, the second electrode pad 343 may be formed to have a greater area than the second electrode pad 333 of the above exemplary embodiment.

FIGS. 17a, 17b, 17c and 17d are plan views illustrating a method of manufacturing a light emitting diode according to the thirteenth exemplary embodiment. Methods of forming semiconductor layers 23, 25, 27, a transparent electrode layer 329 and an insulation layer 331 are well known in the art and a detailed description thereof will be omitted herein. Any process, known now or not yet known, that can form semiconductor layers 23, 25, 27, a transparent electrode layer 329 and an insulation layer 331, can be used to manufacture the light emitting diode.

Figure 17A:
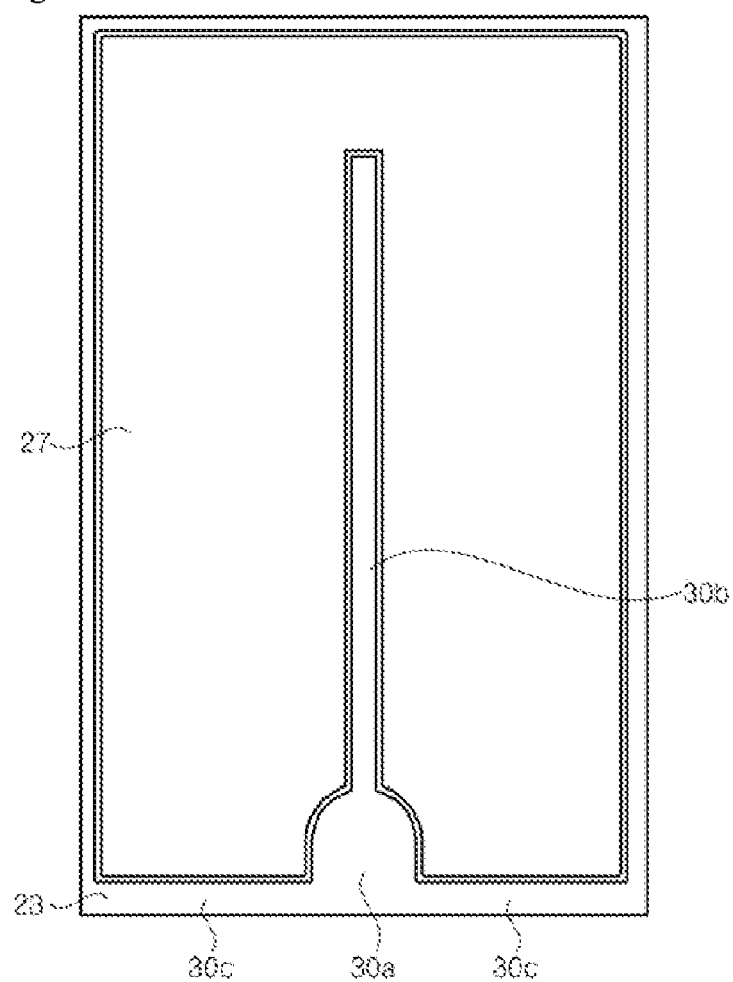
FIGS. 17a, 17b, 17c and 17d are plan views illustrating a method of manufacturing a light emitting diode according to the thirteenth exemplary embodiment of the present invention.
Figure 17B:
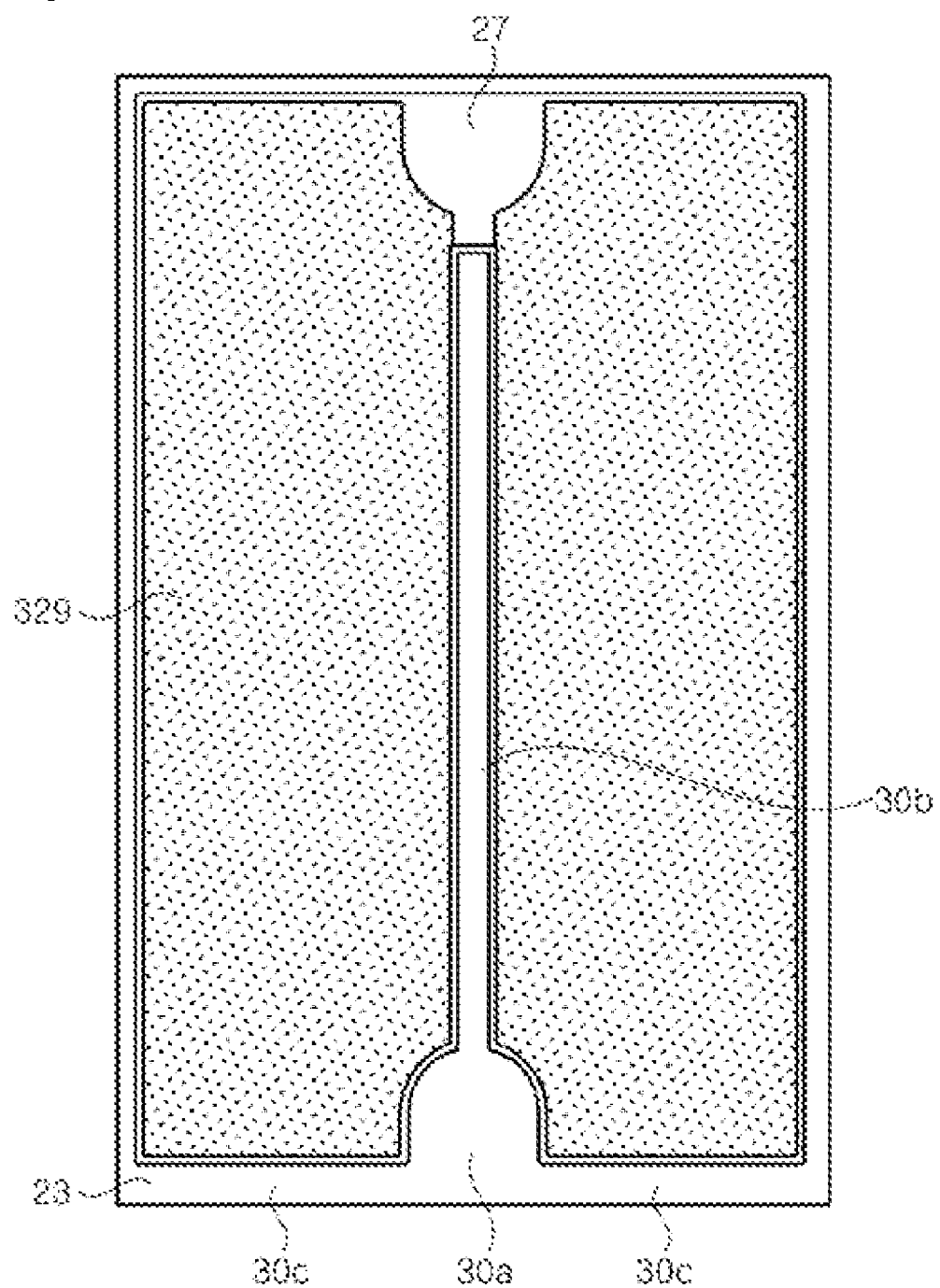

First, referring to FIG. 17a, semiconductor layers including a first conductive type semiconductor layer 23, active layer 25 and second conductive type semiconductor layer 27 are formed on a substrate 21. Then, the semiconductor layers are subjected to mesa-etching to expose the first conductive type semiconductor layer 23. The semiconductor layers may have inclined surfaces, for example, at 30-70 degrees relative to a substrate plane. Here, a region 30a to be formed with a first electrode pad 335, a region 30b to be formed with a first lower extension 335a, and a region 30c to be formed with a second lower extension 335b are exposed on the first conductive type semiconductor layer 23. The region 30b to be formed with the first lower extension 335a becomes an indented portion 30b which extends inwardly. The indented portion 30b is located at the middle of the semiconductor layers and extends inwardly from the region 30a, on which the first electrode pad will be formed, to divide a light emitting region into substantially two light emitting regions. Here, a region of the second conductive type semiconductor layer and active layer to be formed with the second electrode pad 333 (see FIG. 14) remains instead of being removed by etching.

Referring to FIG. 17b, a transparent electrode layer 329 may be formed on the second conductive type semiconductor layer 27. The transparent electrode layer 329 may be divided into the two regions to expose the second conductive type semiconductor layer 27 on which the second electrode pad 333 will be formed. The two regions of the transparent electrode layer 329 may have a symmetrical structure relative to each other. The transparent electrode layer 329 may be formed of ITO or Ni/Au and forms an ohmic contact with the second conductive type semiconductor layer 27.

Figure 17C:
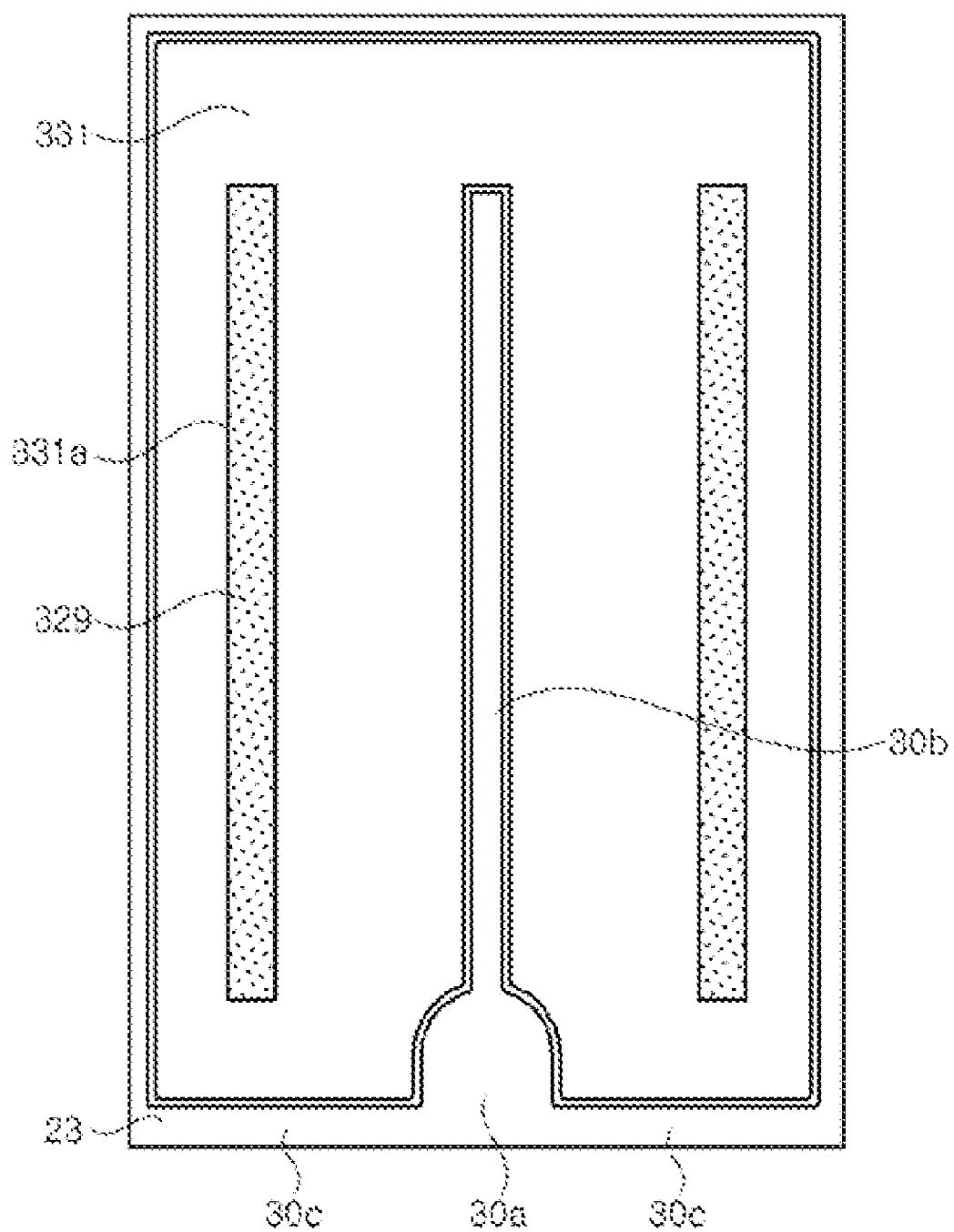

Referring to FIG. 17c, an insulation layer 331 is formed on the transparent electrode layer 329. The insulation layer 331 covers a region of the second conductive type semiconductor layer 27 on which the second electrode pad 333 will be formed. Further, the insulation layer 331 may also cover side surfaces of the second conductive type semiconductor layer 27 and active layer 25, which are exposed by mesa-etching. In addition, the insulation layer 331 is subjected to a patterning process to form openings 331a, which expose the transparent electrode layer 329, via photolithography and etching. The openings 331a exposing the transparent electrode layer 329 may be symmetrically formed parallel to each other. Further, the regions 30a, 30b, 30c of the first conductive type semiconductor layer, on which the first electrode pad 335, first lower extension 335a and second extension 335b will be respectively formed, are also exposed therethrough.

Figure 17D:
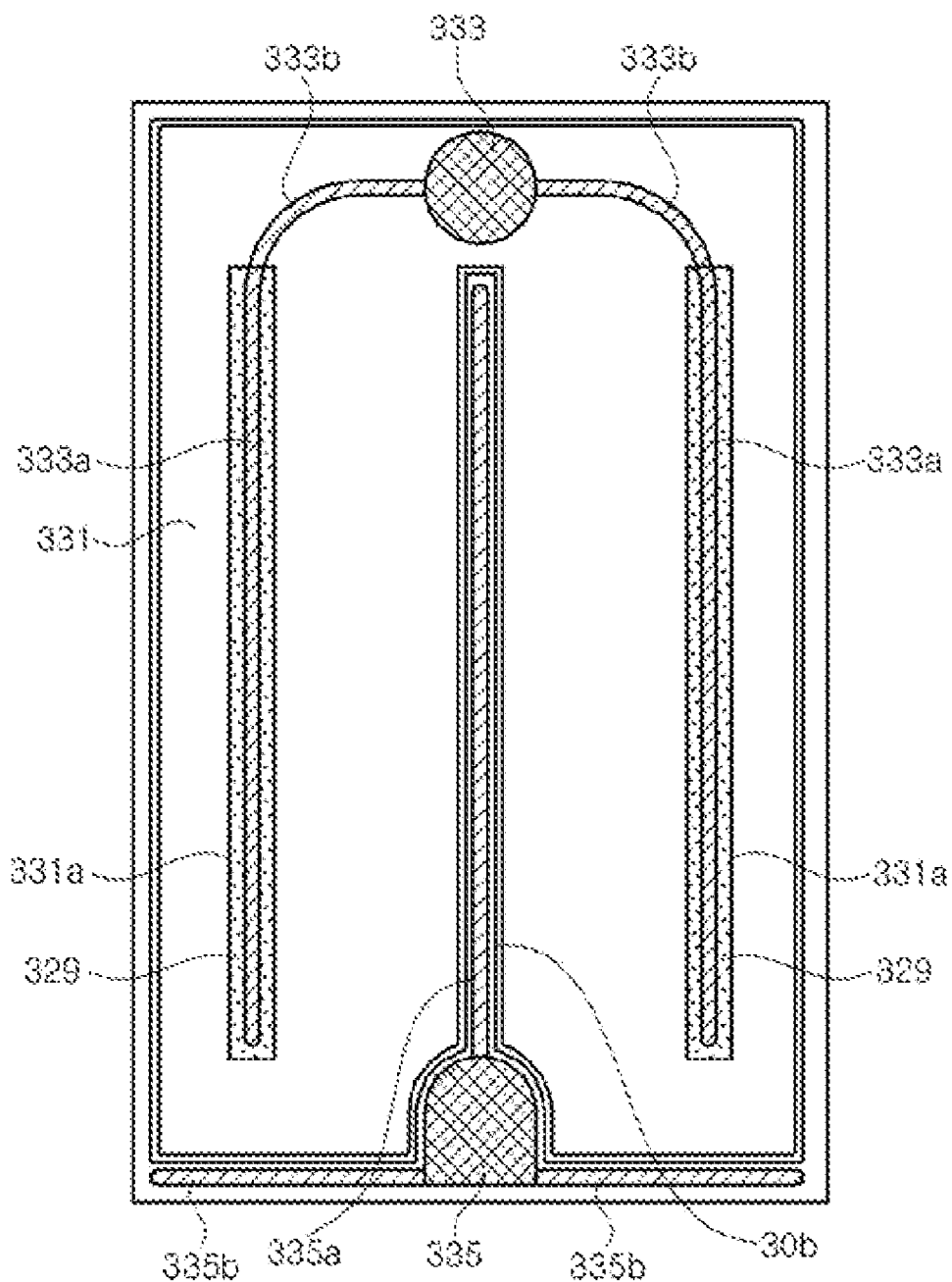

Referring to FIG. 17d, the first electrode pad 335, first lower extension 335a and second extension 335b are formed on the exposed regions of the first conductive type semiconductor layer 23. Further, a second electrode pad 333 and connectors 333b are formed on the insulation layer 331, and upper extensions 333a are formed in the openings 331a.

The upper extensions 333a may be connected to the transparent electrode layer 329 and be formed parallel to the first lower extension 335a. As a result, a light emitting diode is fabricated, as shown in FIG. 14.

In the present exemplary embodiment, the transparent electrode layer 329 is divided into the two regions, but is not limited thereto. The transparent electrode layer 329 may be divided into more than two regions. Further, although the transparent electrode layer 329 is formed after mesa-etching in the present exemplary embodiment, the mesa-etching may be carried out after formation of the transparent electrode layer 329.

Figure 18:
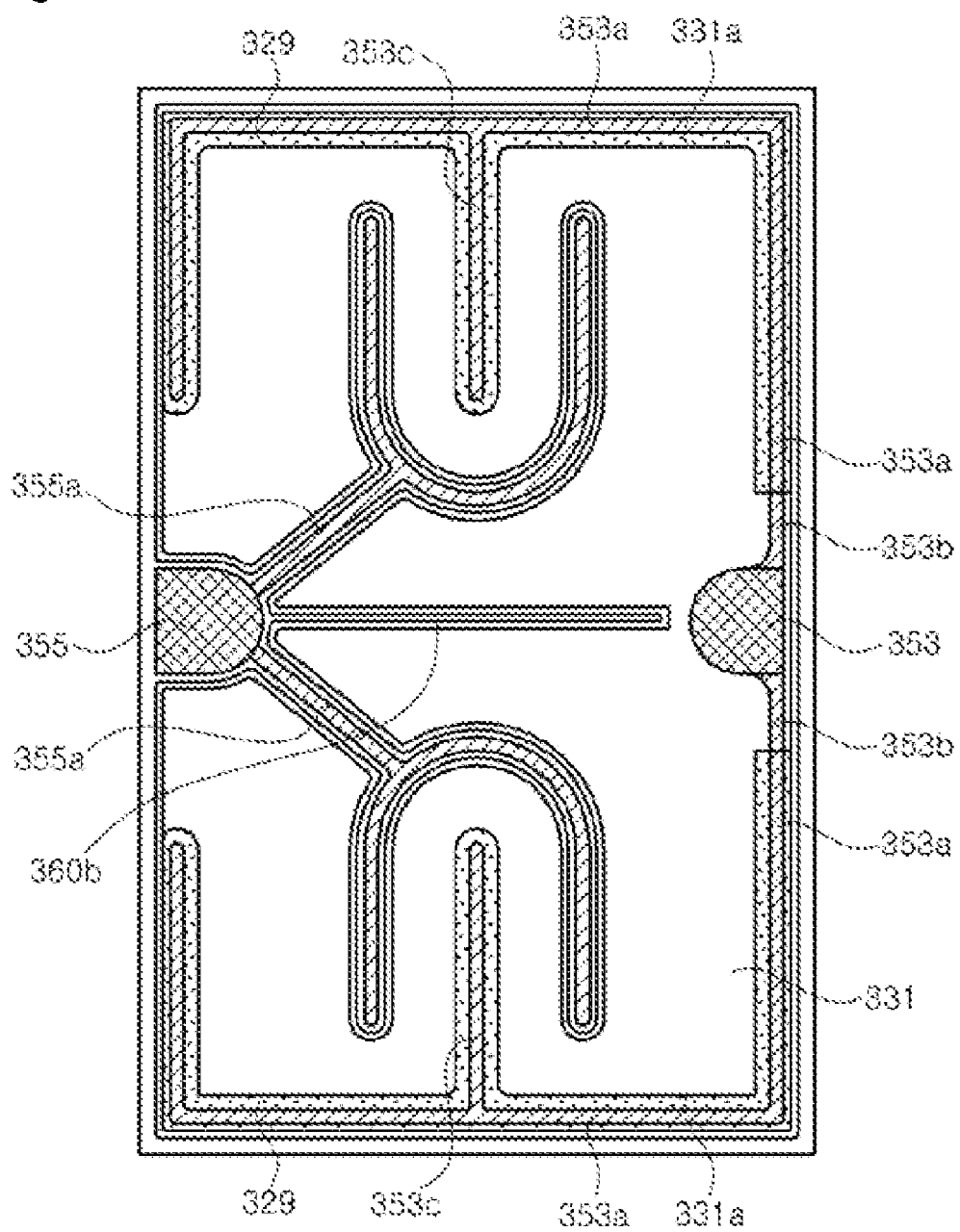
FIG. 18 is a plan view of a light emitting diode according to a fifteenth exemplary embodiment of the present invention.

FIG. 18 is a plan view of a light emitting diode according to a fifteenth exemplary embodiment of the present invention.

In the above exemplary embodiment of FIG. 14, the first and second electrode pads 335, 333 are disposed in a major axis direction of the light emitting diode, and the transparent electrode layer 329 is divided into the two regions in the major axis direction of the light emitting diode. In the present exemplary embodiment, however, the first and second electrode pads 335, 333 are disposed in a minor axis direction of the light emitting diode, and the transparent electrode layer 329 is divided into the two regions in the minor axis direction of the light emitting diode. Further, the divided regions of the transparent electrode layer 329 are symmetrically disposed, and the upper extensions 353a and lower extensions 355a are also symmetrically disposed.

Here, the upper extensions 353a extend along an edge of the light emitting diode to surround the light emitting diode and include extensions 353c extending inwardly from the edge of the light emitting diode. The lower extensions 355a extend outwardly from the interior of the light emitting diode. Further, the lower extensions 355a may be bifurcated to surround the extensions 353c in associated light emitting regions, respectively.

The upper extensions 353a are connected to the transparent electrode layer 329 through the openings 331a of the insulation layer 331, and connected to the second electrode pad 353 through the connectors 353b. The connectors 353b are insulated from the transparent electrode layer 329 by the insulation layer 331.

In the present exemplary embodiment, the light emitting diode omits the first lower extension 335a (see FIG. 14), which extends from the first electrode pad 355 towards the second electrode pad 353.

Figure 19:
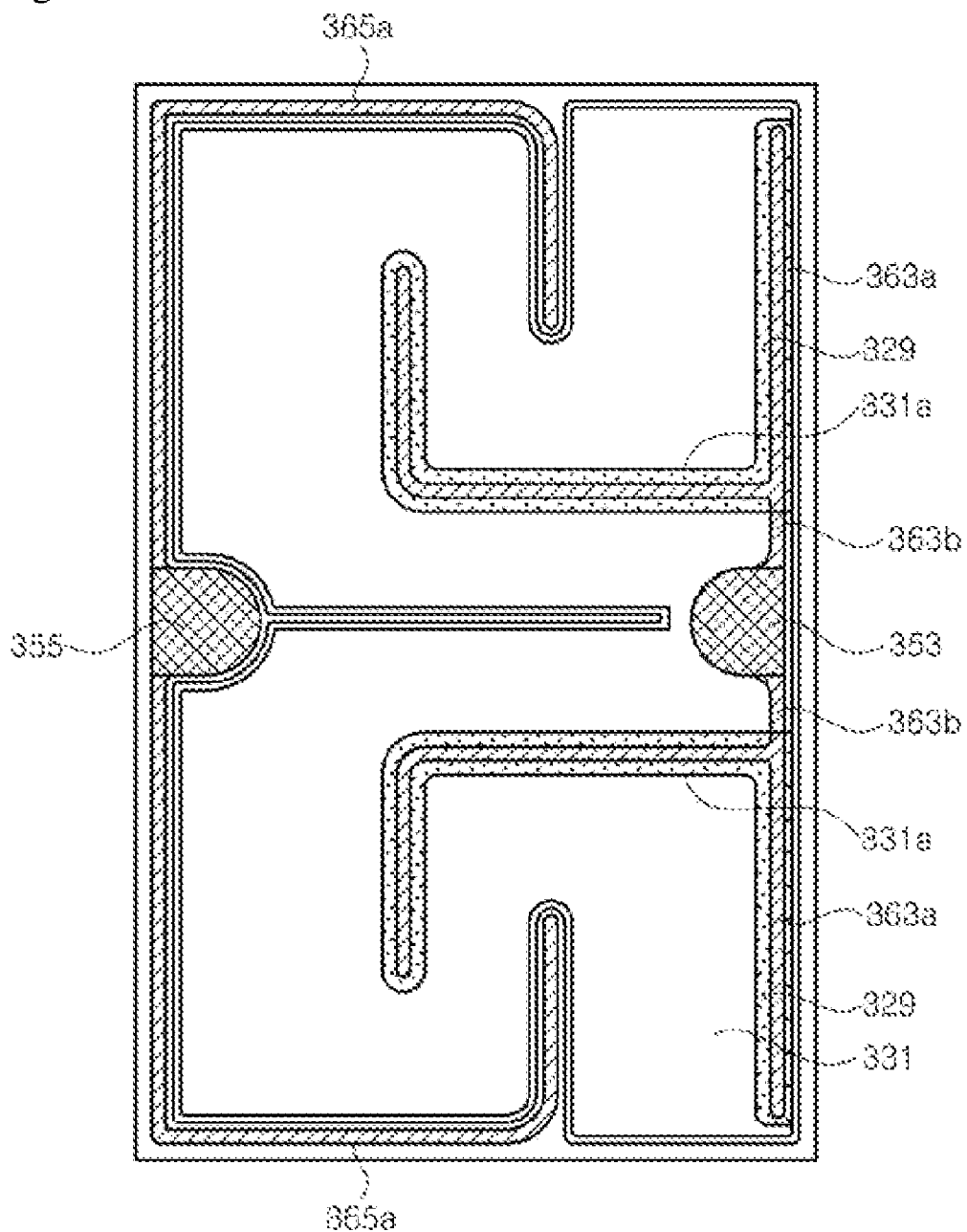
FIG. 19 is a plan view of a light emitting diode according to a sixteenth exemplary embodiment of the present invention.

FIG. 19 is a plan view of a light emitting diode according to a sixteenth exemplary embodiment of the present invention.

Referring to FIG. 19, the light emitting diode of the present exemplary embodiment is similar to the light emitting diode described with reference to FIG. 18. In the light emitting diode of the present exemplary embodiment, however, lower extensions 365a and upper extensions 363a are arranged in a different manner than in the above exemplary embodiment.

Specifically, the lower extensions 365a extend along an edge of the light emitting diode and are bent to extend inwardly, and the upper extensions 363a include two extensions on each of divided regions of the transparent electrode layer 329, which surround each of the lower extensions 365a extending inwardly.

The upper extensions 363a are connected to the transparent electrode layer 329 through openings 331a of an insulation layer 331, and are connected to a second electrode pad 353 through connectors 363b. The connectors 363b are insulated from the transparent electrode layer 329 by the insulation layer 331.

Figure 20:
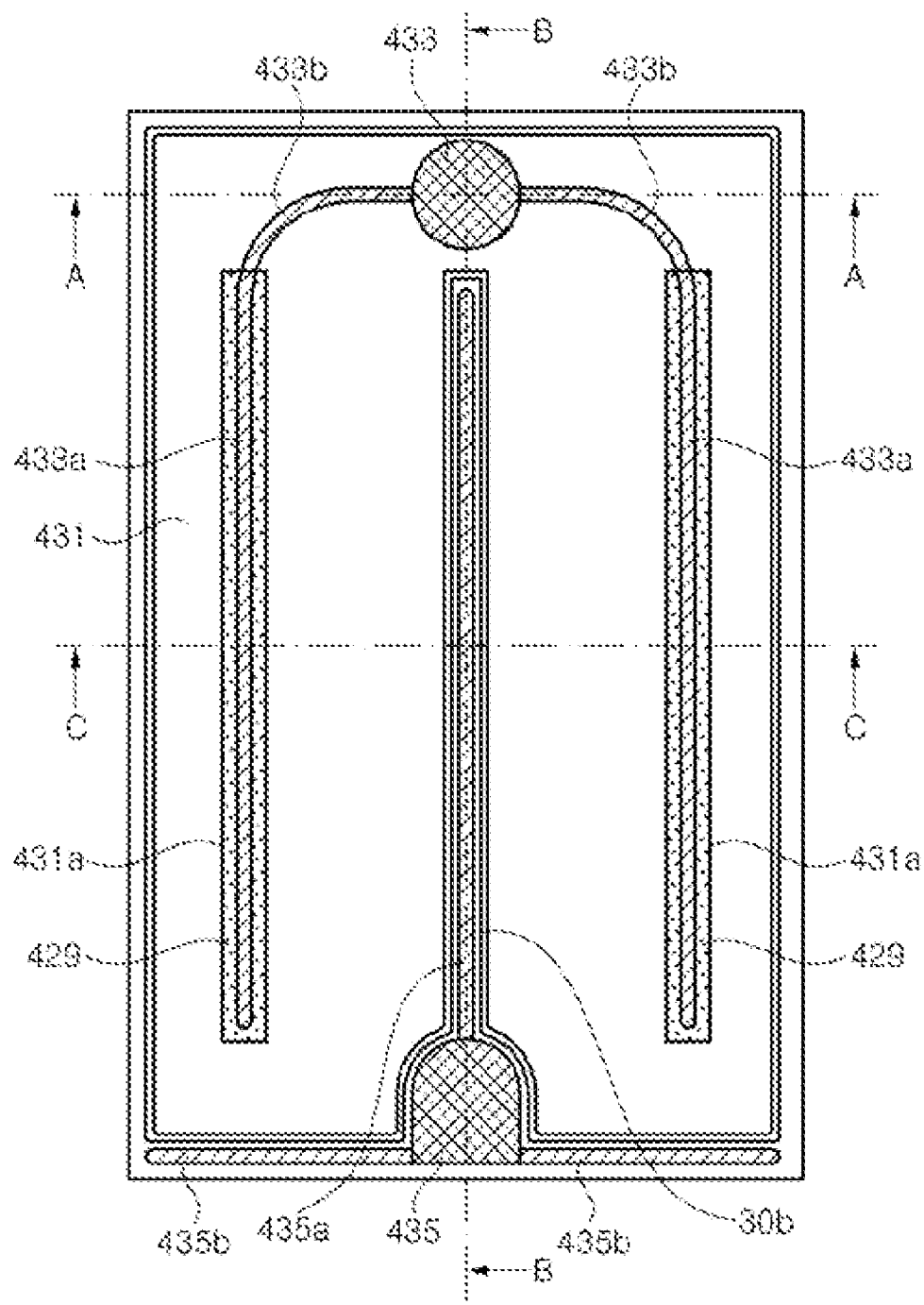
FIG. 20 is a plan view of a light emitting diode according to a seventeenth exemplary embodiment of the present invention.
Figure 21A:
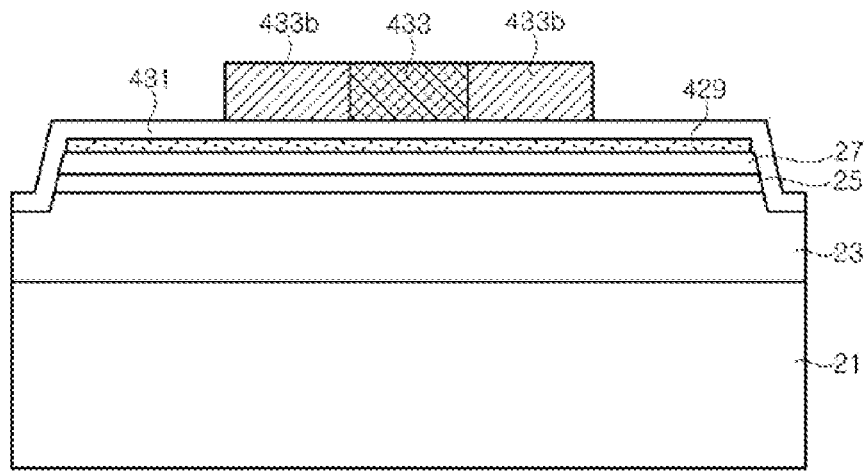
FIGS. 21a, 21b and 21c are cross-sectional views taken along lines A-A, B-B and C-C of FIG. 20, respectively.
Figure 21B:
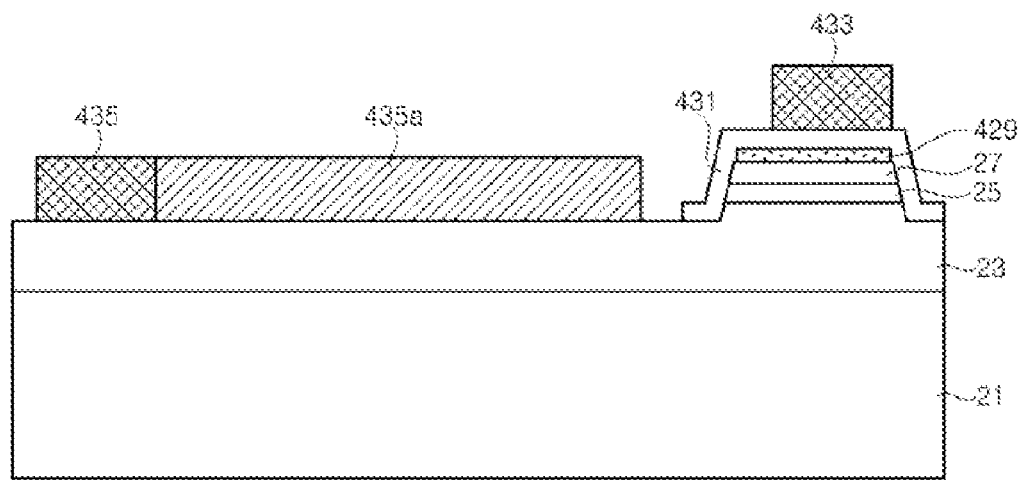
Figure 21C:
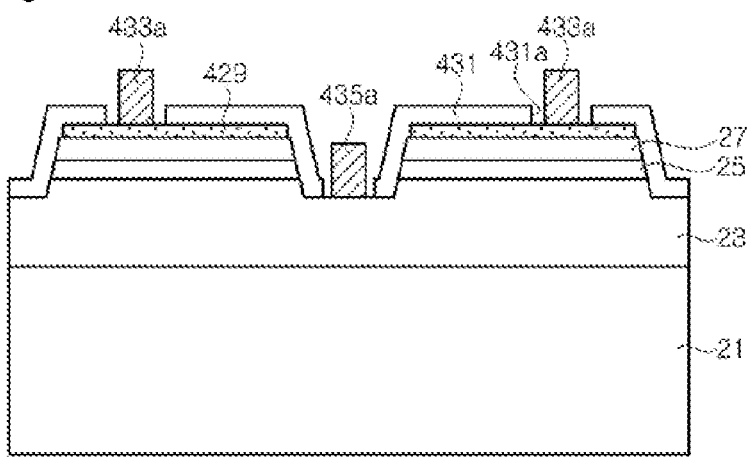

FIG. 20 is a plan view of a light emitting diode according to a seventeenth exemplary embodiment of the present invention, and FIGS. 21a, 21b and 21c are cross-sectional views taken along lines A-A, B-B and C-C of FIG. 20, respectively.

Referring to FIGS. 20, 21a, 21b and 21c, the light emitting diode of the present exemplary embodiment is similar to the light emitting diode described with reference to FIGS. 14 and 15. In the light emitting diode of the present exemplary embodiment, however, a second electrode pad 433 is located above a transparent electrode layer 429 and insulated therefrom by an insulation layer 431. Further, a first conductive type semiconductor layer 23 is an n-type semiconductor layer and a second conductive type semiconductor layer 27 is a p-type semiconductor layer.

The light emitting diode includes a substrate 21, an n-type semiconductor layer 23, an active layer 25, a p-type semiconductor layer 27, the transparent electrode layer 429, the insulation layer 431, first and second electrode pads 435, 433, and upper extensions 433a. The light emitting diode may further include connectors 433b, a first lower extension 435a, and a second lower extension 435b.

The substrate 21, n-type semiconductor layer 23, active layer 25, and p-type semiconductor layer 27 are the same as those shown in FIGS. 14 and 15, and a detailed description thereof will be omitted herein.

The transparent electrode layer 429 may be located on the p-type semiconductor layer 27. The transparent electrode layer 429 may be formed of ITO or Ni/Au and forms an ohmic contact with the p-type semiconductor layer 27. For example, as shown in FIG. 22b, the transparent electrode layer 429 may be formed on the p-type semiconductor layer 27 and have a symmetrical structure. Here, the transparent electrode layer 429 covers a region of the p-type semiconductor layer 27 on which the second electrode pad 433 will be formed.

The insulation layer 431 covers the transparent electrode layer 429. The insulation layer 431 also covers side surfaces of the p-type semiconductor layer 27 and active layer 25, which are exposed by mesa-etching. In addition, the insulation layer 431 may have openings 431a exposing the transparent electrode layer 429. The transparent electrode layer 429 (or the p-type semiconductor layer 27) is exposed through the openings 431a. The insulation layer 431 may be formed of any transparent material, for example $SiO_2$, through which light can be transmitted.

The second electrode pad 433 is located on the transparent electrode layer 429. The second electrode pad 433 is located on a region of the transparent electrode layer 429 near an indented portion 30b and is insulated from the transparent electrode layer 429 by the insulation layer 431.

The upper extensions 433a are located on the transparent electrode layer 429. The upper extensions 433a may be connected to the transparent electrode layer 429 via the openings 431a of the insulation layer 431, and may thus be electrically connected to the p-type semiconductor layer 27. The p-type semiconductor layer 27 may be exposed through the openings 431a, and the upper extensions 433a may be directly connected to the p-type semiconductor layer 27. The upper extensions 433a are disposed to allow uniform current spreading in the p-type semiconductor layer 27. For example, the upper extensions 433a may extend parallel to each other. The upper extensions 433a may be connected to the second electrode pad 433 via the connectors 433b, respectively. The connectors 433b are insulated from the transparent electrode layer 429 by the insulation layer 431.

The first electrode pad 435 may be located on the region of the n-type semiconductor layer 23 exposed by mesa-etching. The first electrode pad 435 is electrically connected to the n-type semiconductor layer 23. The first and second electrode pads 435, 433 are bonding pads for wire bonding and may have a relatively wide area for wire bonding. The first lower extension 435a may extend from the first electrode pad 435 towards the second electrode pad 433. The first lower extension 435a is located on the n-type semiconductor layer 23 and is electrically connected thereto. As shown in the figures, the first lower extension 435a may be located in the indented portion 30b and parallel to the upper extensions 433a. In addition, the second lower extensions 435b may extend from the first electrode pad 435 along an edge of the substrate 21.

The electrode pads 433, 435, upper extensions 433a, connectors 433b, and first and second lower extensions 435a, 435b may be formed of, but are not limited to, the same material, for example Cr/Au, by the same process. Alternatively, the upper extensions 433a and the second electrode pad 433 may be formed of different materials by different processes.

In the present exemplary embodiment, the light emitting diode has a symmetrical structure relative to a line crossing the first electrode pad 435 and the second electrode pad 433, for example line B-B of FIG. 20. The divided regions of the transparent electrode layer 429 and the upper extensions 433a may be symmetrically disposed, and the second lower extensions 435b may also be symmetrically disposed. Accordingly, the light emitting diode may exhibit the same luminescence characteristics at both sides of the indented portion 30b. As a result, the light emitting structure of the light emitting diode is substantially divided into two light emitting regions, so that the light emitting diode can prevent excessive current crowding around a defect such as pin holes or thread dislocations, thereby achieving uniform current spreading.

In the present exemplary embodiment, the first electrode pad 435 is located on the n-type semiconductor layer 23. However, if the substrate 21 is conductive, the first electrode pad 435 may be located on the top or bottom surface of the substrate 21.

FIGS. 22a, 22b, 22c and 22d are plan views illustrating a method of manufacturing a light emitting diode according to the seventeenth exemplary embodiment. Methods of forming semiconductor layers 23, 25, 27, a transparent electrode layer 429 and an insulation layer 431 are well known in the art and a detailed description thereof will be omitted herein. Any process, known now or not yet known, that can form semiconductor layers 23, 25, 27, a transparent electrode layer 329 and an insulation layer 331, can be used to manufacture the light emitting diode.

Figure 22A:
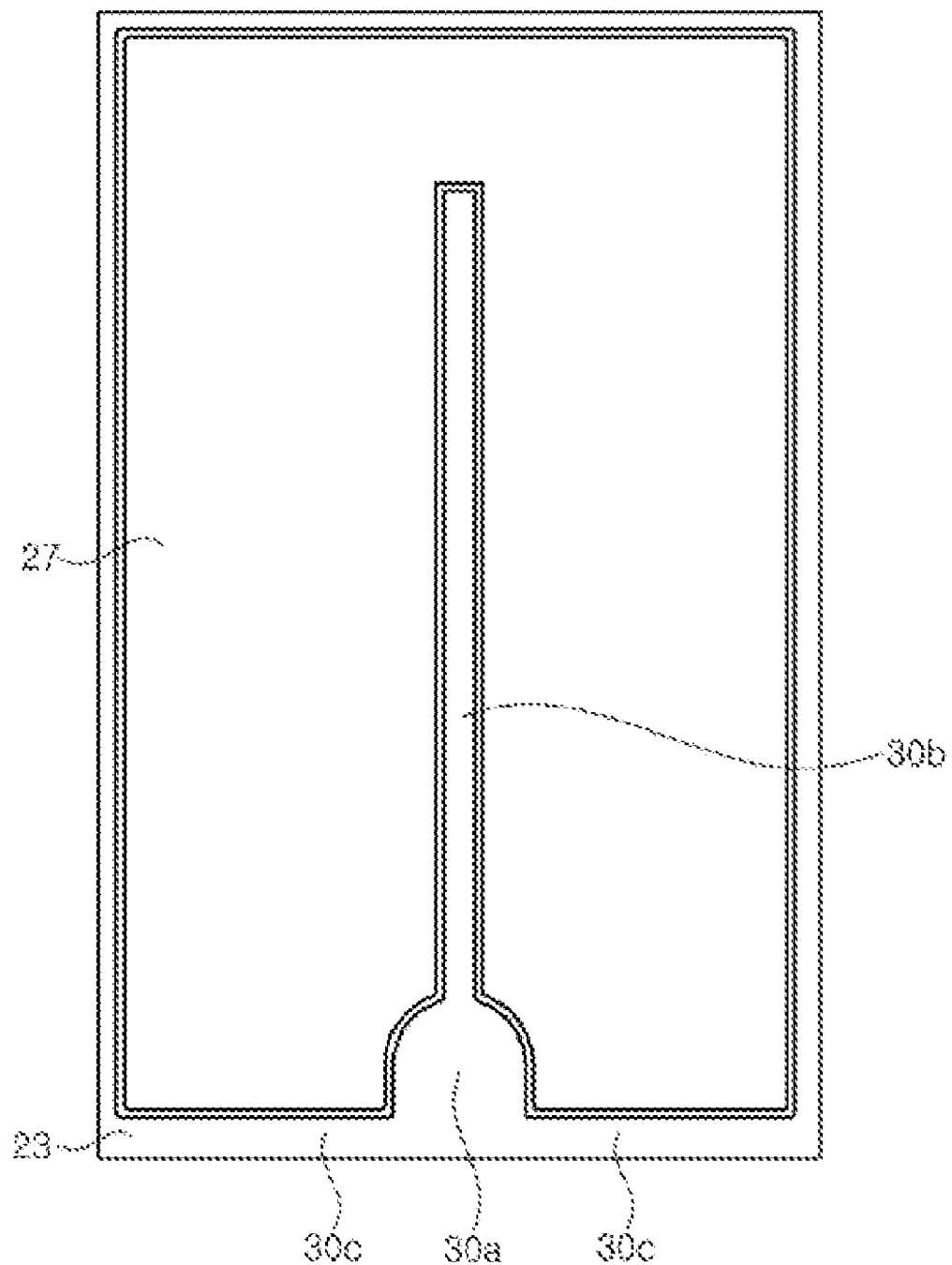
FIGS. 22a, 22b, 22c and 22d are plan views illustrating a method of manufacturing a light emitting diode according to the seventeenth exemplary embodiment of the present invention.
Figure 22B:
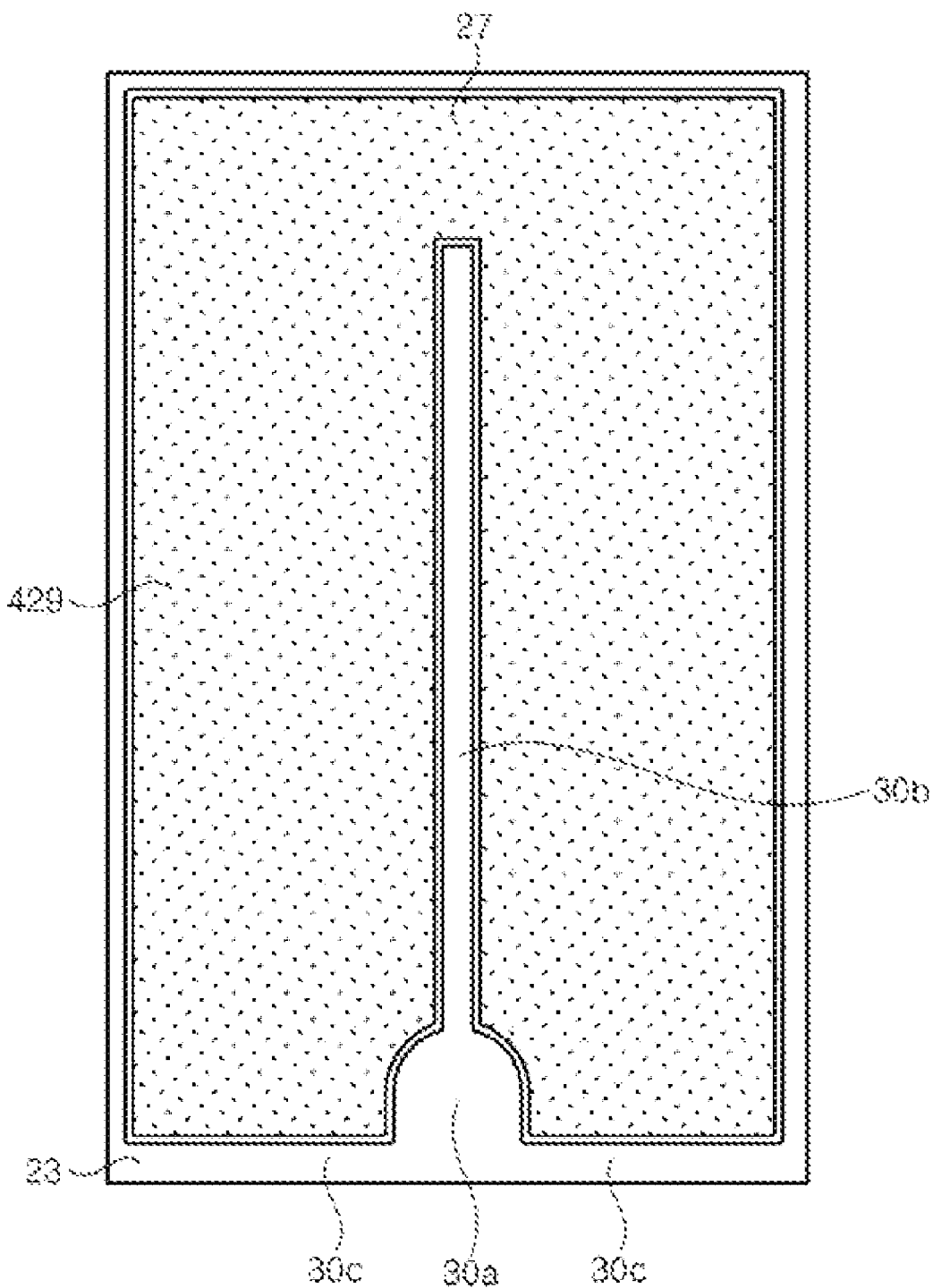

First, referring to FIG. 22a, semiconductor layers including an n-type semiconductor layer 23, active layer 25 and p-type semiconductor layer 27 are formed on a substrate 21. Then, the semiconductor layers are subjected to mesa-etching to expose the n-type semiconductor layer 23. The semiconductor layers may have inclined surfaces, for example, at 30-70 degrees relative to a substrate plane. Here, a region 30a to be formed with a first electrode pad 435, a region 30b to be formed with a first lower extension 435a, and a region 30c to be formed with a second lower extension 435b are exposed on the n-type semiconductor layer 23. The region 30b to be formed with the first lower extension 435a becomes an indented portion 30b which extends inwardly. The indented portion 30b extends inwardly from the region 30a, on which the first electrode pad will be formed, to divide a light emitting region into substantially two light emitting regions. Here, a region of the p-type semiconductor layer and active layer to be formed with the second electrode pad 433 (see FIG. 20) remains instead of being removed by etching.

Referring to FIG. 22b, a transparent electrode layer 429 may be formed on the p-type semiconductor layer 27. The transparent electrode layer 429 may be formed to cover the p-type semiconductor layer 27 on which the second electrode pad 333 will be formed, and may be divided into two regions disposed in a symmetrical structure relative to a line extending along the indented portion 30c. The transparent electrode layer 429 may be formed of ITO or Ni/Au and forms an ohmic contact with the p-type semiconductor layer 27.

Figure 22C:
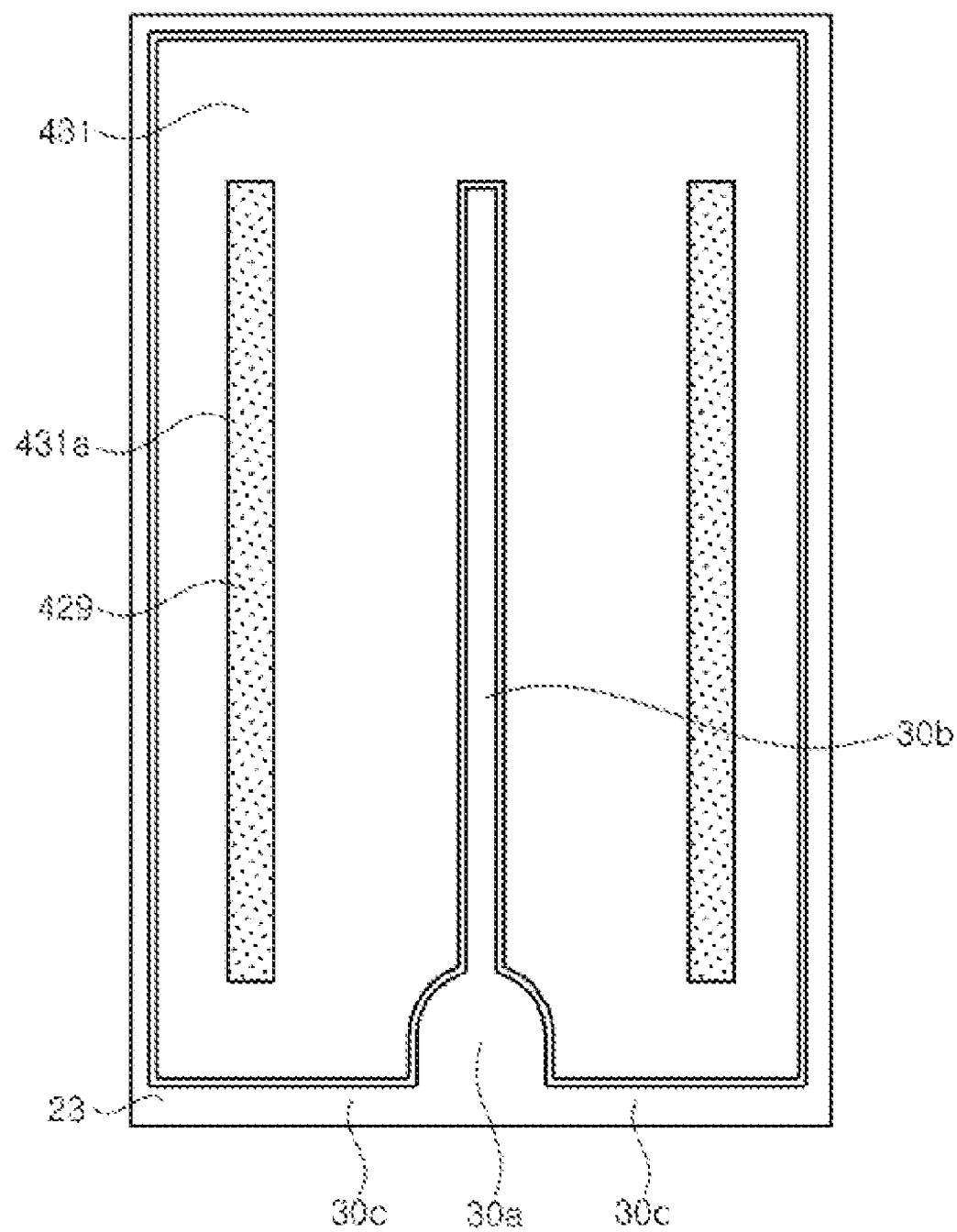

Referring to FIG. 22c, an insulation layer 431 is formed on the transparent electrode layer 429. The insulation layer 431 covers a region of the transparent electrode layer 429 on which the second electrode pad 433 will be formed. Further, the insulation layer 431 may also cover side surfaces of the p-type semiconductor layer 27 and active layer 25, which are exposed by mesa-etching. In addition, the insulation layer 431 is subjected to a patterning process to form openings 431a, which expose the transparent electrode layer 429, via photolithography and etching. The openings 431a exposing the transparent electrode layer 429 may be symmetrically formed parallel to each other. Further, the regions of the n-type semiconductor layer 23, on which the first electrode pad 435, first lower extension 435a and second extension 435b will be respectively formed, are also exposed therethrough.

Figure 22D:
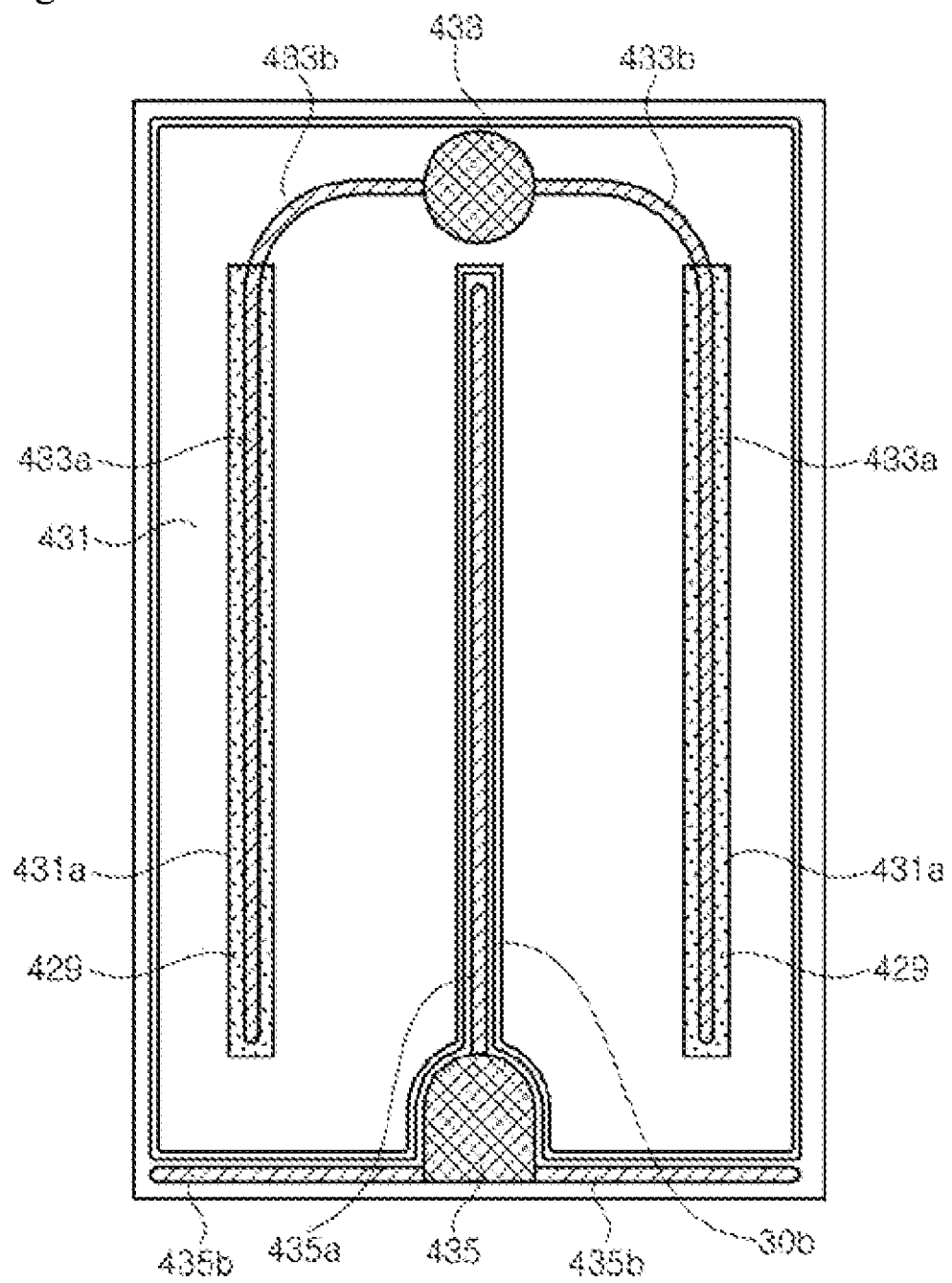

Referring to FIG. 22d, the first electrode pad 435, first lower extension 435a and second extension 435b are formed on the exposed regions of the n-type semiconductor layer 23. Further, a second electrode pad 433 and connectors 433b are formed on the insulation layer 431, and upper extensions 433a are formed in the openings 431a.

The upper extensions 433a may be connected to the transparent electrode layer 429 and be formed parallel to the first lower extension 435a. As a result, a light emitting diode is fabricated, as shown in FIG. 20.

In the present exemplary embodiment, the light emitting structure is substantially divided into the two light emitting regions by the indented portion 30b, but is not limited thereto. The light emitting structure may be divided into more than two light emitting regions. Further, although the transparent electrode layer 429 is formed after mesa-etching in the present exemplary embodiment, the mesa-etching may be carried out after formation of the transparent electrode layer 429.

Unlike the light emitting diode of the thirteenth exemplary embodiment, the light emitting diode of the present exemplary embodiment includes the second electrode pad 433 above the transparent electrode layer 429. This feature may also be applied to the light emitting diodes of the fifteenth and sixteenth exemplary embodiments described with reference to FIGS. 18 and 19, and a detailed description thereof will be omitted herein.

Figure 23:
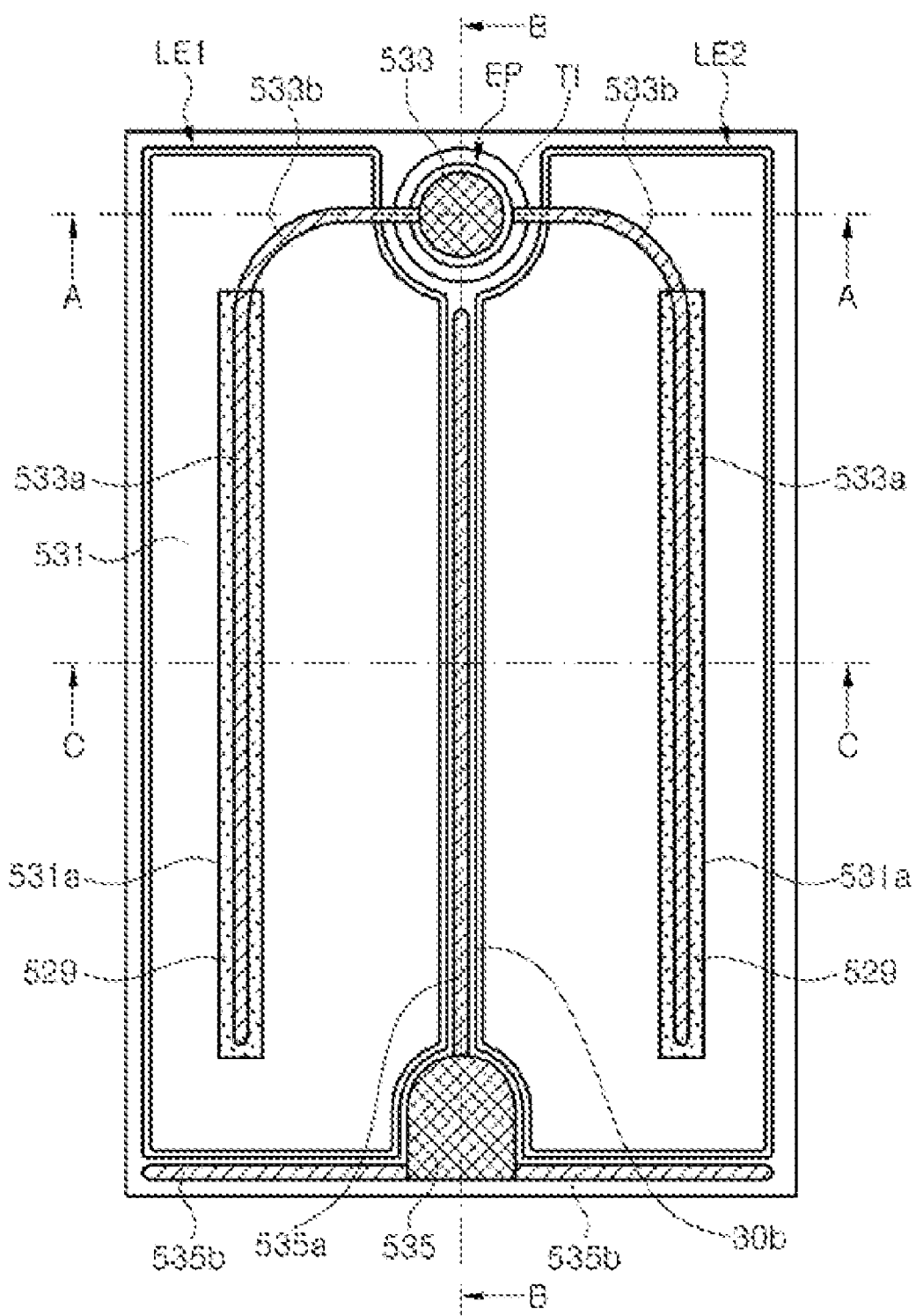
FIG. 23 is a plan view of a light emitting diode according to an eighteenth exemplary embodiment of the present invention.
Figure 24A:
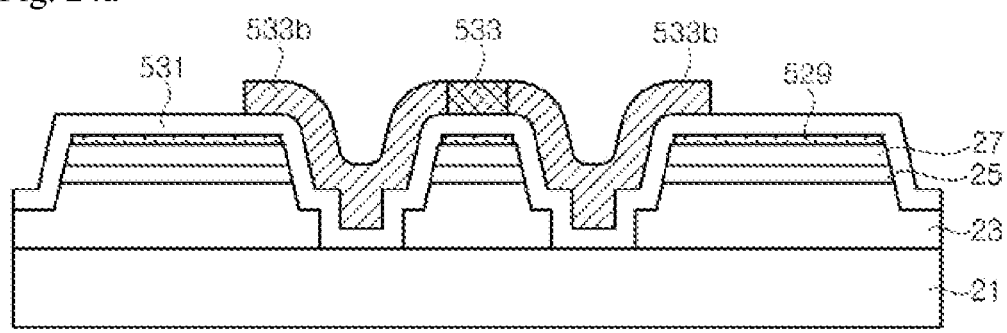
FIGS. 24a, 24b and 24c are cross-sectional views taken along lines A-A, B-B and C-C of FIG. 23, respectively.
Figure 24B:
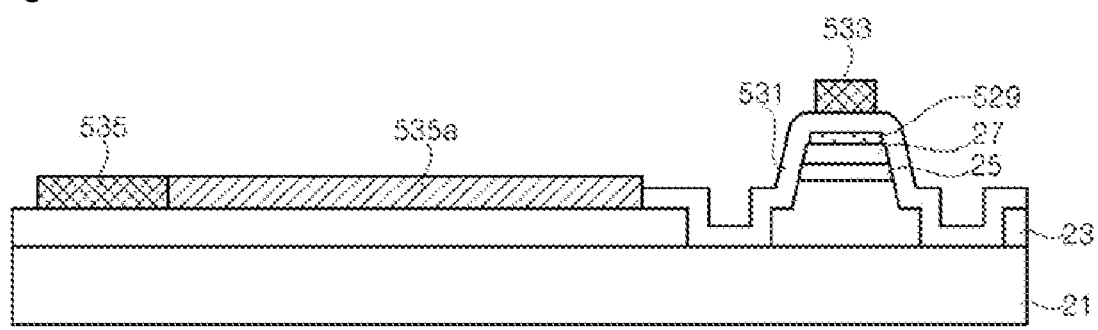
Figure 24C:
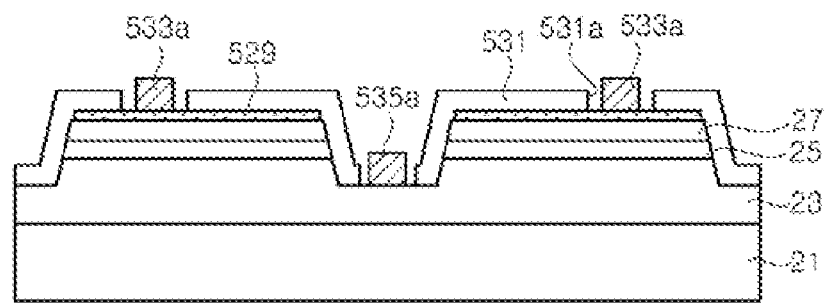

FIG. 23 is a plan view of a light emitting diode according to an eighteenth exemplary embodiment of the present invention, and FIGS. 24a, 24b and 24c are cross-sectional views taken along lines A-A, B-B and C-C of FIG. 23, respectively.

Referring to FIGS. 23, 24a, 24b and 24c, the light emitting diode includes a substrate 21, a light emitting structure including light emitting regions LE1, LE2, an electrode pad region EP isolated from the light emitting structure, a first electrode pad 535, a second electrode pad 533, and upper extensions 533a. Further, the light emitting diode may include a transparent electrode layer 529, an insulation layer 531, connectors 533b, a first lower extension 535a, and a second lower extension 535b. In addition, each of the light emitting structure and the electrode pad region EP includes a first conductive type semiconductor layer 23, an active layer 25, and a second conductive type semiconductor layer 27.

The substrate 21 may be, for example, a sapphire substrate, but is not limited thereto. The emitting structure and the electrode pad region EP are located on the substrate 21.

The first conductive type semiconductor layer 23 is an n-type semiconductor layer and the second conductive type semiconductor layer 27 is a p-type semiconductor layer, or vice versa. The first conductive type semiconductor layer 23, active layer 25 and second conductive type semiconductor layer 27 are the same as those described with reference to FIGS. 14 and 15, and a detailed description thereof will be omitted herein.

The second conductive type semiconductor layer 27 and active layer 25 of the light emitting structure may be divided to define at least two light emitting regions LE1, LE2. The light emitting regions LE1, LE2 may have a symmetrical structure and such a dividing process may be carried out by mesa-etching. Specifically, an indented portion 30b is formed by mesa-etching to divide the second conductive type semiconductor layer 27 and active layer 25 into the two light emitting regions. Further, side surfaces of the light emitting structure subjected to mesa-etching may be inclined at 30-70 degrees relative to a substrate plane relative to a plane of the substrate 21. Further, the first conductive type semiconductor layer 23 of the light emitting regions LE1, LE2 may be shared by the light emitting regions, so that the first conductive type semiconductor layer 23 is exposed between the light emitting regions.

In addition, a transparent electrode layer 529 may be located on the second conductive type semiconductor layer 27 of the light emitting structure. The transparent electrode layer 529 may be formed of ITO or Ni/Au and forms an ohmic contact with the second conductive type semiconductor layer 27.

The electrode pad region EP is isolated from the light emitting structure. Specifically, the first conductive type semiconductor layer 23, active layer 25 and second conductive type semiconductor layer 27 of the electrode pad region EP are separated from the first conductive type semiconductor layer 23, active layer 25 and second conductive type semiconductor layer 27 of the light emitting structure. Accordingly, the electrode pad region EP is electrically insulated from the light emitting structure. The electrode pad region EP may be isolated from the light emitting structure by a trench TI formed in the first conductive type semiconductor layer 23. On the other hand, the transparent electrode layer 529 formed of ITO or Ni/Au may be located on the electrode pad region EP.

An insulation layer 531 may cover the second conductive type semiconductor layer 27 (or the transparent electrode layer 529) of the light emitting structure. The insulation layer 531 may also cover side surfaces of the second conductive type semiconductor layer 27 and active layer 25, which are exposed by mesa-etching. In addition, the insulation layer 531 may have openings 431a which expose the transparent electrode layer 529 on the light emitting regions LE1, LE2. The transparent electrode layer 529 (or the second conductive type semiconductor layer 27) is exposed through the openings 531a. The insulation layer 531 may cover the second conductive type semiconductor layer 27 (or the transparent electrode layer 529) of the electrode pad region EP, and also cover a side surface of the electrode pad region EP. The insulation layer 531 may be formed of any transparent material, for example SiO$_2$, through which light can be transmitted.

The first electrode pad 535 may be located on an exposed region of the first conductive type semiconductor layer 23 of the light emitting structure, and the second electrode pad 533 may be located on the electrode pad region EP. The first electrode pad 535 may be located to face the second electrode pad 533, as shown in the figures. The first and second electrode pads 535, 533 are bonding pads for wire bonding and may have a relatively wide area for wire bonding.

The first electrode pad 535 is electrically connected to the first conductive type semiconductor layer 23. Further, the first lower extension 535a may extend from the first electrode pad 535 towards the second electrode pad 533. The first lower extension 535a is located on the first conductive type semiconductor layer 23 and electrically connected thereto. As shown in the figures, the first lower extension 535a may be located in the indented portion 30b between the light emitting regions LE1, LE2 and has a distal end near the second electrode pad 533. In addition, the second lower extensions 535b may extend from the first electrode pad 535 along an edge of the substrate 21.

The second electrode pad 533 is located on the electrode pad region EP. The second electrode pad 533 may be located on the second conductive type semiconductor layer 27 and the transparent electrode layer 529 and/or the insulation layer 531 may be disposed between the second electrode pad 533 and the second conductive type semiconductor layer 27. When the insulation layer 531 is disposed between the second electrode pad 533 and the second conductive type semiconductor layer 27 (or the transparent electrode layer 529), the second electrode pad may be insulated from the electrode pad region EP.

The upper extensions 533a are located on the light emitting regions LE1, LE2. The upper extensions 533a may be electrically connected to the transparent electrode layer 529 (or the second conductive type semiconductor layer 27) via the openings 531a of the insulation layer 531. The second conductive type semiconductor layer 27 may be exposed through the openings 531a, and the upper extensions 533a may be directly connected to the second conductive type semiconductor layer 27. The upper extensions 533a are disposed to allow uniform current spreading in the second conductive type semiconductor layer 27. For example, the upper extensions 533a may extend parallel to each other. The upper extensions 533a may be connected to the second electrode pad 533 via connectors 533b, respectively. The connectors 533b are insulated from the transparent electrode layer 529 (or the second conductive type semiconductor layer 27) by the insulation layer 531. The connectors 533b are insulated from the side surface of the light emitting structure by the insulation layer 531.

The electrode pads 533, 535, upper extensions 533a, connectors 533b, and first and second lower extensions 535a, 535b may be formed of, but are not limited to, the same material, for example Cr/Au, by the same process. Alternatively, the upper extensions 433a and the second electrode pad 433 may be formed of different materials by different processes.

In the present exemplary embodiment, the light emitting diode has a symmetrical structure relative to a line crossing the first electrode pad 535 and the second electrode pad 533, for example line B-B of FIG. 23. The divided regions of the transparent electrode layer 529 and the upper extensions 533a may be symmetrically disposed, and the second lower extensions 535b may also be symmetrically disposed. Accordingly, the light emitting diode may exhibit the same luminescence characteristics at both sides of the indented portion 30b. As a result, the light emitting structure of the light emitting diode is divided into two light emitting regions, so the light emitting diode can prevent excessive current crowding around a defect such as pin holes or thread dislocations, thereby achieving uniform current spreading.

In the present exemplary embodiment, the first electrode pad 535 is located on the first conductive type semiconductor layer 23. However, if the substrate 21 is conductive, the first electrode pad 535 may be located on the top or bottom surface of the substrate 21. In this case, the second electrode pad 533 is insulated from the electrode pad region EP by the insulation layer 531.

FIGS. 25a, 25b, 25c, 25d and 25e are plan views illustrating a method of manufacturing a light emitting diode according to the eighteenth exemplary embodiment. A method of forming semiconductor layers 23, 25, 27, a transparent electrode layer 529 and an insulation layer 531 is well known in the art and a detailed description thereof will be omitted herein.

Figure 25A:
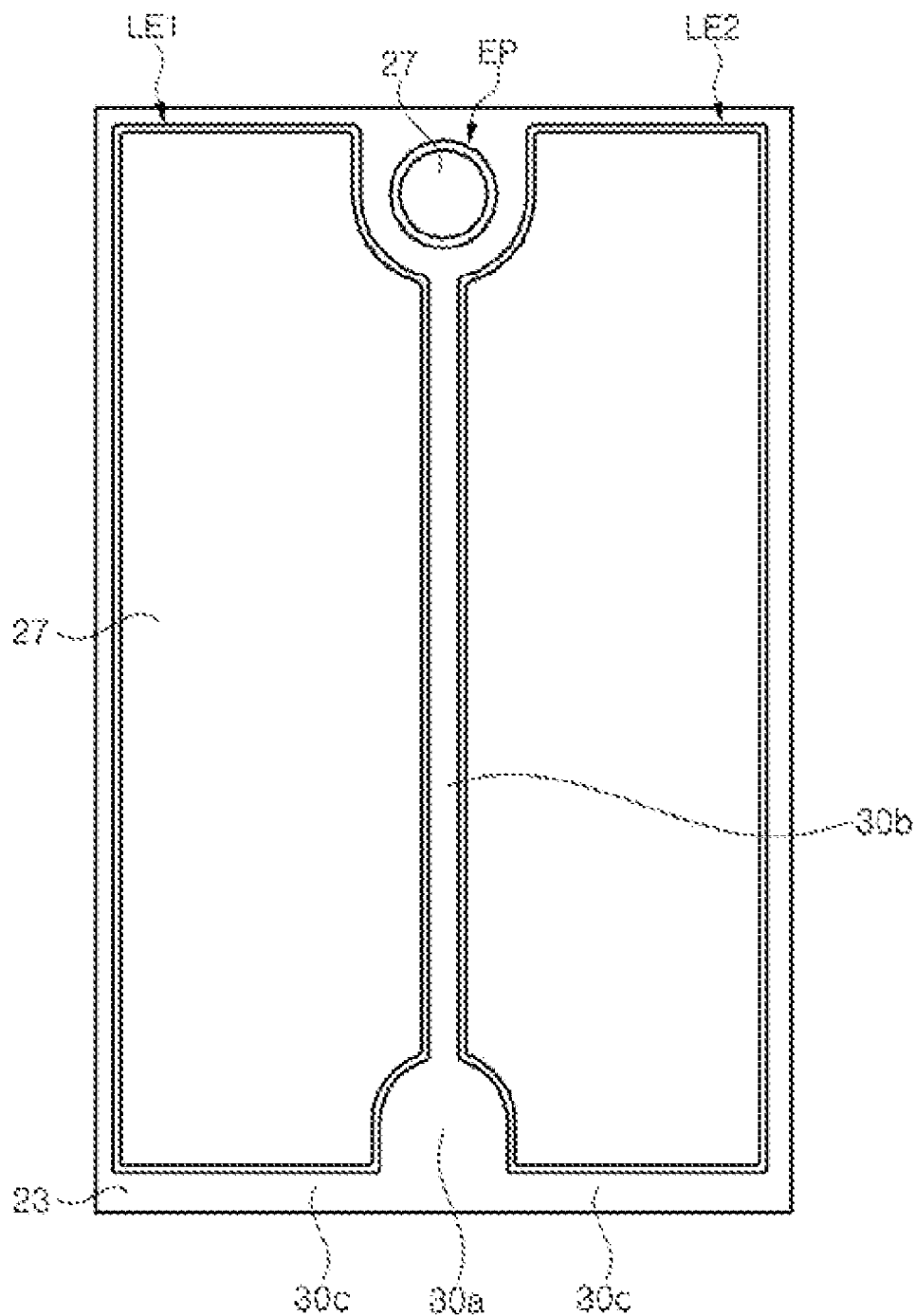
FIGS. 25a, 25b, 25c, 25d and 25e are plan views illustrating a method of manufacturing a light emitting diode according to the eighteenth exemplary embodiment of the present invention.

First, referring to FIG. 25a, semiconductor layers including an n-type semiconductor layer 23, active layer 25 and second conductive type semiconductor layer 27 are formed on a substrate 21. Then, the semiconductor layers are subjected to mesa-etching to expose the first conductive type semiconductor layer 23. The semiconductor layers may have inclined surfaces, for example, at 30-70 degrees relative to a substrate plane. Here, as shown in FIG. 23, a region 30a to be formed with a first electrode pad 535, a region 30b to be formed with a first lower extension 535a, and a region 30c to be formed with a second lower extension 535b are exposed on the first conductive type semiconductor layer 23. The region 30b to be formed with the first lower extension 535a becomes an indented portion 30b which extends inwardly. The indented portion 30b extends inwardly from the region 30a, on which the first electrode pad will be formed. Here, the first conductive type semiconductor layer 23 in the electrode pad region EP is exposed by mesa-etching, and the second conductive type semiconductor layer 27 and active layer 23 remain instead of being removed by etching. Accordingly, the second conductive type semiconductor layer 27 and active layer 23 are divided to define two light emitting regions LE1, LE2 and the electrode pad region EP is defined by the mesa-etching.

Figure 25B:
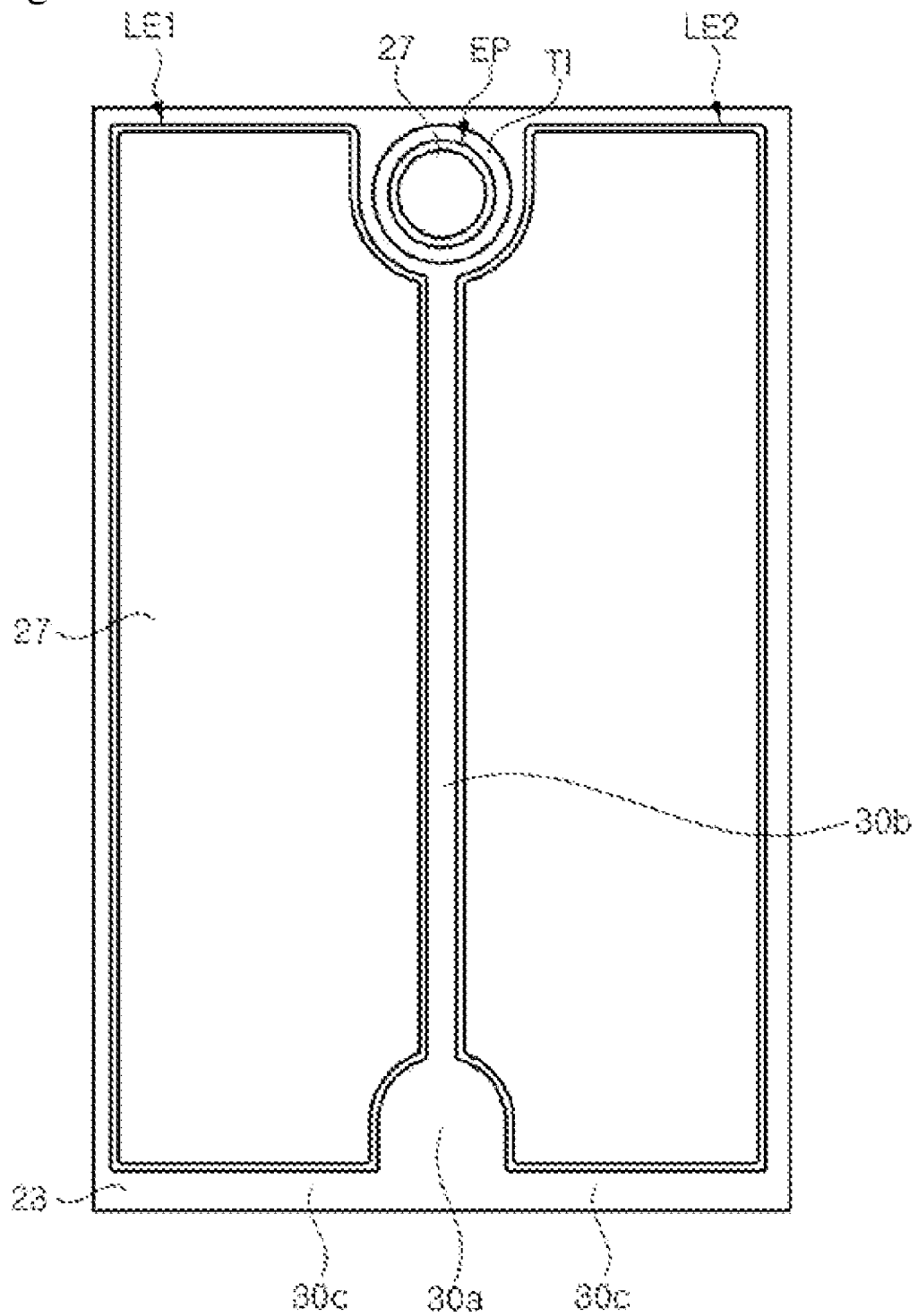

Referring to FIG. 25b, a trench TI is formed around the electrode pad region EP by etching the first conductive type semiconductor layer 23. The electrode pad region EP is isolated in an island shape from the first conductive type semiconductor layer 23 of the light emitting structure, which includes the light emitting regions LE1, LE2, by the trench TI.

Figure 25C:
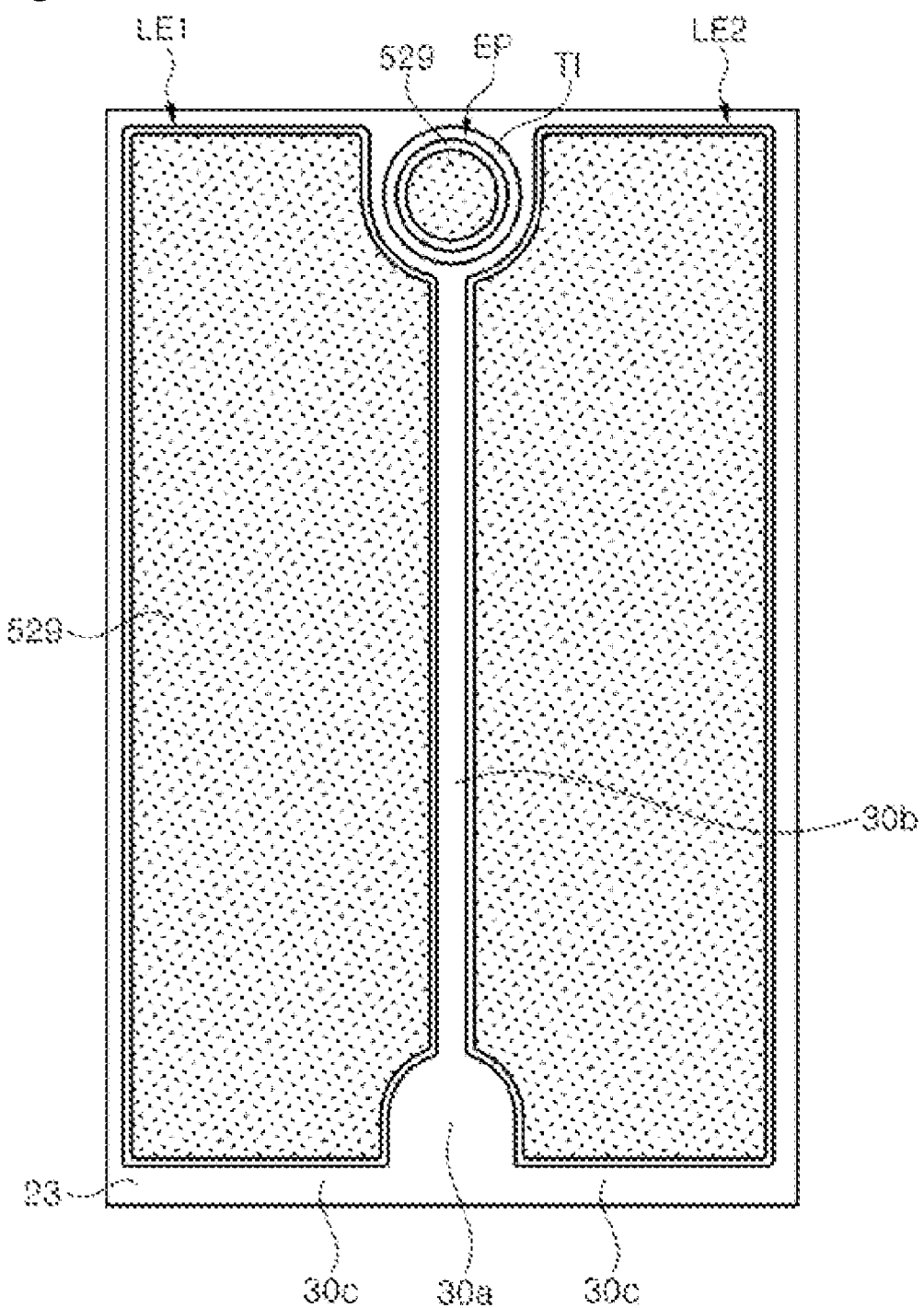

Referring to FIG. 25c, a transparent electrode layer 529 may be formed on the second conductive type semiconductor layer 27 of the light emitting regions LE1, LE2. The transparent electrode layer 529 may also be formed on the electrode pad region EP. The transparent electrode layer 529 may have a symmetrical structure relative to an imaginary line extending along the indented portion 30c. The transparent electrode layer 529 may be formed of ITO or Ni/Au and forms an ohmic contact with the second conductive type semiconductor layer 27.

Figure 25D:
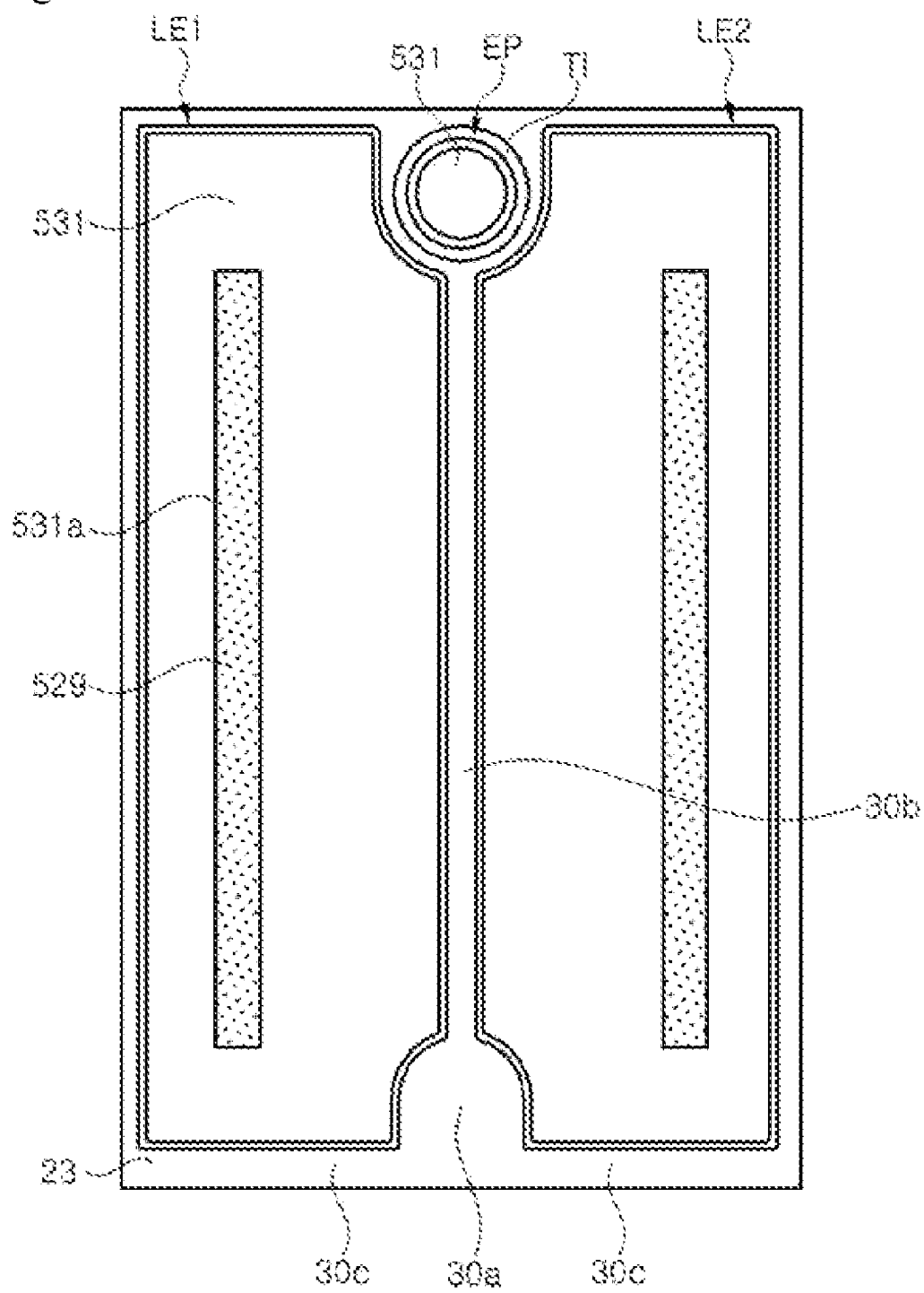

Referring to FIG. 25d, an insulation layer 531 is formed on the light emitting structure. The insulation layer 531 covers the transparent electrode layer 529 of the light emitting structure and the transparent electrode layer 529 on the electrode pad region EP. Further, the insulation layer 531 may also cover side surfaces of the second conductive type semiconductor layer 27 and active layer 25, which are exposed by mesa-etching. In addition, the insulation layer 531 is subjected to a patterning process to form openings 531a, which expose the transparent electrode layer 529 on light emitting regions LE1, LE2, via photolithography and etching. The openings 531a exposing the transparent electrode layer 529 may be symmetrically formed parallel to each other. Further, the regions of the first conductive type semiconductor layer 23, on which the first electrode pad 535, first lower extension 535a and second extension 535b will be respectively formed, are also exposed therethrough.

Figure 25E:
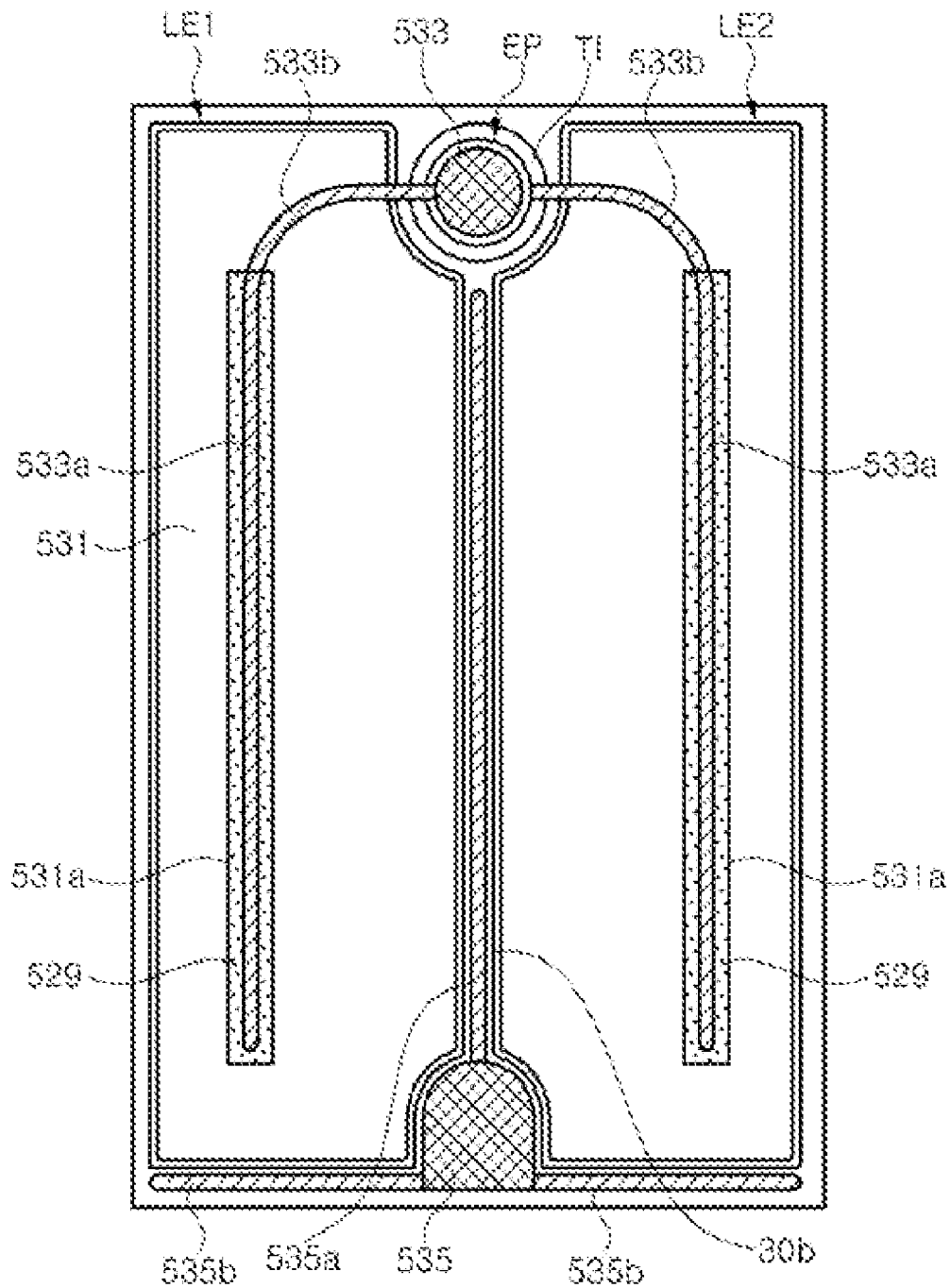

Referring to FIG. 25e, the first electrode pad 535, first lower extension 535a and second extension 535b are formed on the exposed regions of the first conductive type semiconductor layer 23 of the light emitting structure. Further, a second electrode pad 533 is formed on the electrode pad region EP, and upper extensions 533a are formed in the openings 531a. Further, connectors 533b are formed to connect the second electrode pad 533 to the upper extensions 533a.

The upper extensions 533a may be connected to the transparent electrode layer 529 and be formed parallel to the first lower extension 535a. As a result, a light emitting diode is fabricated as shown in FIG. 23.

In the present exemplary embodiment, the light emitting structure is divided into the two light emitting regions LE1, LE2, but is not limited thereto. The light emitting structure may be divided into more than two light emitting regions. Further, although the transparent electrode layer 529 is formed after mesa-etching in the present exemplary embodiment, the mesa-etching may be carried out after formation of the transparent electrode layer 529. Moreover, although the trench TI is formed after mesa-etching in the present exemplary embodiment, the mesa-etching may be carried out after formation of the trench TI.

Figure 26:
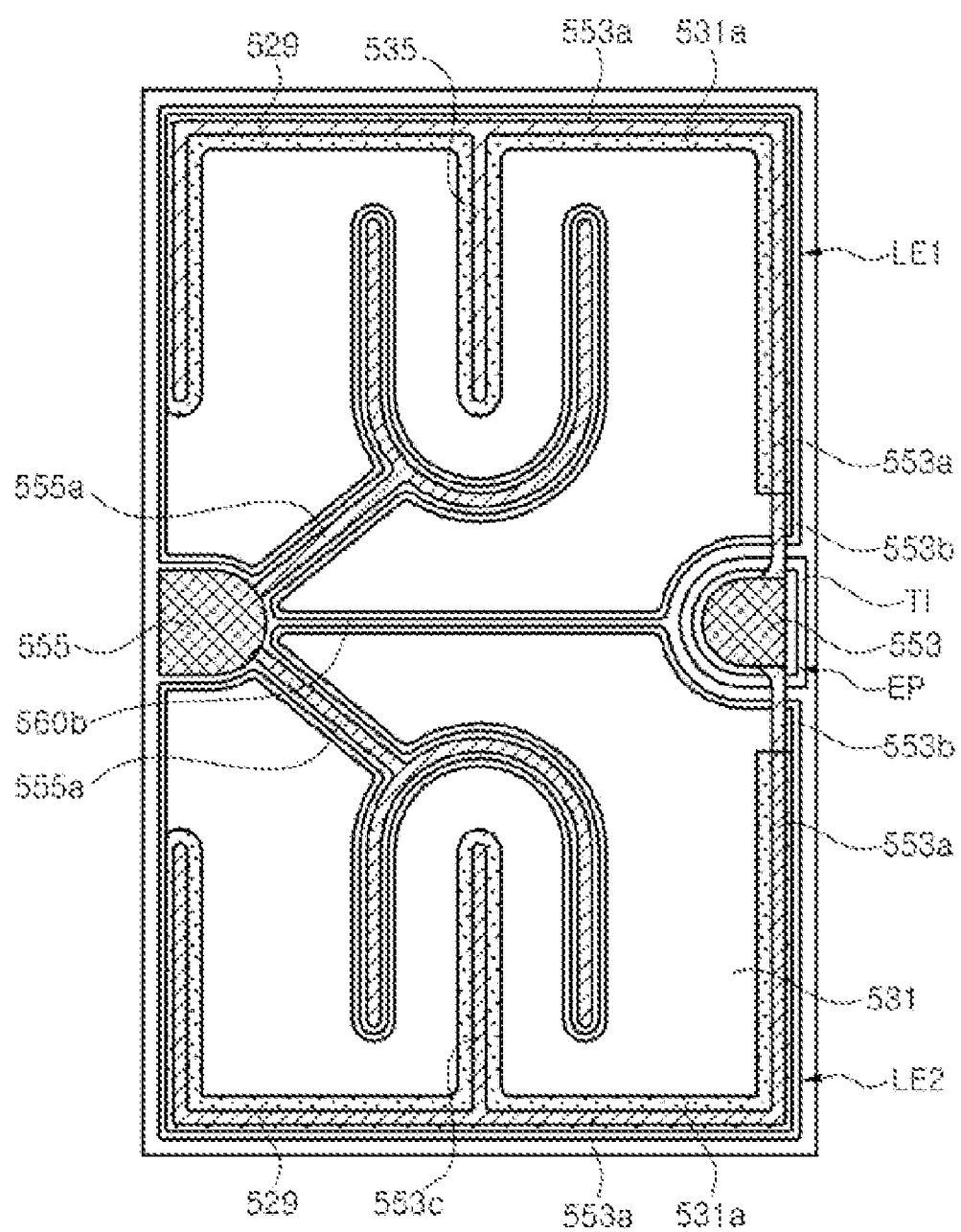
FIG. 26 is a plan view of a light emitting diode according to a nineteenth exemplary embodiment of the present invention.

FIG. 26 is a plan view of a light emitting diode according to a nineteenth exemplary embodiment of the present invention.

In the above exemplary embodiment of FIG. 23, the first and second electrode pads 535, 533 are disposed in a major axis direction of the light emitting diode, and the indented portion 30b is formed in the major axis direction of the light emitting diode. In the present exemplary embodiment, however, the first and second electrode pads 535, 533 are disposed in a minor axis direction of the light emitting diode, and an indented portion 560b is formed in the minor axis direction of the light emitting diode. Further, the transparent electrode layers 529, upper extensions 553a and lower extensions 555a are also symmetrically disposed.

Here, the upper extensions 553a extend along an edge of the light emitting diode to surround the light emitting diode and include extensions 553b extending inwardly from the edge of the light emitting diode. Lower extensions 555a extend outwardly from the interior of the light emitting diode. Further, the lower extensions 555a may be bifurcated to surround the extensions 553b in associated light emitting regions, respectively.

The upper extensions 553a are connected to the transparent electrode layer 529 on the light emitting regions LE1, LE2 through openings 531a of the insulation layer 531, and connected to the second electrode pad 553 through the connectors 553b. The connectors 553b are insulated from the transparent electrode layer 529 by the insulation layer 531.

As described with reference to FIG. 23, the electrode pad region EP is isolated from the light emitting structure by the trench TI.

In the present exemplary embodiment, the light emitting diode omits the first lower extension 535a (see FIG. 23), which extends from the first electrode pad 555 towards the second electrode pad 553.

Figure 27:
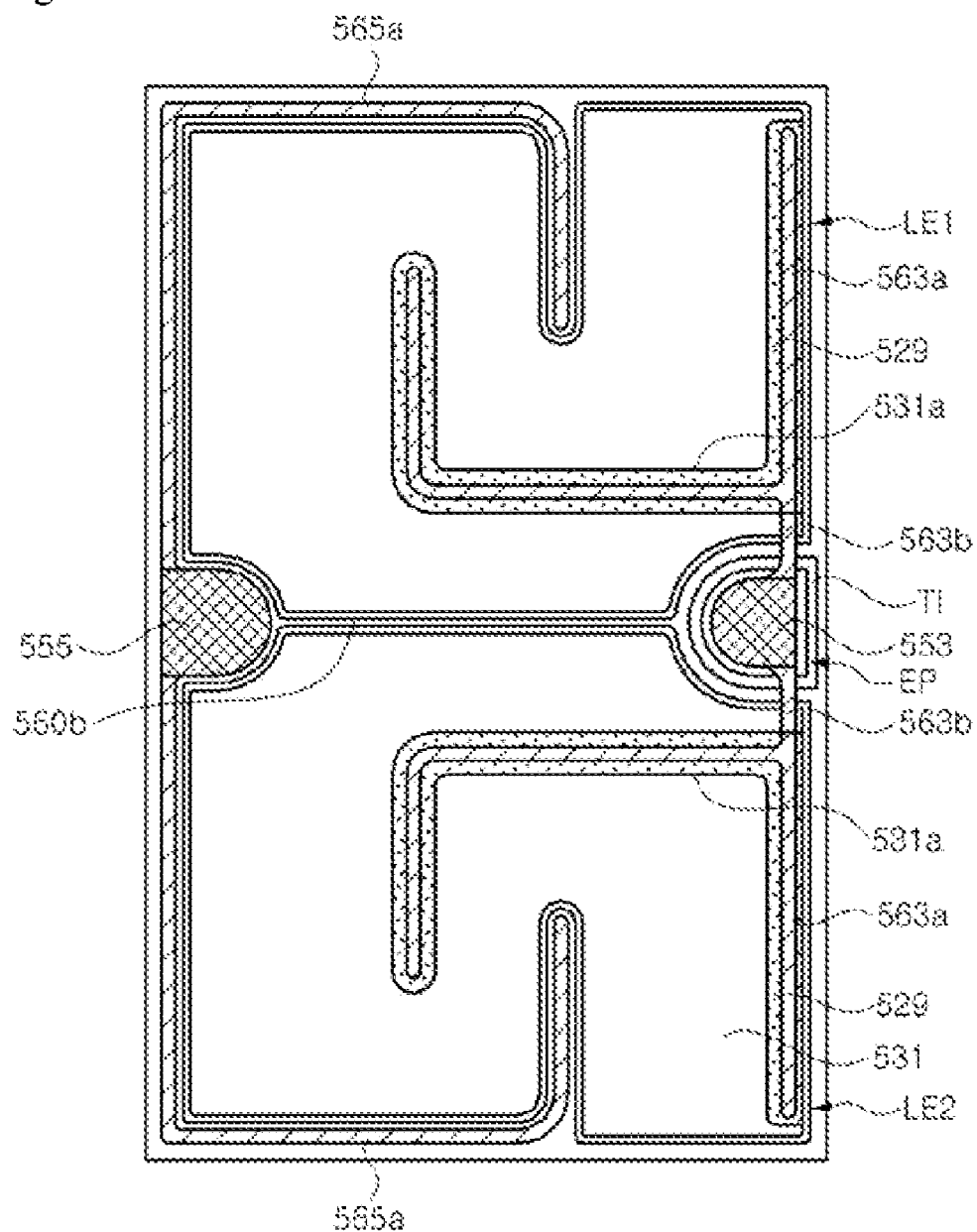
FIG. 27 is a plan view of a light emitting diode according to a twentieth exemplary embodiment of the present invention.

FIG. 27 is a plan view of a light emitting diode according to a twentieth exemplary embodiment of the present invention.

Referring to FIG. 27, the light emitting diode of the present exemplary embodiment is generally similar to the light emitting diode described with reference to FIG. 26. In the light emitting diode of the present exemplary embodiment, however, lower extensions 565a and upper extensions 563a are arranged in a different manner than in the above exemplary embodiment.

Specifically, the lower extensions 565a extend along an edge of the light emitting diode and are bent to extend inwardly, and the upper extensions 563a include two extensions on each of divided regions of the transparent electrode layer 529, which surround each of the lower extensions 565a extending inwardly.

The upper extensions 563a are connected to the transparent electrode layer 529 on light emitting regions LE1, LE2 through openings 531a of an insulation layer 531, and are connected to the second electrode pad 553 through connectors 563b. The connectors 563b are insulated from the light emitting structure by the insulation layer 531

Figure 28:
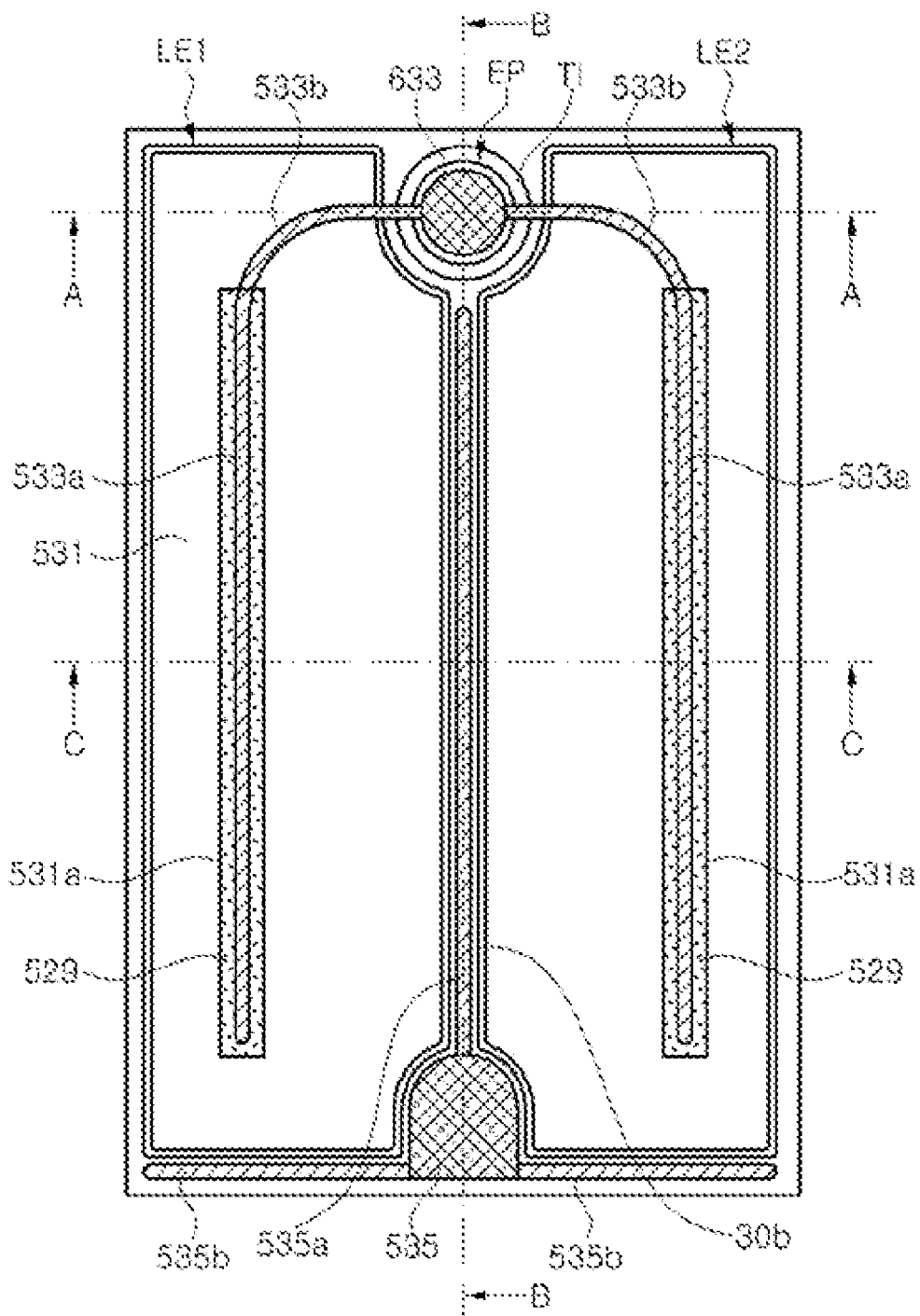
FIG. 28 is a plan view of a light emitting diode according to a twenty-first exemplary embodiment of the present invention.
Figure 29A:
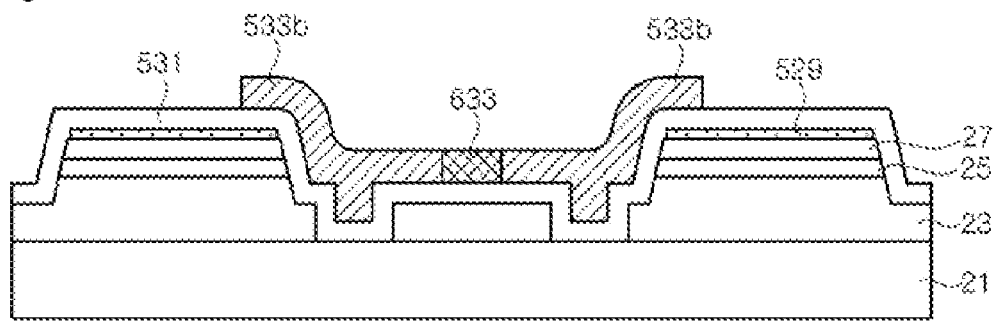
FIGS. 29a, 29b and 29c are cross-sectional views taken along lines A-A, B-B and C-C of FIG. 28, respectively.
Figure 29B:
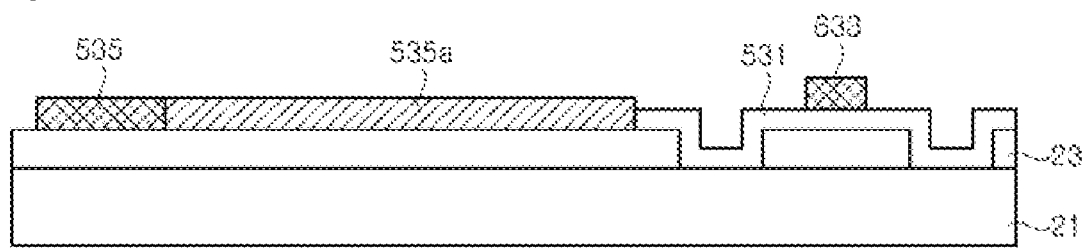
Figure 29C:
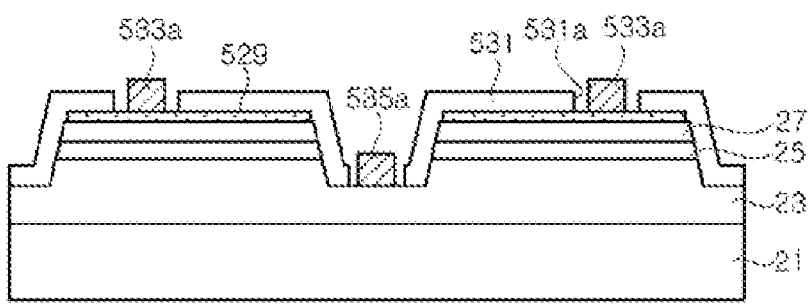

FIG. 28 is a plan view of a light emitting diode according to a twenty-first exemplary embodiment of the present invention, and FIGS. 29a, 29b and 29c are cross-sectional views taken along lines A-A, B-B and C-C of FIG. 28, respectively.

Referring to FIGS. 28, 29a, 29b and 29c, the light emitting diode of the present exemplary embodiment is generally similar to the light emitting diode described with reference to FIGS. 23 and 24. In the light emitting diode of the present exemplary embodiment, however, a second electrode pad 633 is located on an isolated electrode pad region EP of a first conductive type semiconductor layer 23. The same components as those of the above exemplary embodiments will be omitted for clarity.

In the present exemplary embodiment, a light emitting structure and the electrode pad region EP are located on the substrate 21, and the electrode pad region EP includes the first conductive type semiconductor layer 23.

The electrode pad region EP is isolated from the light emitting structure. Specifically, the first conductive type semiconductor layer 23 in the electrode pad region EP is separated from the first conductive type semiconductor layer 23 of the light emitting structure. Accordingly, the electrode pad region EP is electrically insulated from the light emitting structure. The electrode pad region EP may be isolated from the light emitting structure by a trench TI formed in the first conductive type semiconductor layer 23 in the electrode pad region EP. An insulation layer 531 may cover the first conductive type semiconductor layer 23 of the electrode pad region EP and may also cover the electrode pad region EP.

A second electrode pad 633 is located on the electrode pad region EP. The second electrode pad 633 may be located on the first conductive type semiconductor layer 23 and the insulation layer 531 may be disposed between the second electrode pad 633 and the first conductive type semiconductor layer 23. When the insulation layer 531 is disposed between the second electrode pad 633 and the first conductive type semiconductor layer 23, the second electrode pad may be electrically insulated from the electrode pad region EP.

FIGS. 30a, 30b, 30c, 30d and 30e are plan views illustrating a method of manufacturing a light emitting diode according to the twenty-first exemplary embodiment. Methods of forming semiconductor layers 23, 25, 27, a transparent electrode layer 29 and an insulation layer 31 are well known in the art and a detailed description thereof will be omitted herein. Any process, known now or not yet known, that can form semiconductor layers 23, 25, 27, a transparent electrode layer 329 and an insulation layer 331, can be used to manufacture the light emitting diode.

Figure 30A:
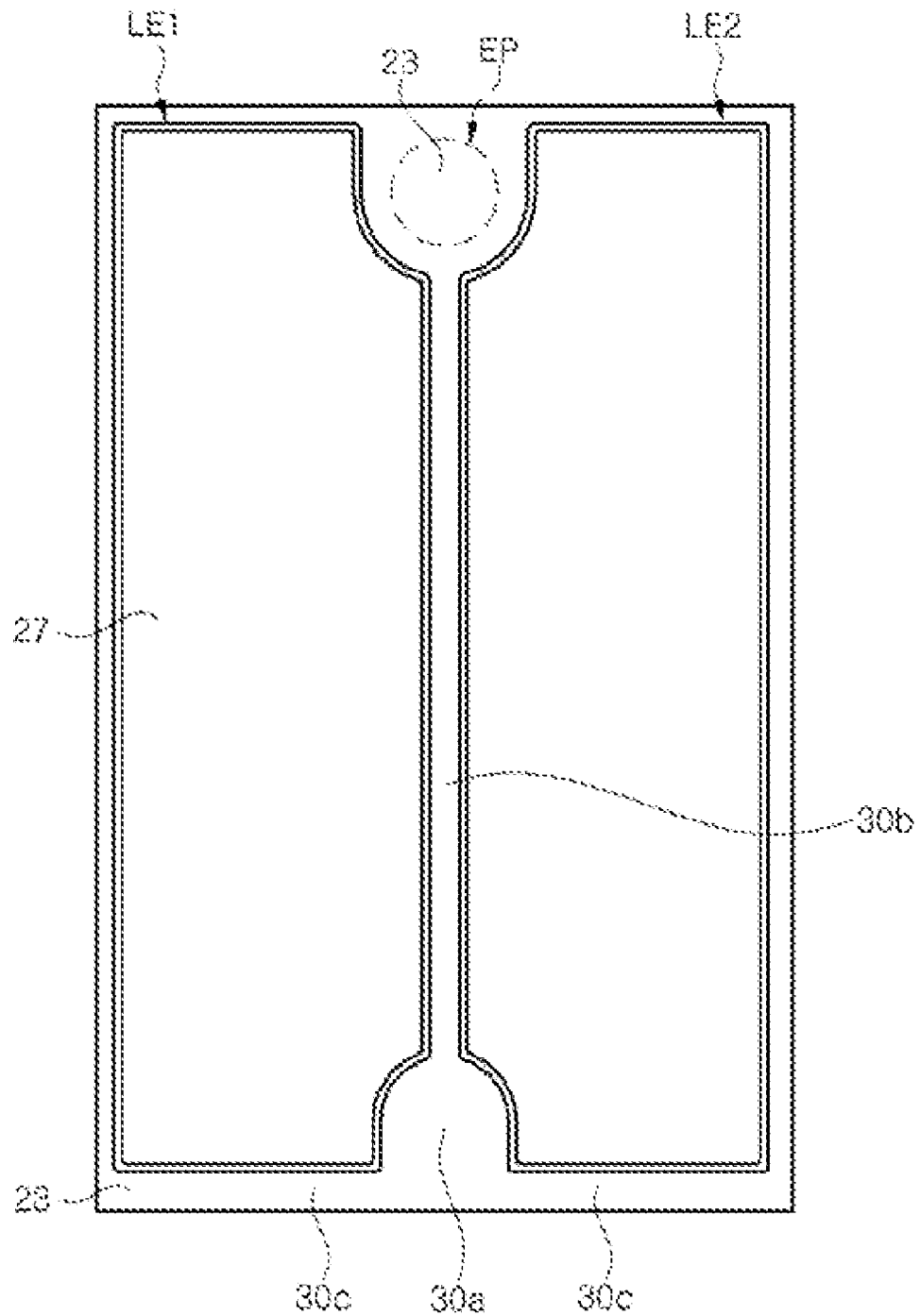
FIGS. 30a, 30b, 30c, 30d and 30e are plan views illustrating a method of manufacturing a light emitting diode according to the twenty-first exemplary embodiment of the present invention.

First, referring to FIG. 30a, semiconductor layers including an n-type semiconductor layer 23, active layer 25 and second conductive type semiconductor layer 27 are formed on a substrate 21. Then, the semiconductor layers are subjected to mesa-etching to expose the first conductive type semiconductor layer 23. The semiconductor layers may have inclined surfaces, for example, at 30-70 degrees relative to a substrate plane. Here, as shown in FIG. 28, a region 30a to be formed with a first electrode pad 535, a region 30b to be formed with a first lower extension 535a, and a region 30c to be formed with a second lower extension 535b are exposed on the first conductive type semiconductor layer 23. The region 30b to be formed with the first lower extension 535a becomes an indented portion 30b which extends inwardly. The indented portion 30b extends inwardly from the region 30a, on which the first electrode pad will be formed. Here, the first conductive type semiconductor layer 23 of the electrode pad region EP is exposed by mesa-etching. Accordingly, the second conductive type semiconductor layer 27 and active layer 23 are divided to define two light emitting regions LE1, LE2 by the mesa-etching.

Figure 30B:
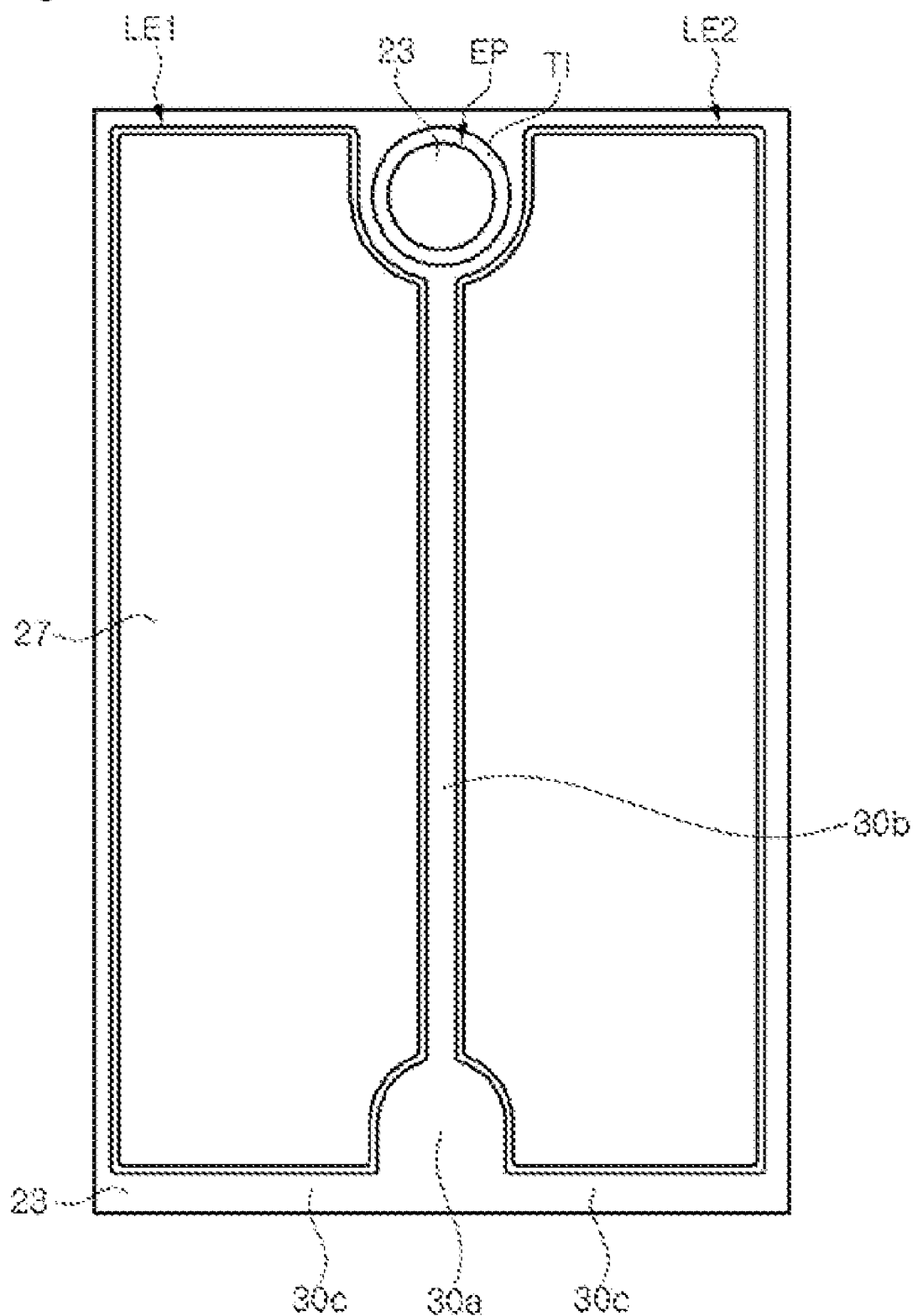

Referring to FIG. 30b, a trench TI is formed around the electrode pad region EP by etching the first conductive type semiconductor layer 23. The electrode pad region EP is isolated in an island shape from the first conductive type semiconductor layer 23 of the light emitting structure, which includes the light emitting regions LE1, LE2, by the trench TI.

Figure 30C:
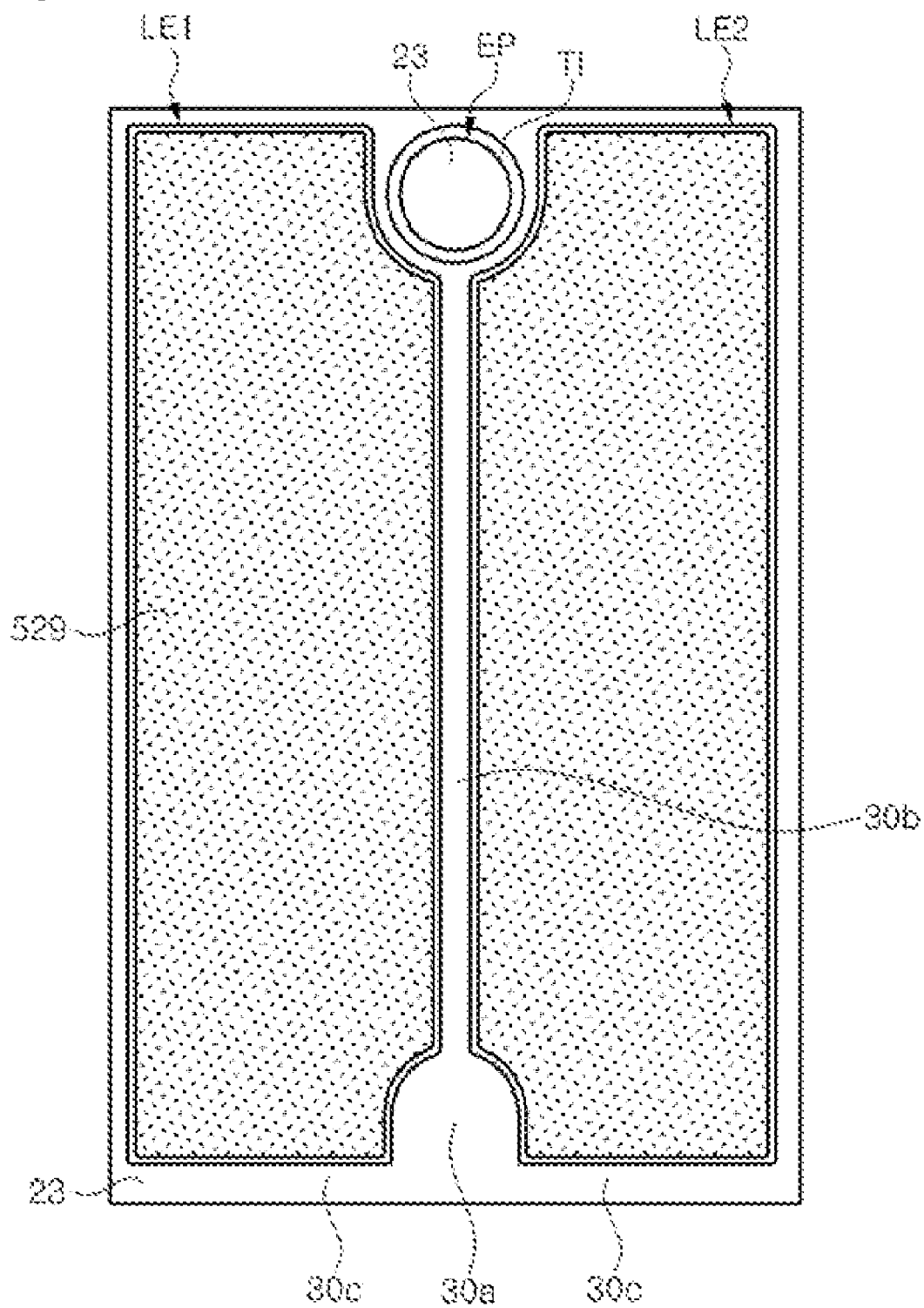

Referring to FIG. 30c, a transparent electrode layer 529 may be formed on the second conductive type semiconductor layer 27 of the light emitting regions LE1, LE2. The transparent electrode layer 529 may have a symmetrical structure relative to an imaginary line extending along the indented portion 30c. The transparent electrode layer 529 may be formed of ITO or Ni/Au and forms an ohmic contact with the second conductive type semiconductor layer 27.

Figure 30D:
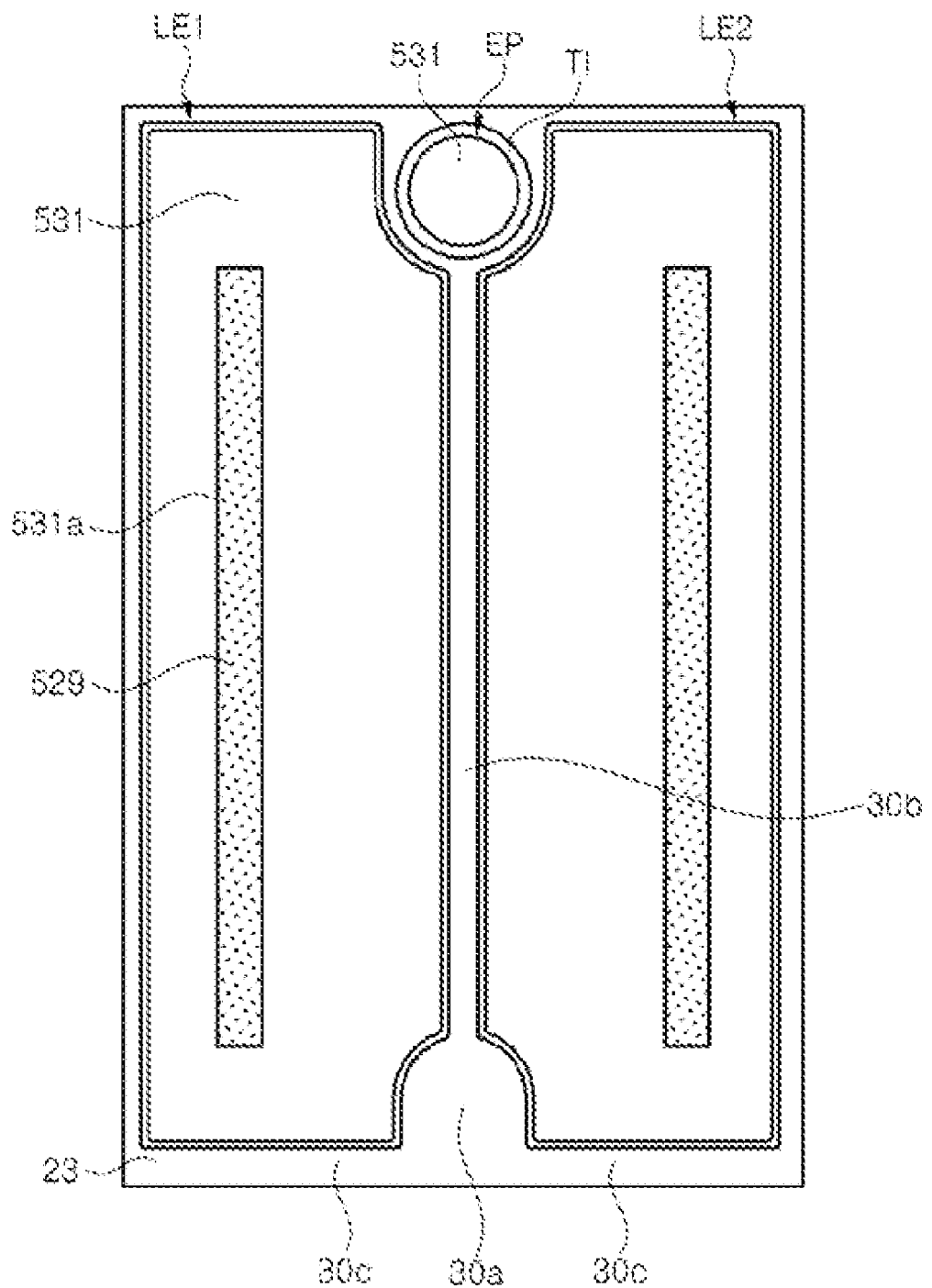

Referring to FIG. 30d, an insulation layer 531 is formed on the light emitting structure. The insulation layer 531 covers the transparent electrode layer 529 of the light emitting structure and the first conductive type semiconductor layer 23 on the electrode pad region EP. The insulation layer 531 may also cover side surfaces of the second conductive type semiconductor layer 27 and active layer 25, which are exposed by mesa-etching. In addition, the insulation layer 531 is subjected to a patterning process to form openings 531a, which expose the transparent electrode layer 529 on light emitting regions LE1, LE2, via photolithography and etching. The openings 531a exposing the transparent electrode layer 529 may be symmetrically formed parallel to each other. Further, the regions 30a, 30b, 30c of the first conductive type semiconductor layer 23, on which the first electrode pad 535, first lower extension 535a and second extension 535b will be respectively formed, are also exposed therethrough.

Figure 30E:
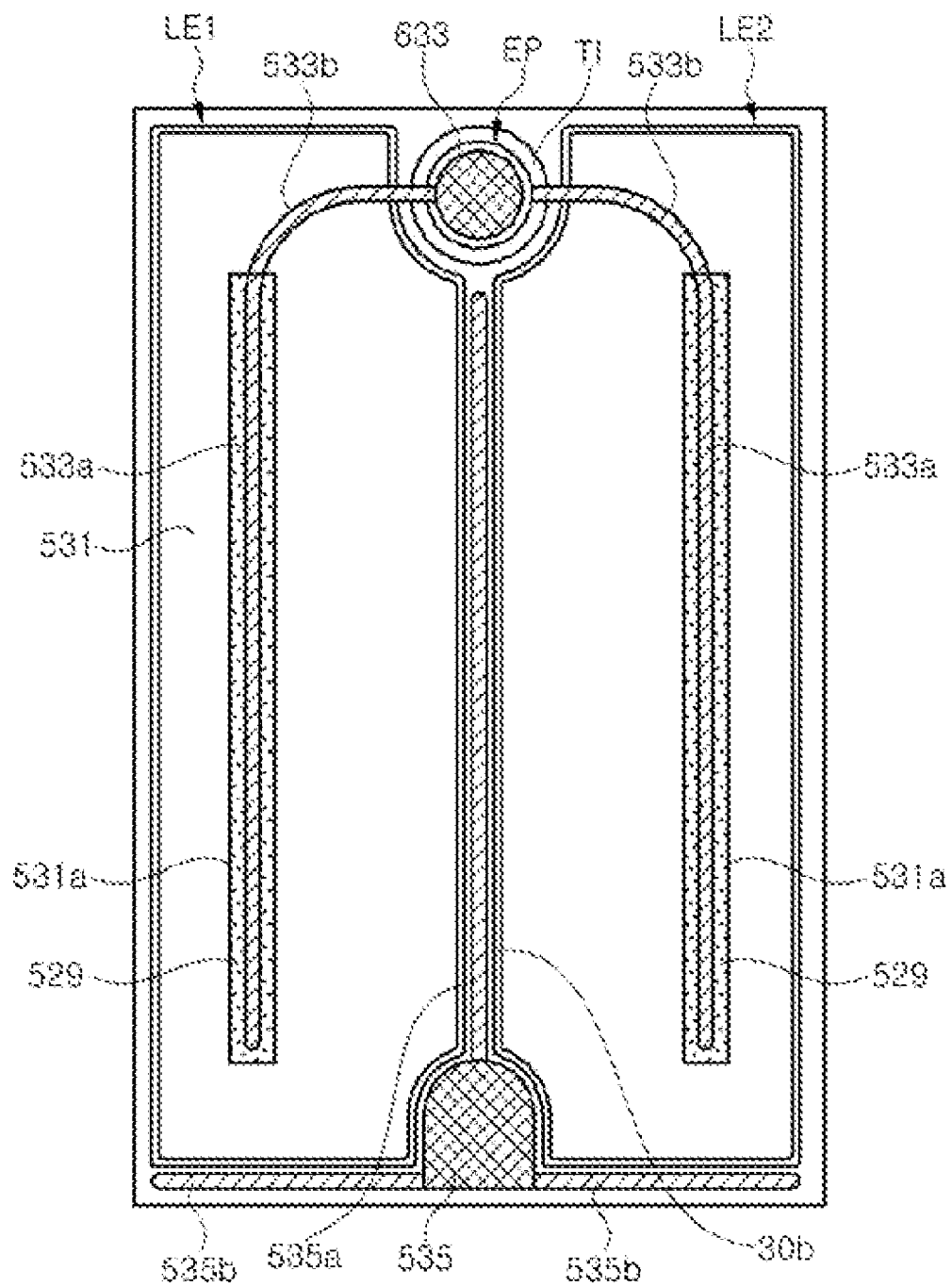

Referring to FIG. 30e, the first electrode pad 535, first lower extension 535a and second extension 535b are formed on the exposed regions of the first conductive type semiconductor layer 23 of the light emitting structure. Further, a second electrode pad 633 is formed on the electrode pad region EP, and upper extensions 533a are formed on the openings 531a. Further, connectors 533b are formed to connect the second electrode pad 633 to the upper extensions 533a.

The upper extensions 533a may be connected to the transparent electrode layer 529 and be formed parallel to the first lower extension 535a. As a result, a light emitting diode is fabricated as shown in FIG. 28.

As compared with the light emitting diode of the exemplary embodiment shown in FIGS. 24 and 25, the electrode pad region EP of the present exemplary embodiment isolated from the light emitting structure is formed in the first conductive type semiconductor layer 23. Accordingly, the second electrode pad 633 is located on the first conductive type semiconductor layer 23 or on the insulation layer 531 of the first conductive type semiconductor layer. The feature of forming the electrode pad region EP using the first conductive type semiconductor layer 23 may also be applied to the light emitting diodes described with reference to FIGS. 26 and 27.

Figure 31:
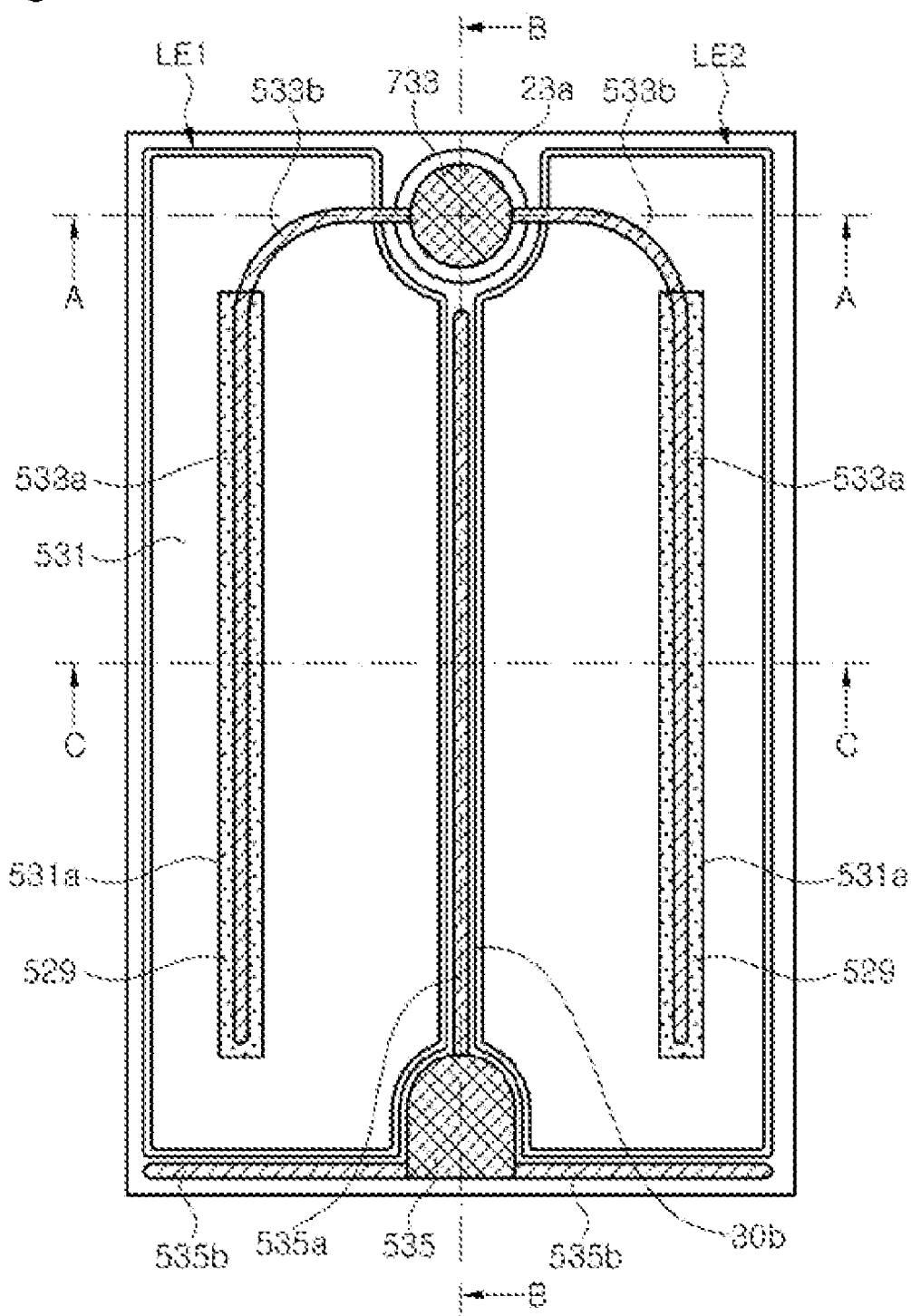
FIG. 31 is a plan view of a light emitting diode according to a twenty-second exemplary embodiment of the present invention.
Figure 32A:
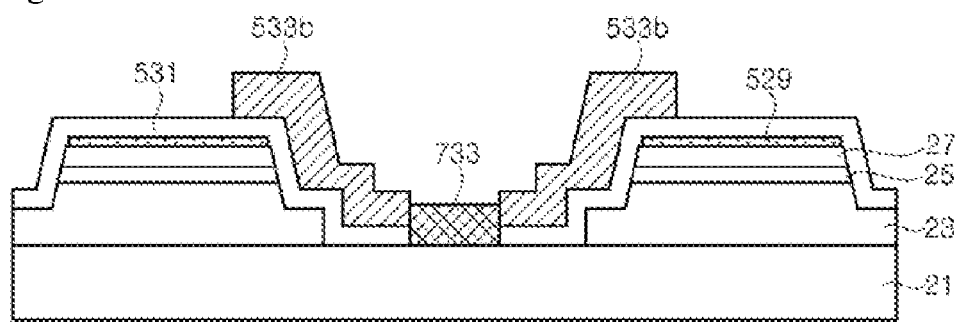
FIGS. 32a, 32b and 32c are cross-sectional views taken along lines A-A, B-B and C-C of FIG. 31, respectively.
Figure 32B:
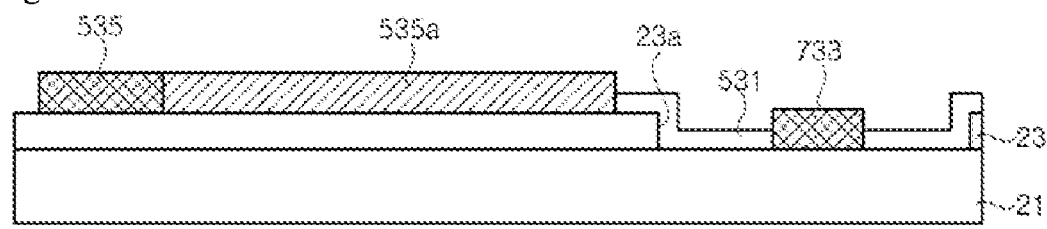
Figure 32C:
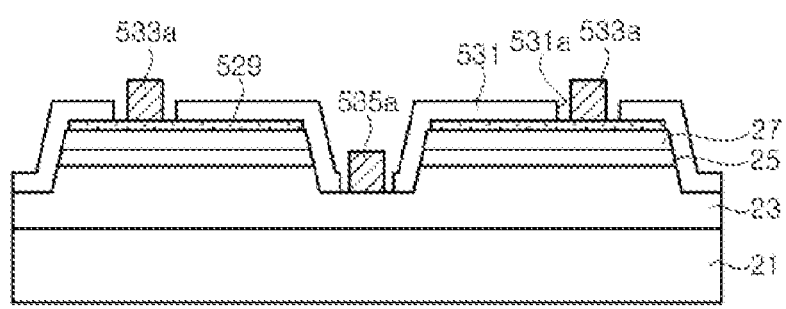

FIG. 31 is a plan view of a light emitting diode according to a twenty-second exemplary embodiment of the present invention, and FIGS. 32a, 32b and 32c are cross-sectional views taken along lines A-A, B-B and C-C of FIG. 31, respectively.

Referring to FIGS. 31, 32a, 32b and 32c, the light emitting diode of the present exemplary embodiment is similar to the light emitting diode described with reference to FIGS. 23 and 24. In the light emitting diode of the present exemplary embodiment, however, a second electrode pad 733 is located on an electrode pad region EP on a substrate 21. Description of the same components as those described in the above exemplary embodiments will be omitted.

In the present exemplary embodiment, the substrate 21 is a dielectric substrate, such as a sapphire substrate. The second electrode pad 733 is located on the substrate 21 to be in contact with the substrate 21 and may be isolated from a light emitting structure. Specifically, the second electrode pad 733 is separated from a first conductive type semiconductor layer 23 of the light emitting structure. The second electrode pad 733 is in contact with the substrate 21 through a hole 23a formed by etching the first conductive type semiconductor layer 23.

In the present exemplary embodiment, the second electrode pad 733 is described as being in contact with the substrate 21. Alternatively, an insulation layer 531 may be disposed between the second electrode pad 733 and the substrate 21. In other words, the insulation layer 531 may cover a sidewall and bottom of the hole 23a. In this case, since the second electrode pad 733 is insulated from the substrate by the insulation layer 31, the substrate 21 may be conductive.

FIGS. 33a, 33b, 33c, 33d and 33e are plan views illustrating a method of manufacturing a light emitting diode according to the twenty-second exemplary embodiment. Methods of forming semiconductor layers 23, 25, 27, a transparent electrode layer 29 and an insulation layer 31 are well known in the art and a detailed description thereof will be omitted herein. Any process, known now or not yet known, that can form semiconductor layers 23, 25, 27, a transparent electrode layer 329 and an insulation layer 331, can be used to manufacture the light emitting diode.

Figure 33A:
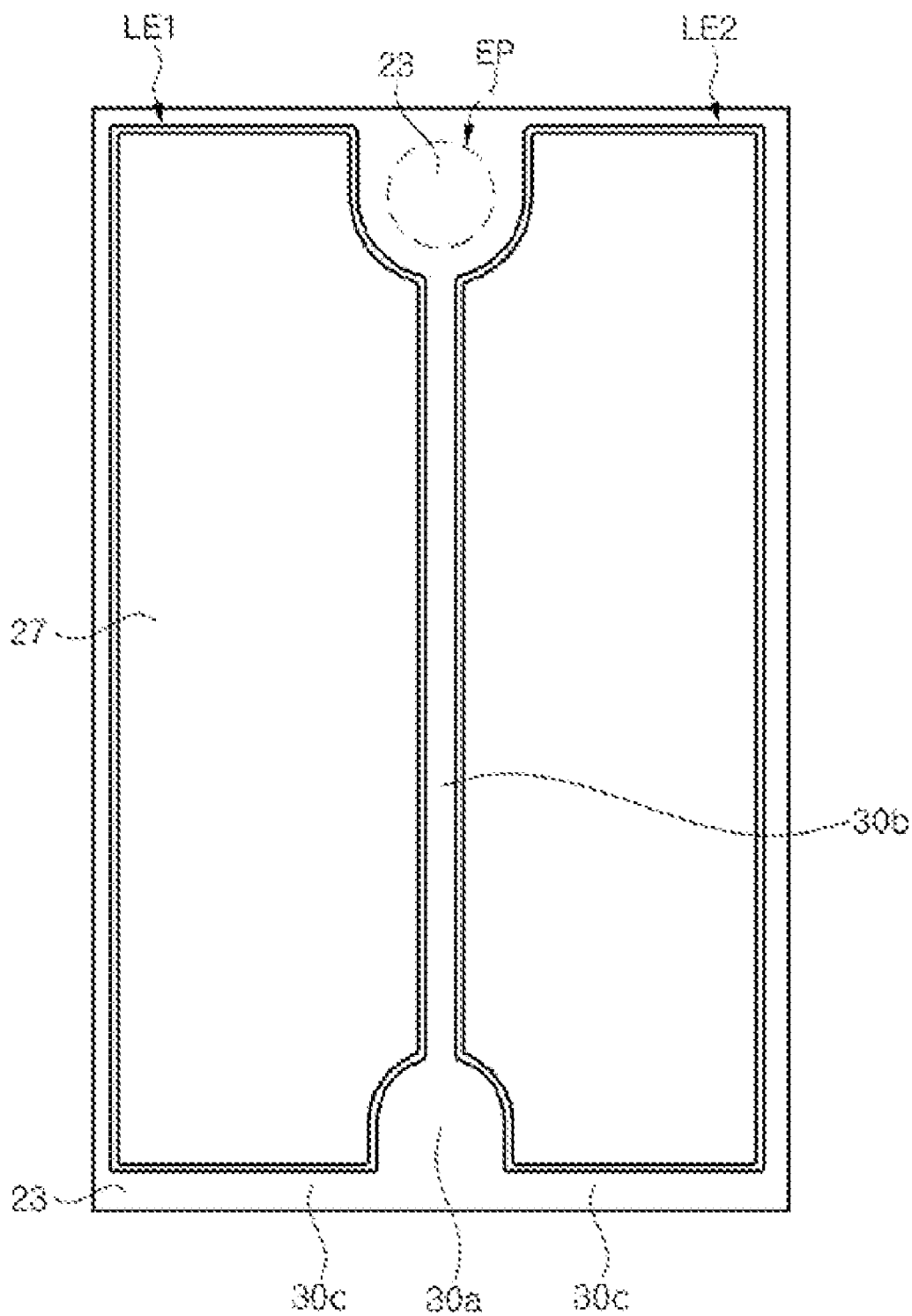
FIGS. 33a, 33b, 33c, 33d and 33e are plan views illustrating a method of manufacturing a light emitting diode according to the twenty-second exemplary embodiment of the present invention.

First, referring to FIG. 33a, semiconductor layers including an n-type semiconductor layer 23, active layer 25 and second conductive type semiconductor layer 27 are formed on a substrate 21. Then, the semiconductor layers are subjected to mesa-etching to expose the first conductive type semiconductor layer 23. The semiconductor layers may have inclined surfaces, for example, at 30-70 degrees relative to a substrate plane. Here, as shown in FIG. 31, a region 30a to be formed with a first electrode pad 535, a region 30b to be formed with a first lower extension 535a, and a region 30c to be formed with a second lower extension 535b are exposed on the first conductive type semiconductor layer 23. The region 30b to be formed with the first lower extension 535a becomes an indented portion 30b which extends inwardly. The indented portion 30b extends inwardly from the region 30a, on which the first electrode pad will be formed. Here, an upper portion of the electrode pad region EP, on which the second electrode pad will be formed, and the first conductive type semiconductor layer 23 around the electrode pad region EP are exposed by mesa-etching. Accordingly, the second conductive type semiconductor layer 27 and active layer 23 are divided to define two light emitting regions LE1, LE2 by the mesa-etching.

Figure 33B:
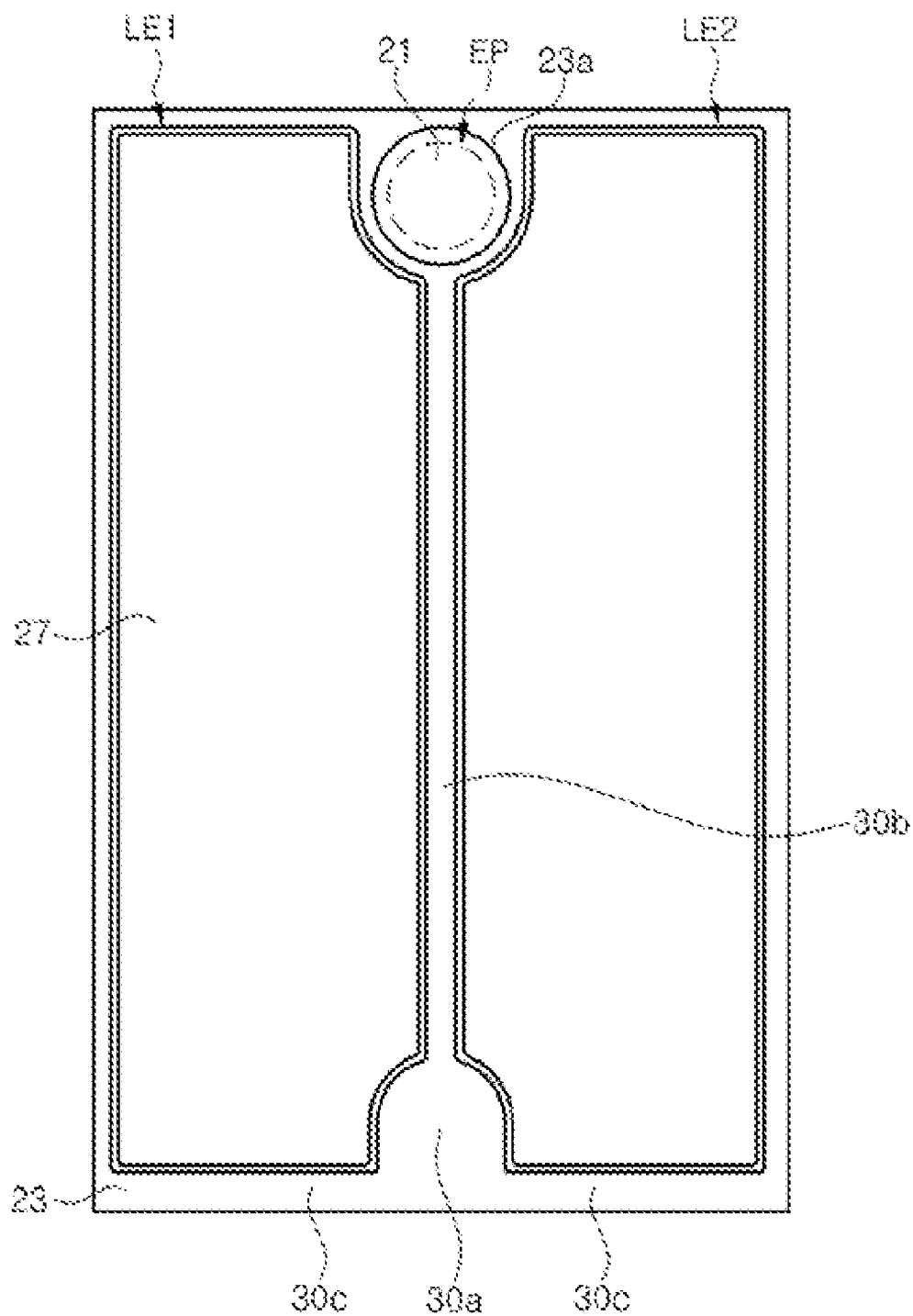

Referring to FIG. 33b, a hole 23a is formed to expose the substrate 21 by etching the first conductive type semiconductor layer 23 in the electrode pad region EP. The hole 23a may be formed to have a greater area than that of the electrode pad region EP, to encompass the electrode pad region EP.

Figure 33C:
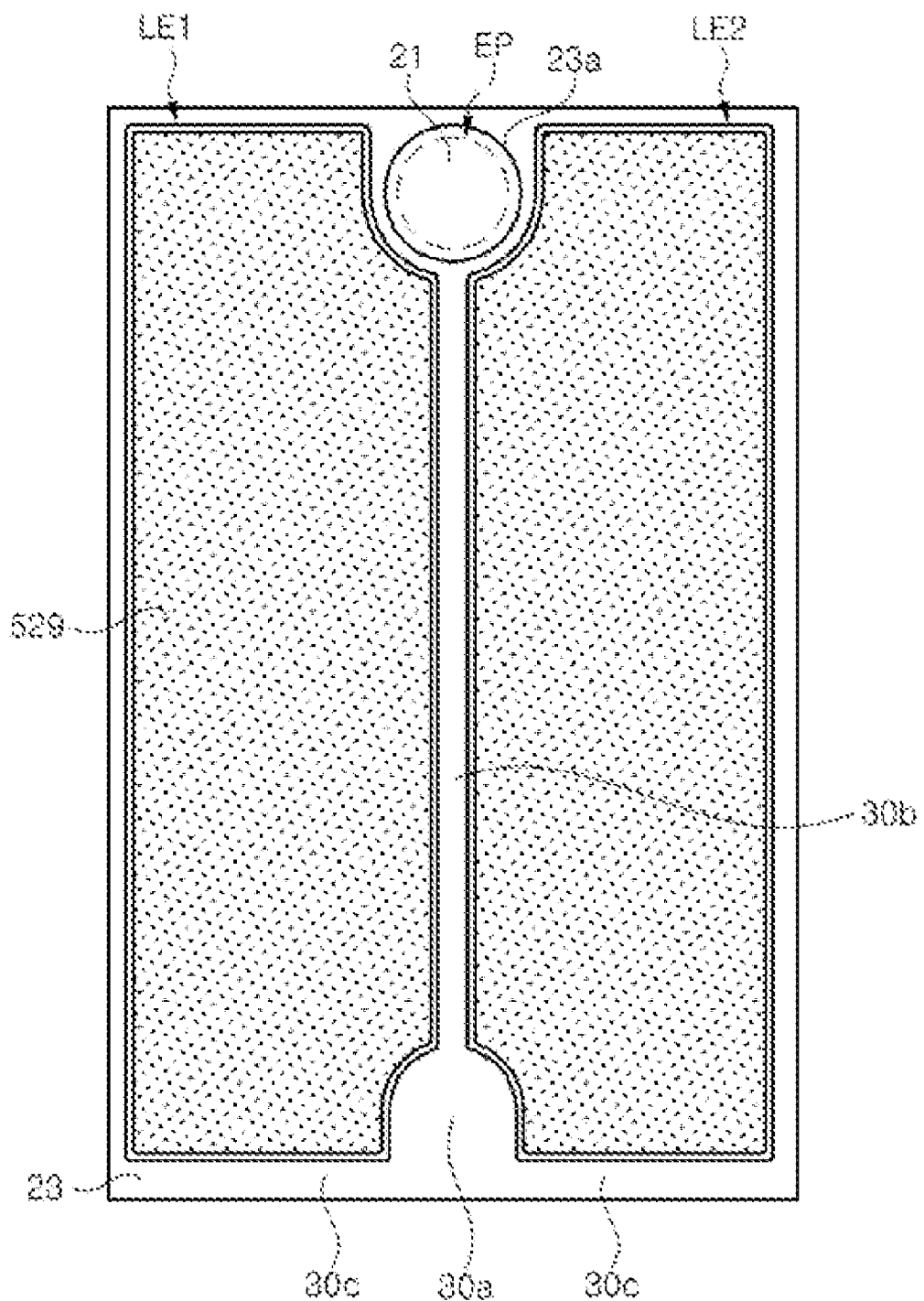

Referring to FIG. 33c, a transparent electrode layer 529 may be formed on the second conductive type semiconductor layer 27 of the light emitting regions LE1, LE2. The transparent electrode layer 529 may have a symmetrical structure relative to an imaginary line extending along the indented portion 30c. The transparent electrode layer 529 may be formed of ITO or Ni/Au and forms an ohmic contact with the second conductive type semiconductor layer 27.

Figure 33D:
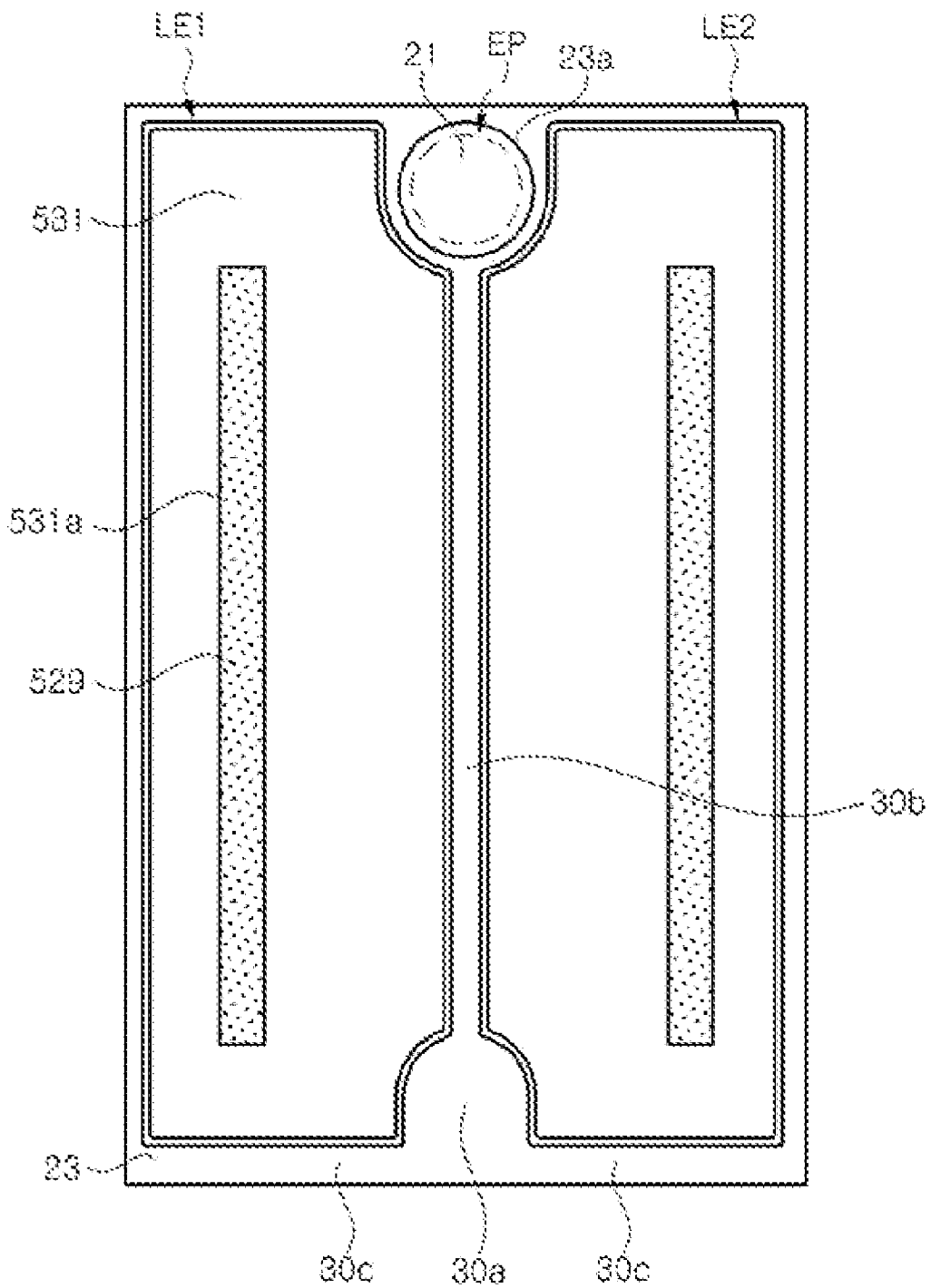

Referring to FIG. 33d, an insulation layer 531 is formed on the light emitting structure. The insulation layer 531 covers the transparent electrode layer 529 of the light emitting structure. The insulation layer 531 may also cover side surfaces of the second conductive type semiconductor layer 27 and active layer 25, which are exposed by mesa-etching, and may cover a sidewall of the hole 23a. In addition, the insulation layer 531 is subjected to a patterning process to form openings 531a, which expose the transparent electrode layer 529 on light emitting regions LE1, LE2, via photolithography and etching. The openings 531a exposing the transparent electrode layer 529 may be symmetrically formed parallel to each other. Further, the regions 30a, 30b, 30c of the first conductive type semiconductor layer 23, on which the first electrode pad 535, first lower extension 535a and second extension 535b will be respectively formed, are also exposed therethrough. In addition, the substrate 21 may be exposed in the electrode pad region EP. Alternatively, the insulation layer 531 may cover the bottom of the hole 23a, so that the electrode pad region EP can be covered with the insulation layer 531.

Figure 33E:
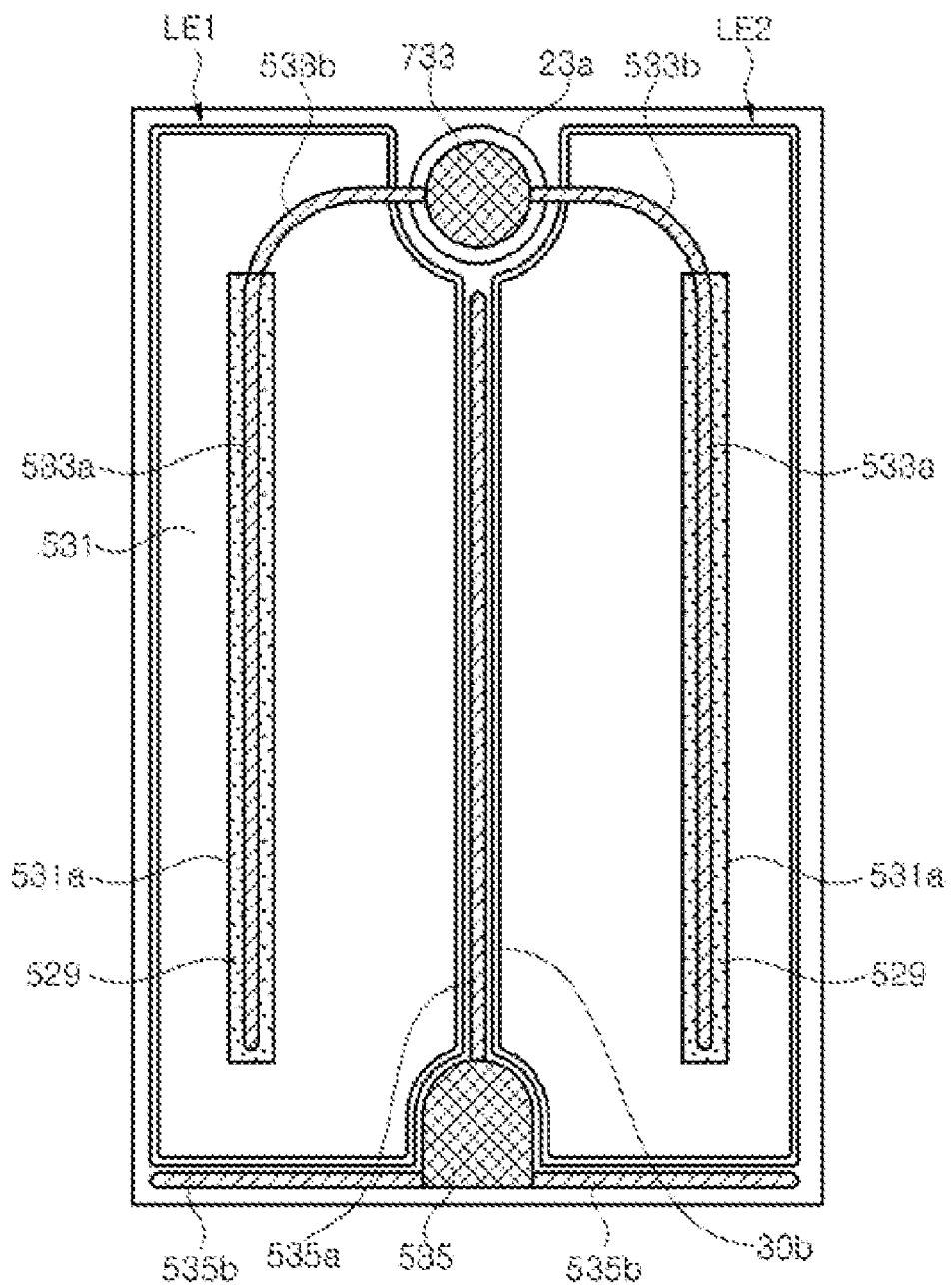

Referring to FIG. 33e, the first electrode pad 535, first lower extension 535a and second extension 535b are formed on the exposed regions of the first conductive type semiconductor layer 23 of the light emitting structure. Further, a second electrode pad 733 is formed on the electrode pad region EP, and upper extensions 533a are formed in the openings 531a. Further, connectors 533b are formed to connect the second electrode pad 733 to the upper extensions 533a.

The upper extensions 533a may be connected to the transparent electrode layer 529 and be formed parallel to the first lower extension 535a. As a result, a light emitting diode is fabricated as shown in FIG. 31.

In the present exemplary embodiment, the light emitting structure is divided into the two light emitting regions LE1, LE2, but is not limited thereto. The light emitting structure may be divided into more than two light emitting regions. Further, although the transparent electrode layer 529 is formed after mesa-etching in the present exemplary embodiment, the mesa-etching may be carried out after formation of the transparent electrode layer 529. Moreover, although the hole 23a is formed after mesa-etching in the present exemplary embodiment, the mesa-etching may be carried out after formation of the hole 23a.

As compared with the light emitting diode described with reference to FIGS. 24 and 25, the electrode pad region EP of the present exemplary embodiment isolated from the light emitting structure is formed in the hole 23a of the first conductive type semiconductor layer 23. Accordingly, the second electrode pad 733 is located on the substrate 21 or on the insulation layer 531 on the substrate. The feature of forming the electrode pad region EP in the hole 23a of the first conductive type semiconductor layer 23 may also be applied to the light emitting diodes described with reference to FIGS. 26 and 27.

Figure 34:
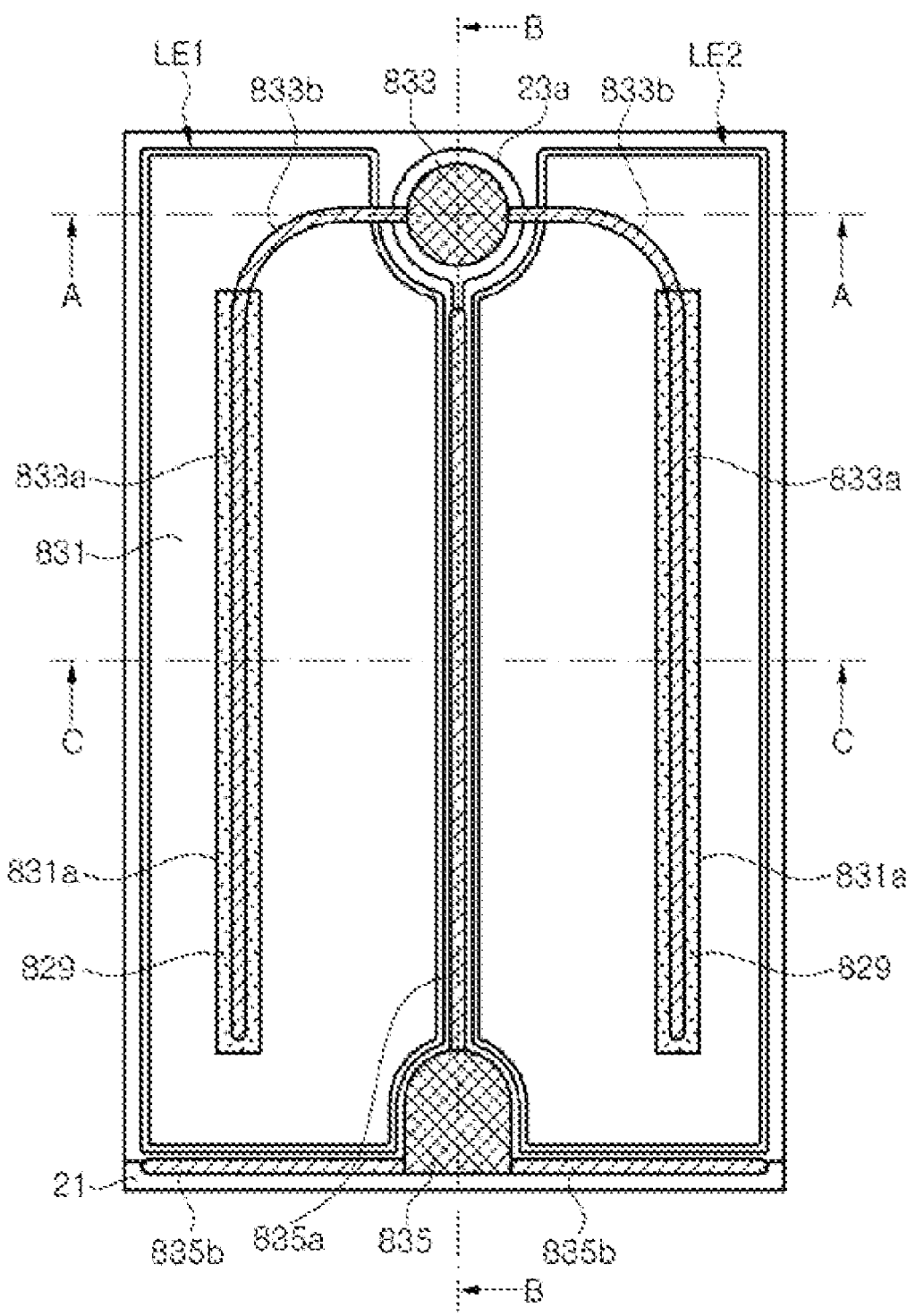
FIG. 34 is a plan view of a light emitting diode according to a twenty-third exemplary embodiment of the present invention.
Figure 35A:
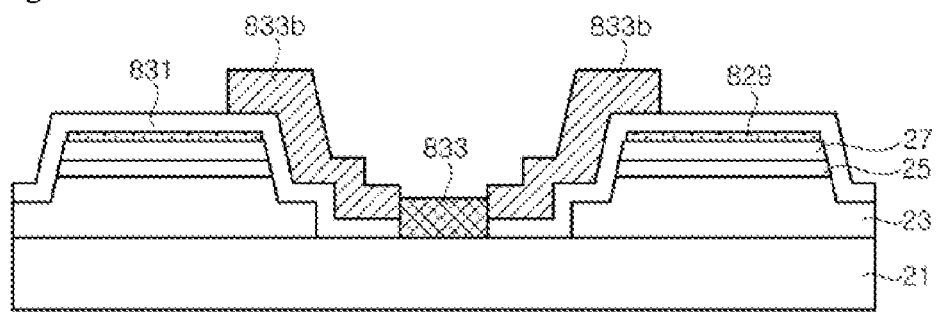
FIGS. 35a, 35b and 35c are cross-sectional views taken along lines A-A, B-B and C-C of FIG. 34, respectively.
Figure 35B:
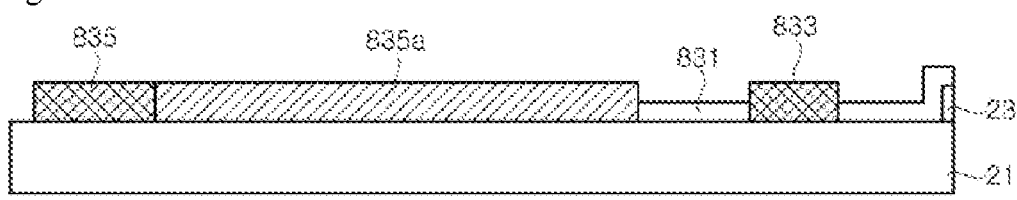
Figure 35C:
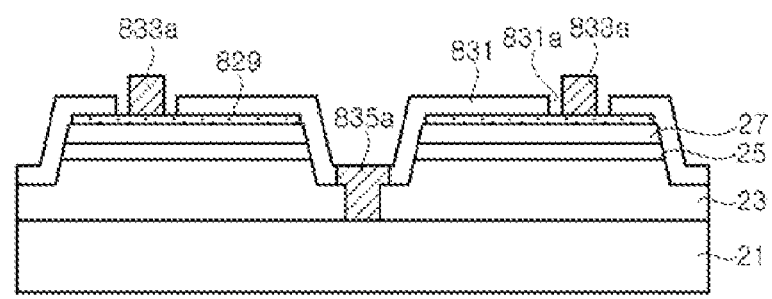

FIG. 34 is a plan view of a light emitting diode according to a twenty-third exemplary embodiment of the present invention, and FIGS. 35a, 35b and 35c are cross-sectional views taken along lines A-A, B-B and C-C of FIG. 34, respectively.

Referring to FIGS. 34, 35a, 35b and 35c, the light emitting diode includes a substrate 21, a light emitting structure including light emitting regions LE1, LE2, a first electrode pad 835, a second electrode pad 833, and upper extensions 833a. Further, the light emitting diode may include a transparent electrode layer 829, an insulation layer 831, connectors 833b, a first lower extension 835a, and a second lower extension 835b. In addition, the light emitting structure includes a first conductive type semiconductor layer 23, an active layer 25, and a second conductive type semiconductor layer 27. Description of the same components as those described in the above exemplary embodiments will be omitted.

The second conductive type semiconductor layer 27 and active layer 25 of the light emitting structure may be divided to define at least two light emitting regions LE1, LE2. The light emitting regions LE1, LE2 may have a symmetrical structure and the dividing process may be carried out by mesa-etching. Specifically, the first conductive type semiconductor layer 23 is exposed in a region crossing the center of the light emitting structure by mesa-etching to divide the second conductive type semiconductor layer 27 and active layer 25 into the two light emitting regions. Further, side surfaces of the light emitting structure subjected to mesa-etching may be inclined at 30-70 degrees relative to a substrate plane relative to a plane of the substrate 21.

The region crossing the center of the light emitting structure, that is, at least a portion of the first conductive type semiconductor layer 23 between the light emitting regions is removed to expose a side surface of the first conductive type semiconductor layer 23.

In addition, a transparent electrode layer 829 may be located on the second conductive type semiconductor layer 27 of the light emitting structure. The transparent electrode layer 529 may be formed of ITO or Ni/Au and forms an ohmic contact with the second conductive type semiconductor layer 27.

An insulation layer 831 may cover the second conductive type semiconductor layer 27 (or the transparent electrode layer 829) of the light emitting structure. The insulation layer 831 may also cover side surfaces of the second conductive type semiconductor layer 27 and active layer 25, which are exposed by mesa-etching. In addition, the insulation layer 831 may have openings 831a which expose the transparent electrode layer 829 on the light emitting regions LE1, LE2. The transparent electrode layer 829 (or the second conductive type semiconductor layer 27) is exposed through the openings 831a. The insulation layer 831 may be formed of any transparent material, for example $SiO_2$, through which light can be transmitted.

The first electrode pad 835 and the second electrode pad 833 may be located on the substrate 21. The first electrode pad 835 may be located to face the second electrode pad 833, as shown in FIG. 34. The first and second electrode pads 835, 833 are bonding pads for wire bonding and may have a relatively wide area for wire bonding.

The first electrode pad 835 may be in contact with the substrate and be connected to a side surface of the first conductive type semiconductor layer 23 of the light emitting structure. Further, the first lower extension 835a may extend from the first electrode pad 835 towards the second electrode pad 833. The first lower extension 835a is located on the substrate 21 and connected to a side surface of the first conductive type semiconductor layer 23. As shown in FIG. 34, the first lower extension 835a may be located between the light emitting regions LE1, LE2 and has a distal end near the second electrode pad 833. The first lower extension 835a may also be in contact with the substrate. In addition, the second lower extensions 835b may extend from the first electrode pad 835 along an edge of the substrate 21. The second lower extensions 835b may also be in contact with the substrate and be connected to the side surface of the first conductive type semiconductor layer 23 of the light emitting structure.

As the first electrode pad 835, first lower extensions 835a and second lower extensions 835b are connected to the side surface of the first conductive type semiconductor layer 23, carriers may spread in a region of the first conductive type semiconductor layer 23, which is located away from the active layer 25, thereby allowing efficient current spreading within the first conductive type semiconductor layer 23. In addition, as the first electrode pad 835, first lower extensions 835a and second lower extensions 835b are connected to the side surface of the first conductive type semiconductor layer 23, upper surfaces of the first electrode pad 835, first lower extensions 835a and second lower extensions 835b may be located under the active layer 25, which generates light. As a result, light laterally emitted from the active layer 25 may be discharged without being absorbed by the first electrode pad 835, first lower extensions 835a and second lower extensions 835b.

The second electrode pad 833 is located on the substrate 21 and is isolated from the second conductive type semiconductor layer 27 of the light emitting structure. The second electrode pad 833 may be located away from a side surface of the second conductive type semiconductor layer 27. For example, the second electrode pad 833 may be formed on the substrate 21 exposed through a hole 23a in the first conductive type semiconductor layer 23. In other words, the second electrode pad 833 may be laterally separated from the first conductive type semiconductor layer 23 of the light emitting structure. The second electrode pad 833 may be in contact with the substrate 21 exposed through the hole 23a. Further, an insulation layer 831 may be disposed between the second electrode pad 833 and the substrate 21. Alternatively, the second electrode pad may be formed above the first conductive type semiconductor layer 23 with the insulation layer 831 disposed between the second electrode pad 833 and the first conductive type semiconductor layer 23.

The upper extensions 833a are located on the light emitting regions LE1, LE2. The upper extensions 833a may be electrically connected to the transparent electrode layer 829 (or the second conductive type semiconductor layer 27) via the openings 831a of the insulation layer 831. The second conductive type semiconductor layer 27 may be exposed through the openings 831a, and the upper extensions 833a may be directly connected to the second conductive type semiconductor layer 27. The upper extensions 833a are disposed to allow uniform current spreading in the second conductive type semiconductor layer 27. For example, the upper extensions 833a may extend parallel to each other. The upper extensions 833a may be connected to the second electrode pad 833 via connectors 833b, respectively. The connectors 833b are insulated from the transparent electrode layer 829 (or the second conductive type semiconductor layer 27) by the insulation layer 831. The connectors 833b are insulated from the side surface of the light emitting structure by the insulation layer 831.

The electrode pads 833, 835, upper extensions 833a, connectors 833b, and first and second lower extensions 835a, 835b may be formed of, but are not limited to, the same material, for example Cr/Au, by the same process. Alternatively, the upper extensions 833a and the second electrode pad 833 may be formed of different materials by different processes.

In the present exemplary embodiment, the light emitting diode has a symmetrical structure relative to a line crossing the first electrode pad 835 and the second electrode pad 833, for example line B-B of FIG. 34. The divided regions of the transparent electrode layer 829 and the upper extensions 833a may be symmetrically disposed, and the second lower extensions 835b may also be symmetrically disposed. Accordingly, the light emitting diode may exhibit the same luminescence characteristics at both sides of the line crossing the first electrode pad 835 and the second electrode pad 833. As a result, the light emitting structure of the light emitting diode is divided into two light emitting regions, so the light emitting diode can prevent current crowding around a defect such as pin holes or thread dislocations, thereby achieving uniform current spreading.

FIGS. 36a, 36b, 36c, 36d and 36e are plan views illustrating a method of manufacturing a light emitting diode according to the twenty-third exemplary embodiment. Methods of forming semiconductor layers 23, 25, 27, a transparent electrode layer 829 and an insulation layer 831 are well known in the art and a detailed description thereof will be omitted herein. Any process, known now or not yet known, that can form semiconductor layers 23, 25, 27, a transparent electrode layer 329 and an insulation layer 331, can be used to manufacture the light emitting diode.

Figure 36A:
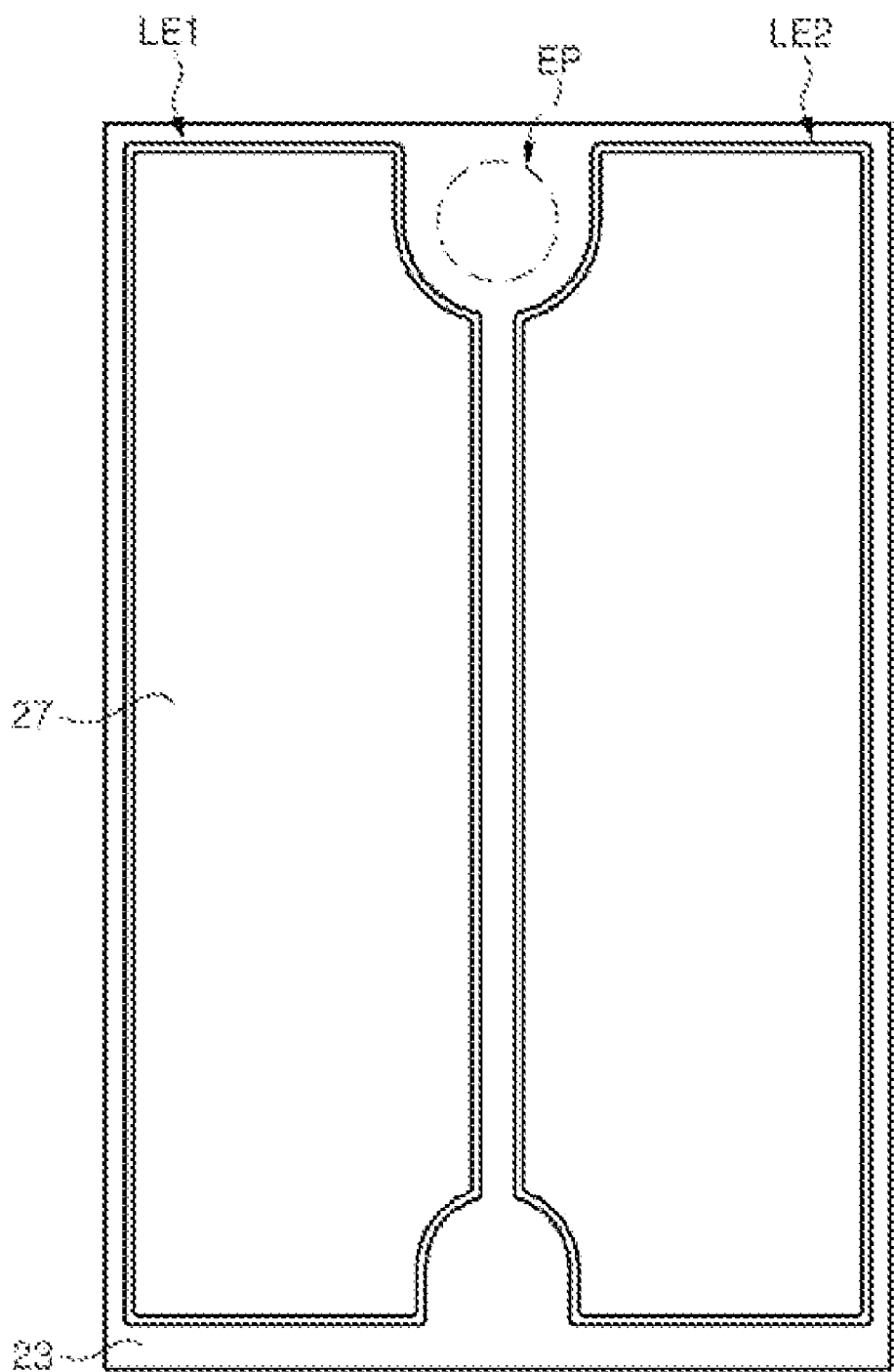
FIGS. 36a, 36b, 36c, 36d and 36e are plan views illustrating a method of manufacturing a light emitting diode according to the twenty-third exemplary embodiment of the present invention.

First, referring to FIG. 36a, semiconductor layers including an n-type semiconductor layer 23, active layer 25 and second conductive type semiconductor layer 27 are formed on a substrate 21. Then, the semiconductor layers are subjected to mesa-etching to expose the first conductive type semiconductor layer 23. The semiconductor layers may have inclined surfaces, for example, at 30-70 degrees relative to a substrate plane. Here, as shown in FIG. 34, a region 30a to be formed with a first electrode pad 835, a region 30b to be formed with a first lower extension 835a, and a region 30c to be formed with a second lower extension 835b are exposed on the first conductive type semiconductor layer 23. Here, an upper portion of an electrode pad region EP, on which the second electrode pad will be formed, and the first conductive type semiconductor layer 23 around the electrode pad region EP are exposed by mesa-etching. Accordingly, the second conductive type semiconductor layer 27 and active layer 23 are divided to define two light emitting regions LE1, LE2 by the mesa-etching, and a region between the light emitting regions LE1, LE2 will be formed with the first lower extension 835a.

Figure 36B:
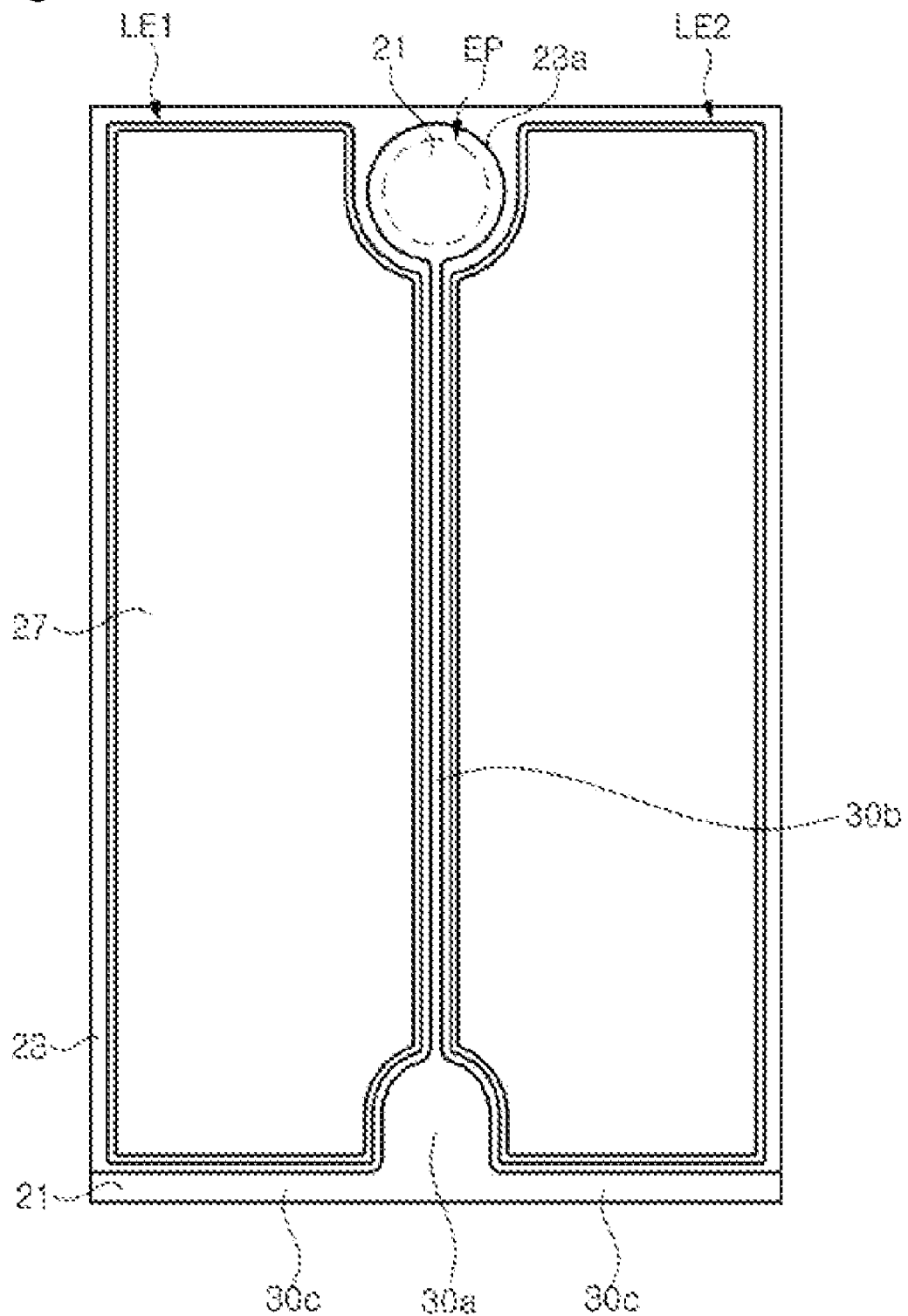

Referring to FIG. 36b, the substrate 21 is exposed by etching the exposed first conductive type semiconductor layer 23. As a result, the substrate 21 is exposed on the regions 30a, 30b, 30c, on which the first electrode pad 835, first lower extension 835a and second extension 835b will be respectively formed. Further, a hole 23a may be formed to expose the substrate 21 by etching the first conductive type semiconductor layer 23 of the electrode pad region EP. The hole 23a may be formed greater than the electrode pad region EP to encompass the electrode pad region EP. The hole 23a may be in communication with the region 30b on which the first lower extension 835a will be formed. In this stage, the light emitting structure including the light emitting regions LE1, LE2 is formed.

Figure 36C:
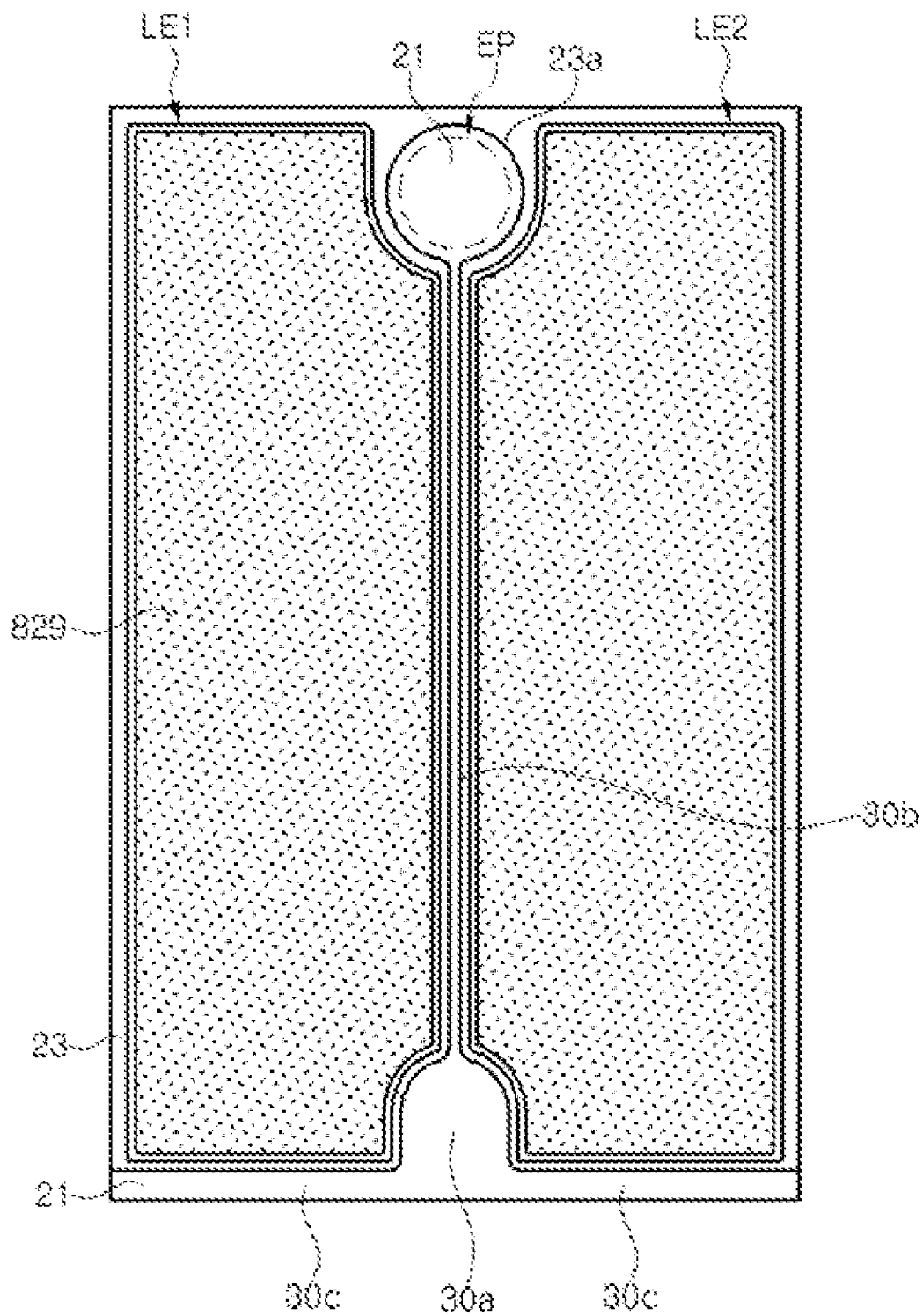

Referring to FIG. 36c, a transparent electrode layer 829 may be formed on the second conductive type semiconductor layer 27 of the light emitting regions LE1, LE2. The transparent electrode layer 829 may have a symmetrical structure relative to a line crossing the first electrode pad and the second electrode pad. The transparent electrode layer 829 may be formed of ITO or Ni/Au and forms an ohmic contact with the second conductive type semiconductor layer 27.

Figure 36D:
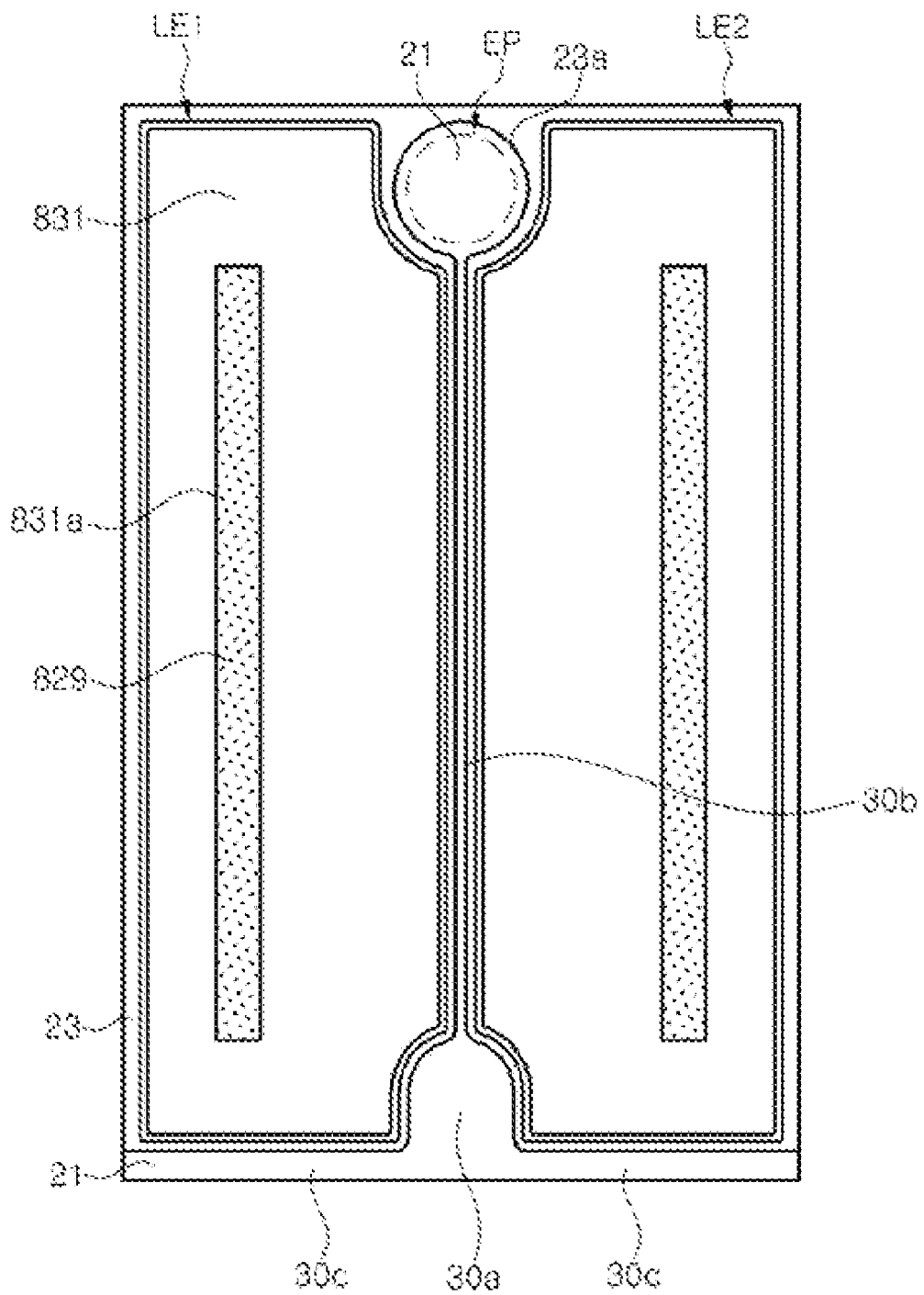

Referring to FIG. 36d, an insulation layer 831 is formed on the light emitting structure. The insulation layer 831 covers the transparent electrode layer 829 of the light emitting structure. The insulation layer 831 may also cover side surfaces of the second conductive type semiconductor layer 27 and active layer 25, which are exposed by mesa-etching, and may cover a sidewall of the hole 23a. In addition, the insulation layer 831 is subjected to a patterning process to form openings 831a, which expose the transparent electrode layer 829 on light emitting regions LE1, LE2, via photolithography and etching. The openings 831a exposing the transparent electrode layer 829 may be symmetrically formed parallel to each other. Further, the regions 30a, 30b, 30c of the first conductive type semiconductor layer 23, on which the first electrode pad 835, first lower extension 835a and second extension 835b will be respectively formed, are also exposed therethrough. In addition, the substrate 21 may be exposed in the electrode pad region EP. Alternatively, the insulation layer 831 may cover the bottom of the hole 23a, so that the electrode pad region EP can be covered with the insulation layer 831.

Figure 36E:
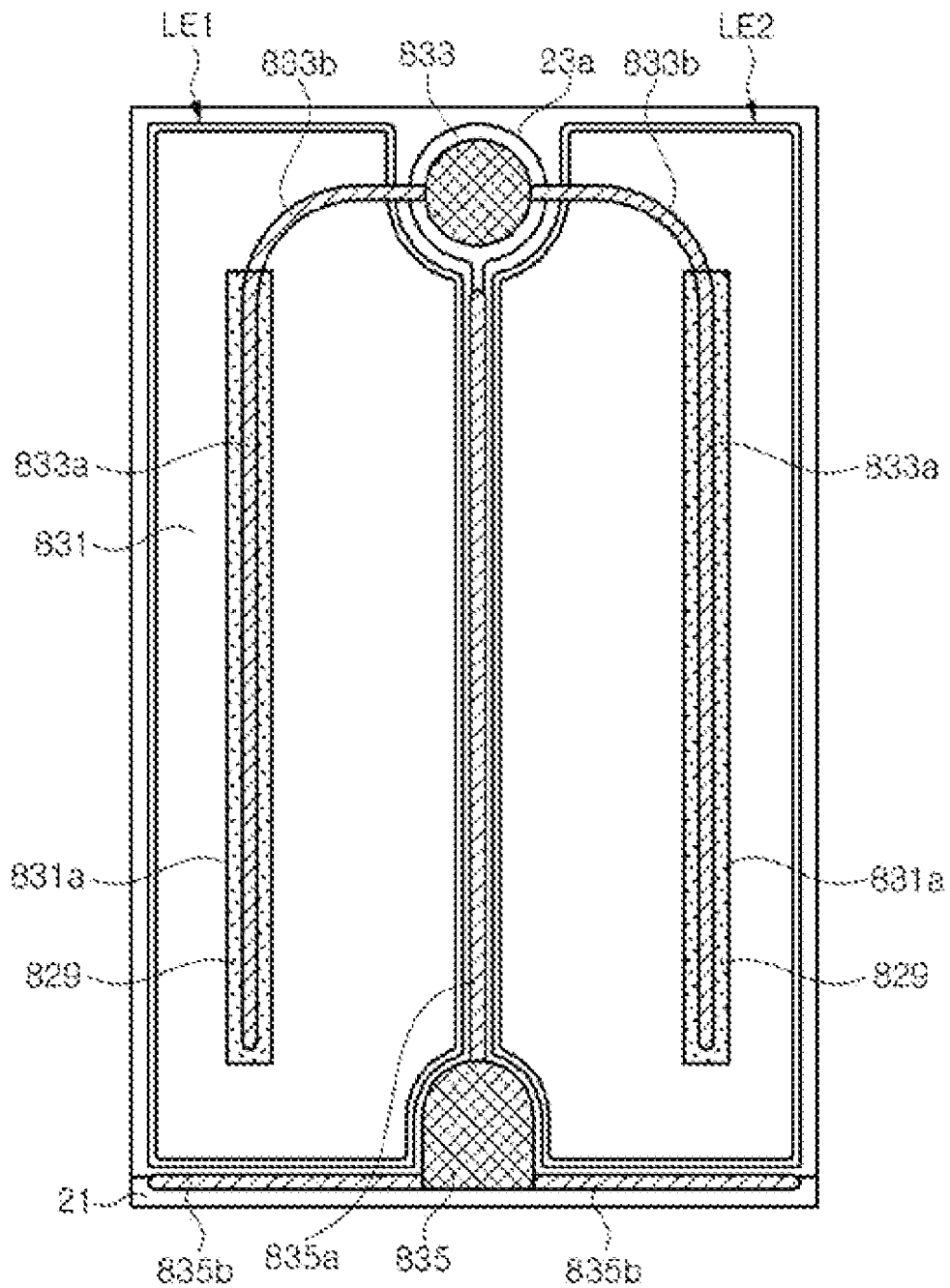

Referring to FIG. 36e, the first electrode pad 835, first lower extension 835a and second extension 835b are formed on the exposed regions of the substrate 21. Further, a second electrode pad 833 is formed on the substrate 21 of the electrode pad region EP, and upper extensions 833a are formed in the openings 831a. Further, connectors 833b are formed to connect the second electrode pad 833 to the upper extensions 833a.

The first electrode pad 835, first lower extension 835a and second extension 835b may be connected to the side surface of the first conductive type semiconductor layer 23 of the light emitting structure, and upper surfaces of the first electrode pad 835, first lower extension 835a and second extension 835b may be lower than the height of the active layer 23. Further, the first electrode pad 835, first lower extension 835a and second extension 835b may extend to an upper surface of the first conductive type semiconductor layer 23 exposed by mesa-etching.

The upper extensions 833a may be connected to the transparent electrode layer 829 and be formed parallel to the first lower extension 835a. As a result, a light emitting diode is fabricated as shown in FIG. 34.

In the present exemplary embodiment, the light emitting structure is divided into the two light emitting regions LE1, LE2, but is not limited thereto. The light emitting structure may be divided into more than two light emitting regions. Further, although the transparent electrode layer 829 is formed after mesa-etching in the present exemplary embodiment, the mesa-etching may be carried out after formation of the transparent electrode layer 829. Moreover, although the hole 23a is formed after mesa-etching in the present exemplary embodiment, the mesa-etching may be carried out after formation of the hole 23a.

Figure 37:
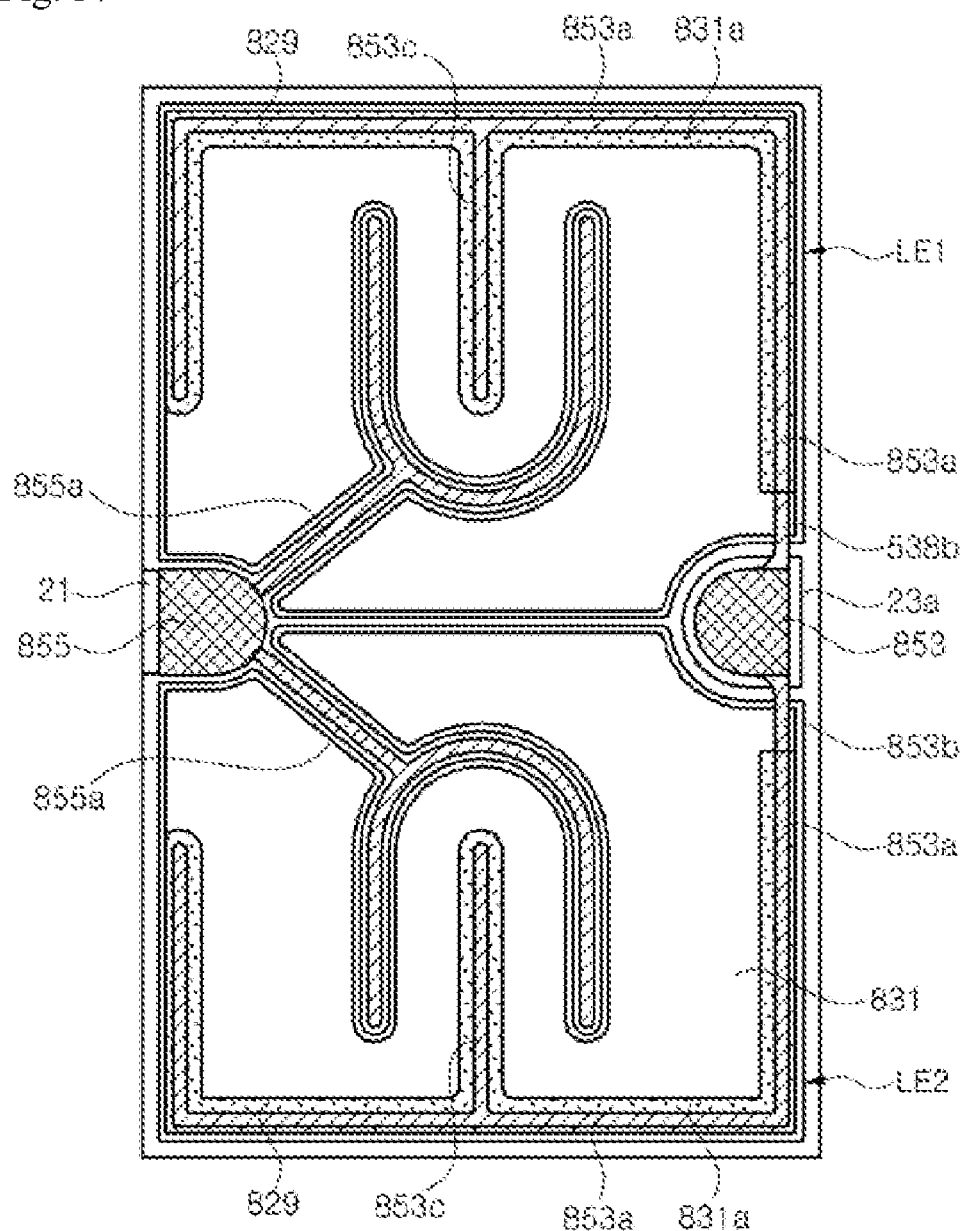
FIG. 37 is a plan view of a light emitting diode according to a twenty-fourth exemplary embodiment of the present invention.

FIG. 37 is a plan view of a light emitting diode according to a twenty-fourth exemplary embodiment of the present invention.

In the above exemplary embodiment of FIG. 34, the first and second electrode pads 835, 833 are disposed in a major axis direction of the light emitting diode, and the light emitting regions LE1, LE2 are divided in the major axis direction of the light emitting diode. In the present exemplary embodiment, however, the first and second electrode pads 835, 833 are disposed in a minor axis direction of the light emitting diode, and the light emitting regions LE1, LE2 are divided in the minor axis direction of the light emitting diode. Further, the transparent electrode layers 829, upper extensions 853a and lower extensions 855a are also disposed in a symmetrical structure relative to a line crossing in the minor axis direction of the light emitting diode.

Here, the upper extensions 853a extend along an edge of the light emitting diode to surround the light emitting diode and include extensions 853b extending inwardly from the edge of the light emitting diode. Lower extensions 555a extend outwardly from the interior of the light emitting diode. Further, the lower extensions 555a may be bifurcated to surround the extensions 553b in associated light emitting regions, respectively. Each of the lower extensions 855a is connected to a side surface of the first conductive type semiconductor layer 23 of the light emitting structure.

The upper extensions 853a are connected to the transparent electrode layer 829 on the light emitting regions LE1, LE2 through the openings 831a of the insulation layer 831, and connected to the second electrode pad 853 through the connectors 853b. The connectors 853b are insulated from the light emitting structure by the insulation layer 831.

As described with reference to FIG. 34, the second electrode pad 835 is located on the substrate 21 and isolated from the second conductive type semiconductor layer 27 of the light emitting structure.

In the present exemplary embodiment, the light emitting diode omits the first lower extension 835a (see FIG. 34), which extends from the first electrode pad 855 to the second electrode pad 853.

Figure 38:
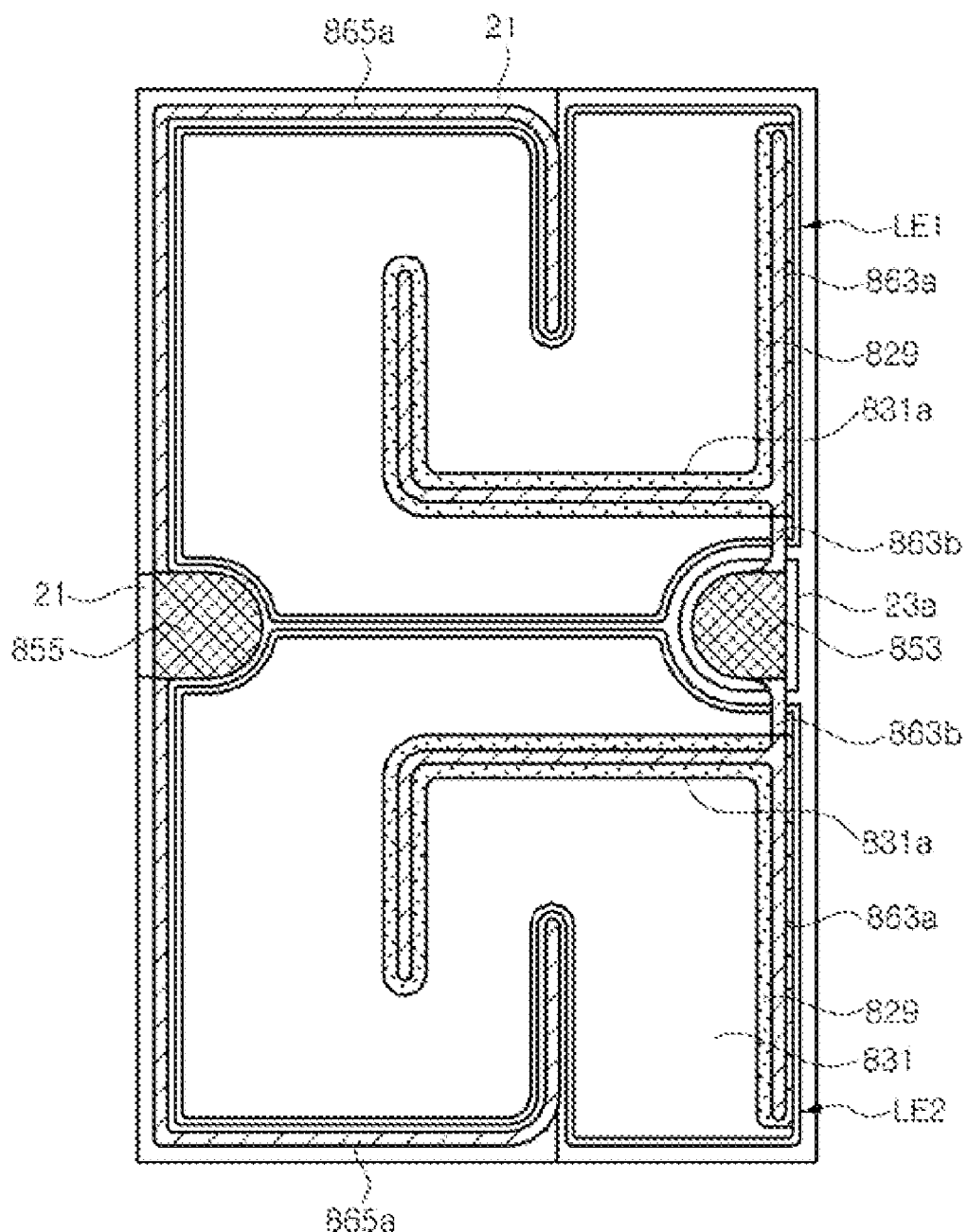
FIG. 38 is a plan view of a light emitting diode according to a twenty fifth exemplary embodiment of the present invention.

FIG. 38 is a plan view of a light emitting diode according to a twenty fifth exemplary embodiment of the present invention.

Referring to FIG. 38, the light emitting diode of the present exemplary embodiment is generally similar to the light emitting diode described with reference to FIG. 37. In the light emitting diode of the present exemplary embodiment, however, lower extensions 865a and upper extensions 863a are arranged in a different manner than in the above exemplary embodiment.

Specifically, the lower extensions 865a extend along an edge of the light emitting diode and are bent to extend inwardly, and the upper extensions 863a include two extensions on each of divided regions of the transparent electrode layer 829, which surround each of the lower extensions 865a extending inwardly.

The upper extensions 863a are connected to the transparent electrode layer 829 on light emitting regions LE1, LE2 through openings 831a of an insulation layer 831, and are connected to the second electrode pad 853 through connectors 863b. The connectors 863b are insulated from the light emitting structure by the insulation layer 831.

In a conventional light emitting diode, a second electrode pad may be located on a second conductive type semiconductor layer and electrically connected thereto. As a result, electric current is concentrated around the second electrode pad, thereby inhibiting current spreading. On the contrary, according to exemplary embodiments of the present invention, since the second electrode pad is isolated from a light emitting structure or separated from a second conductive type semiconductor layer of the light emitting structure and a transparent electrode layer, it is possible to prevent current crowding around the second electrode pad. In addition, the light emitting diode according to the exemplary embodiments includes a plurality of first electrode pads to achieve current spreading around the first electrode pads. Further, the light emitting diode according to the exemplary embodiments has plural light emitting regions divided from one another, thereby achieving uniform current spreading over the light emitting regions. Furthermore, the first electrode pad is connected to a side surface of the light emitting structure, thereby achieving efficient current spreading in the first conductive type semiconductor layer. Furthermore, since the first electrode pad is connected to a side surface of the first conductive type semiconductor layer, an upper surface of the first electrode pad may be located under an active layer. Consequently, the light emitting diodes may reduce optical loss by preventing absorption of light into the first electrode pad when light generated from the active layer is emitted through the side surface of the light emitting structure.

Although the invention has been illustrated with reference to exemplary embodiments in conjunction with the drawings, it will be apparent to those skilled in the art that various modifications and changes can be made in the invention without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention covers the modifications and variations of this invention provided they come within the scope of the appended claims and their equivalents.

What is claimed is:

1. A light emitting diode, comprising:
   a substrate;
   a first conductive type semiconductor layer arranged on the substrate;
   a second conductive type semiconductor layer arranged on the first conductive type semiconductor layer;
   an active layer disposed between the first conductive type semiconductor layer and the second conductive type semiconductor layer;
   a first electrode pad electrically connected to the first conductive type semiconductor layer;
   a second electrode pad arranged on the second conductive type semiconductor layer;
   an insulation layer disposed between the second conductive type semiconductor layer and the second electrode pad; and
   at least one upper extension electrically connected to the second electrode pad, the at least one upper extension being electrically connected to the second conductive type semiconductor layer.

2. The light emitting diode of claim 1, further comprising an upper connector connecting the at least one upper extension to the second electrode pad, the insulation layer disposed between the second conductive type semiconductor layer and the upper connector.

3. The light emitting diode of claim 2, wherein the insulation layer covers the second conductive type semiconductor layer, the insulation layer comprises at least one opening on the second conductive type semiconductor layer, and the at least one upper extension is electrically connected to the second conductive type semiconductor layer through the opening.

4. The light emitting diode of claim 2, further comprising a transparent electrode layer forming an ohmic contact with the second conductive type semiconductor layer, wherein the transparent electrode layer is divided into at least two regions, and the second electrode pad is arranged on an exposed region of the second conductive type semiconductor layer between the at least two regions of the transparent electrode layer.

5. The light emitting diode of claim 4, wherein a portion of the second electrode pad overlaps the transparent electrode layer, and the insulation layer is disposed between the overlapping portion of the second electrode pad and the transparent electrode layer.

6. The light emitting diode of claim 4, wherein the upper connector is electrically connected to one of the at least two divided regions of the transparent electrode layer.

7. The light emitting diode of claim 1, wherein the first electrode pad is arranged to face the second electrode pad.

8. The light emitting diode of claim 7, further comprising a first lower extension extending from the first electrode pad towards the second electrode pad, the first lower extension being electrically connected to the first conductive type semiconductor layer.

9. The light emitting diode of claim 8, wherein a distal end of the first lower extension is closer to the second electrode pad than the first electrode pad.

10. The light emitting diode of claim 9, further comprising a second lower extension extending from the first electrode pad along an edge of the substrate.

11. The light emitting diode of claim 1, further comprising a transparent electrode layer arranged on the second conductive type semiconductor layer, the transparent electrode layer forming an ohmic contact with the second conductive type semiconductor layer, wherein the transparent electrode layer is divided into at least two regions, and the second electrode pad is arranged on an exposed region of the second conductive type semiconductor layer between the at least two regions of the transparent electrode layer.

12. The light emitting diode of claim 11, further comprising at least two upper connectors electrically connected to each of the at least two regions of the transparent electrode layer, respectively.

13. The light emitting diode of claim 12, wherein one of the at least two upper connectors electrically connects the at least one upper extension to the second electrode pad, insulation layer disposed between each of the at least two upper connectors and the transparent electrode layer.

14. The light emitting diode of claim 13, wherein the first electrode pad is arranged on the first conductive type semiconductor layer, and the transparent electrode layer and the at least one upper extension are arranged in a symmetrical structure relative to an imaginary line bisecting the first electrode pad and the second electrode pad.

15. The light emitting diode of claim 14, further comprising a first lower extension extending from the first electrode pad towards the second electrode pad, the first lower extension being electrically connected to the first conductive type semiconductor layer.

16. The light emitting diode of claim 15, wherein the first lower extension and the at least one upper extension are arranged parallel to one another.

17. The light emitting diode of claim 15, wherein the insulation layer is arranged on the transparent electrode layer, the insulation layer comprising an opening to expose the transparent electrode layer, and the at least one upper extension is electrically connected to the transparent electrode layer through the opening.

* * * * *